United States Patent
Okada et al.

(10) Patent No.: US 11,084,934 B2
(45) Date of Patent: Aug. 10, 2021

(54) COLOR MATERIAL DISPERSION LIQUID, COLOR RESIN COMPOSITION, COLOR FILTER, LIQUID CRYSTAL DISPLAY DEVICE, AND LIGHT-EMITTING DISPLAY DEVICE

(71) Applicant: DAI NIPPON PRINTING CO., LTD., Tokyo-to (JP)

(72) Inventors: Masato Okada, Tokyo-to (JP); Hiroko Amano, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 234 days.

(21) Appl. No.: 16/313,811

(22) PCT Filed: Jun. 23, 2017

(86) PCT No.: PCT/JP2017/023255
§ 371 (c)(1),
(2) Date: Apr. 5, 2019

(87) PCT Pub. No.: WO2018/003706
PCT Pub. Date: Jan. 4, 2018

(65) Prior Publication Data
US 2020/0148885 A1    May 14, 2020

(30) Foreign Application Priority Data

Jun. 28, 2016  (JP) .............................. JP2016-128169

(51) Int. Cl.
C09B 67/20    (2006.01)
C08K 5/29    (2006.01)
G02F 1/1335    (2006.01)
H01L 27/32    (2006.01)

(52) U.S. Cl.
CPC ............ *C09B 67/0069* (2013.01); *C08K 5/29* (2013.01); *G02F 1/133514* (2013.01); *H01L 27/322* (2013.01)

(58) Field of Classification Search
CPC ................................................. C09B 67/0069
See application file for complete search history.

(56) References Cited

U.S. PATENT DOCUMENTS

| | | |
|---|---|---|
| 2014/0037866 A1 | 2/2014 | Okada |
| 2014/0039201 A1 | 2/2014 | Okada et al. |
| 2015/0077685 A1 | 3/2015 | Okada et al. |
| 2015/0353472 A1 | 12/2015 | Okada et al. |
| 2016/0376443 A1 | 12/2016 | Ogura et al. |

FOREIGN PATENT DOCUMENTS

| | | |
|---|---|---|
| JP | 2013-057052 A | 3/2013 |
| JP | 2013-057053 A | 3/2013 |
| JP | 2013-057054 A | 3/2013 |
| JP | 2013-242522 A | 12/2013 |
| JP | 2015-107471 A | 6/2015 |
| JP | 2016-088894 A | 5/2016 |
| JP | 2017-165808 A | 3/2017 |
| TW | 201522477 A | 6/2015 |
| WO | WO-2015083426 A1 * 6/2015 ........... H01L 51/006 |

OTHER PUBLICATIONS

Mori, Tatsuo, "Tokoton Yasashii Yuuki EL no Hon" (in Japanese, "Thoroughly Easy Book on Electroluminescence" in English), published by Nikkan Kogyo Shimbun Ltd., First Edition, 2008, Chapters 7 and 49.
Dec. 5, 2017 Office Action issued in Japanese Patent Application No. 2017-123550.
Aug. 29, 2017 Search Report issued in International Patent Application No. PCT/JP2017/023255.

* cited by examiner

*Primary Examiner* — Wenwen Cai
(74) *Attorney, Agent, or Firm* — Oliff PLC

(57) ABSTRACT

A color material dispersion liquid including a color material, a dispersant and a solvent, wherein the color material contains a compound which is represented by the following general formula (I) and which contains one or more structures selected from the following structures (i) and (ii); wherein (i) "A" is an aliphatic hydrocarbon group containing two or more alicyclic hydrocarbon groups, containing a saturated aliphatic hydrocarbon group at a terminal position directly bound to "N", and optionally containing O, S, N in a carbon chain, and (ii) at least one of $R^2$ to $R^5$ is a cycloalkyl group optionally containing a substituent group or an aryl group optionally containing a substituent group.

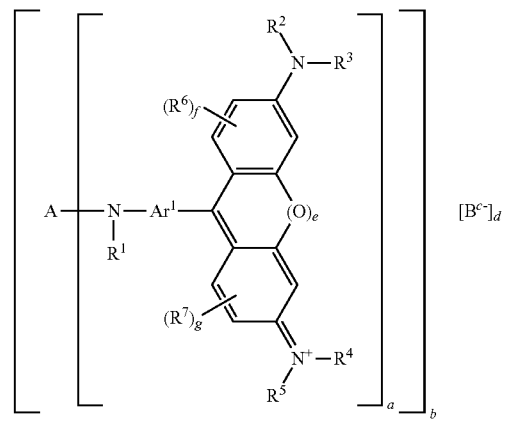

General Formula (I)

9 Claims, 5 Drawing Sheets

Example 1 (Compound 2-1)

Example 2 (Compound 2-2)

Example 3 (Compound 2-3)

Example 5 (Compound 2-5)

Comparative Example 1 (Compound 2-X)

COLOR MATERIAL DISPERSION LIQUID, COLOR RESIN COMPOSITION, COLOR FILTER, LIQUID CRYSTAL DISPLAY DEVICE, AND LIGHT-EMITTING DISPLAY DEVICE

TECHNICAL FIELD

The disclosure relates to a color material dispersion liquid, a color resin composition, a color filter, a liquid crystal display device, and a light-emitting display device.

BACKGROUND ART

A color filter is used in liquid crystal display devices and light-emitting display devices. For example, in the case of color LCDs, the amount of light is controlled by using a backlight as the light source and electrically driving the liquid crystal. The light passes through the color filter and represents colors. In light-emitting display devices, a color image is formed in the same manner as liquid crystal display devices, when the color filter is used in combination with a white light emitting element.

A recent trend is that there is a demand for power-saving image display devices. To increase backlight use efficiency, there is a very high demand for high-luminance color filters. This is a major issue especially for mobile displays (such as mobile phones, smart phones and tablet PCs).

In general, a color filter includes a transparent substrate, color layers made of color patterns of the three primary colors (red, green and blue), and a light shielding part formed on the transparent substrate so as to define each color pattern.

In color filter production, since the color layers are exposed to various kinds of conditions such as heating and UV irradiation, pigments with excellent resistance properties (such as heat resistance and light resistance) are used as color materials incorporated in color layers. However, it is difficult for color filters produced by use of pigments to satisfy the demand for higher luminance.

As a means to achieve higher luminance, dye-containing color resin compositions for color filters have been studied. In general, dyes have higher transmittance and can produce higher-luminance color filters than pigments. However, dyes have a problem in that the chromaticity is likely to change in a color filter production process.

As a method for forming a color layer excellent in solvent resistance and electric reliability, the inventors of the present disclosure disclosed a color resin composition for color filters, the composition comprising a specific color material having two or more dye skeletons (for example, see Patent Literature 1).

CITATION LIST

Patent Literature 1: Japanese Patent Application Laid-Open (JP-A) No. 2013-057053
Patent Literature 2: JP-A No. 2013-057052
Patent Literature 3: JP-A No. 2013-057054
Patent Literature 4: JP-A No. 2013-242522

SUMMARY OF INVENTION

Technical Problem

An object of the disclosed embodiments is to provide a color material dispersion liquid configured to form a coating film which is excellent in heat resistance and which is able to suppress color change during heating; a color resin composition configured to form a color layer which is excellent in heat resistance and which is able to suppress color change during heating; a color filter which is excellent in heat resistance; a liquid crystal display device including the color filter; and a light-emitting display device including the color filter.

Solution to Problem

In a first embodiment, there is provided a color material dispersion liquid comprising (A) a color material, (B) a dispersant and (C) a solvent, wherein the color material (A) contains a compound which is represented by the following general formula (I) and which contains one or more structures selected from the following structures (i) and (ii):

(i) "A" is an aliphatic hydrocarbon group containing two or more alicyclic hydrocarbon groups, containing a saturated aliphatic hydrocarbon group at a terminal position directly bound to "N", and optionally containing O, S, N in a carbon chain (ii) at least one of $R^2$, $R^3$, $R^4$ and $R^5$ is a cycloalkyl group optionally containing a substituent group or an aryl group optionally containing a substituent group General Formula (I)

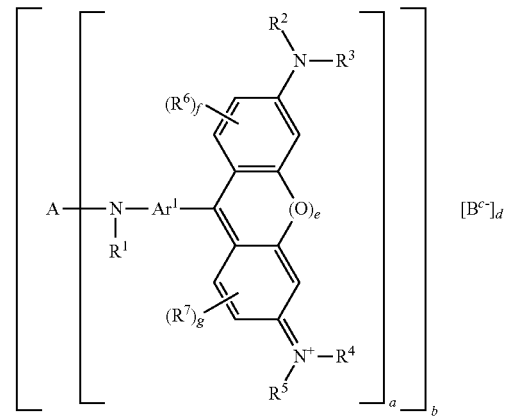

where "A" is an "a"-valent organic group in which a carbon atom directly bound to "N" contains no n bond, and the organic group is an aliphatic hydrocarbon group containing a saturated aliphatic hydrocarbon group at least at a terminal position directly bound to "N" and optionally containing O, S, N in a carbon chain, or an aromatic group containing an aliphatic hydrocarbon group at a terminal position directly bound to "N" and optionally containing O, S, N in a carbon chain; each of $R^1$, $R^2$, $R^3$, $R^4$ and $R^5$ is independently a hydrogen atom, an alkyl group optionally containing a substituent group, or an aryl group optionally containing a substituent group; each of $R^6$ and $R^7$ is independently an alkyl group optionally containing a substituent group or an alkoxy group optionally containing a substituent group; $Ar^1$ is a divalent aromatic group optionally containing a substituent group; $B^{c-}$ is a "c"-valent anion; each of "a" and "c" is an integer of 2 or more; each of "b" and "d" is an integer of 1 or more; "e" is 0 or 1; each of "f" and "g" is an integer of from 0 to 4; each of "f+e" and "g+e" is from 0 to 4; $R^1$s may be the same or different; $R^2$s may be the same or different; $R^3$s may be the same or different; $R^4$s may be the same or different; $R^5$s may be the same or different; $R^6$s may be the same or different; $R^7$s may be the same or different; $Ar^1$s may be the same or different; "e"s may be the same or different; "f"s may be the same or different; and "g"s may be the same or different.

In another embodiment, there is provided a color resin composition comprising (A) a color material, (B) a dispersant, (C) a solvent and (D) a binder component, wherein the color material (A) contains a compound which is represented by the general formula (I) and which contains one or more structures selected from the structures (i) and (ii).

In another embodiment, there is provided a color filter comprising at least a transparent substrate and color layers disposed on the substrate, wherein at least one of the color layers contains a compound which is represented by the general formula (I) and which contains one or more structures selected from the structures (i) and (ii).

In the compound represented by the general formula (I) and contained in the color material dispersion liquid, color resin composition and color filter of the disclosed embodiments, at least one of $R^2$, $R^3$, $R^4$ and $R^5$ may be a substituent group represented by the following formula (II) or (III)

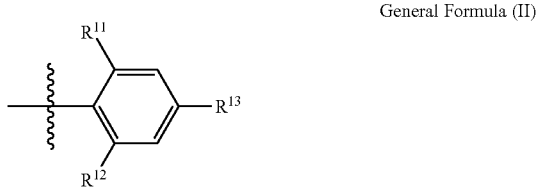

General Formula (II)

where each of $R^{11}$, $R^{12}$ and $R^{13}$ is independently a hydrogen atom, an alkyl group containing 1 to 4 carbon atoms and optionally containing a substituent group, or an alkoxy group containing 1 to 4 carbon atoms and optionally containing a substituent group,

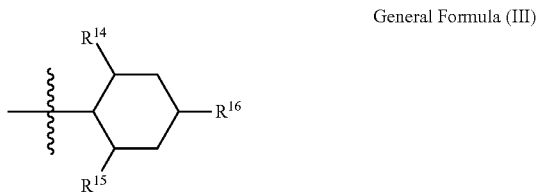

General Formula (III)

where each of $R^{14}$, $R^{15}$ and $R^{16}$ is independently a hydrogen atom, an alkyl group containing 1 to 4 carbon atoms and optionally containing a substituent group, or an alkoxy group containing 1 to 4 carbon atoms and optionally containing a substituent group.

In the compound represented by the general formula (I) and contained in the color material dispersion liquid, color resin composition and color filter of the disclosed embodiments, "A" may be a substituent group represented by the following general formula (IV):

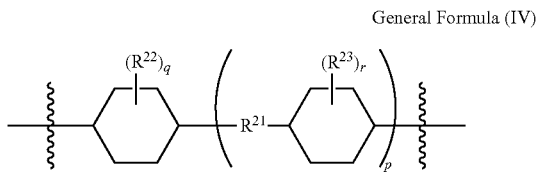

General Formula (IV)

where $R^{21}$ is an alkylene group containing 1 to 3 carbon atoms and optionally containing, as a substituent group, an alkyl group containing 1 to 4 carbon atoms or an alkoxy group containing 1 to 4 carbon atoms; each of $R^{22}$ and $R^{23}$ is independently an alkyl group containing 1 to 4 carbon atoms or an alkoxy group containing 1 to 4 carbon atoms; "p" is an integer of from 1 to 3; each of "q" and "r" is independently an integer of from 0 to 4; when two or more $R^{21}$s are present, they may be the same or different; when two or more $R^{22}$s are present, they may be the same or different; when two or more $R^{23}$s are present, they may be the same or different; and when two or more "r"s are present, they may be the same or different.

In the compound represented by the general formula (I) and contained in the color material dispersion liquid, color resin composition and color filter of the disclosed embodiments, the anion represented by $B^{c-}$ may be a heteropolyoxometalate containing one or more elements selected from tungsten and molybdenum.

In the color material dispersion liquid and color resin composition of the disclosed embodiments, the dispersant may contain a graft copolymer containing a constitutional unit represented by the following general formula (VII) and at least one selected from a constitutional unit represented by the following general formula (VI) and a constitutional unit represented by the following general formula (VI'), or a block copolymer containing a block moiety that contains a constitutional unit represented by the following general formula (VIII) and a block moiety that contains at least one selected from a constitutional unit represented by the following general formula (VI) and a constitutional unit represented by the following general formula (VI').

In another embodiment, there is provided a color filter, wherein a color layer containing a compound represented by the general formula (I) contains a dispersant, and wherein the dispersant contains a graft copolymer containing a constitutional unit represented by the following general formula (VII) and at least one selected from a constitutional unit represented by the following general formula (VI) and a constitutional unit represented by the following general formula (VI'), or a block copolymer containing a block moiety that contains a constitutional unit represented by the following general formula (VIII) and a block moiety that contains at least one selected from a constitutional unit represented by the following general formula (VI) and a constitutional unit represented by the following general formula (VI'):

(VI)

(VI')

-continued

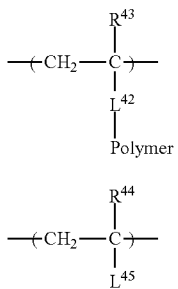
(VII)

where $L^{41}$ is a direct bond or a divalent linking group; $R^{41}$ is a hydrogen atom or a methyl group; $R^{42}$ is a hydrocarbon group or a monovalent group represented by $-[CH(R^{46})-CH(R^{47})-O]_{x1}-R^{48}$ or $-[(CH_2)_{y1}-O]_{z1}-R^{48}$; each of $R^{46}$ and $R^{47}$ is independently a hydrogen atom or a methyl group; $R^{48}$ is a hydrogen atom, a hydrocarbon group, or a monovalent group represented by $-CHO$, $-CH_2CHO$, $-CO-CH=CH_2$, $-CO-C(CH_3)=CH_2$, or $-CH_2COOR^{49}$; $R^{49}$ is a hydrogen atom or an alkyl group having 1 to 5 carbon atoms; the hydrocarbon group optionally contains a substituent group; x1 is an integer of from 1 to 18; y1 is an integer of from 1 to 5; and z1 is an integer of from 1 to 18;

where $X^+$ is an organic cation;

where $L^{42}$ is a direct bond or a divalent linking group; $R^{43}$ is a hydrogen atom or a methyl group; and "Polymer" is a polymer chain containing one or more selected from a constitutional unit represented by the following general formula (IX) and a constitutional unit represented by the following general formula (X); and where $R^{44}$ is a hydrogen atom or a methyl group; $R^{45}$ is a hydrocarbon group or a monovalent group represented by $-[CH(R^{50})-CH(R^{51})-O]_{x2}-R^{52}$, $-[(CH_2)_{y2}-O]_{z2}-R^{52}$, $-[CO-(CH_2)_{y2}-O]_{x2}-R^{52}$, $-CO-O-R^{52'}$ or $-O-CO-R^{52''}$; each of $R^{50}$ and $R^{51}$ is independently a hydrogen atom or a methyl group; $R^{52}$ is a hydrogen atom, a hydrocarbon group, or a monovalent group represented by $-CHO$, $-CH_2CHO$ or $-CH_2COOR^{53}$; $R^{52'}$ is a hydrocarbon group or a monovalent group represented by $-[CH(R^{50})-CH(R^{51})-O]_{x2}-R^{52}$, $[(CH_2)_{y2'}-O]_{z2'}-R^{52}$, or $-[CO-(CH_2)_{y2'}-O]_{z2'}-R^{52}$; $R^{52''}$ is an alkyl group having 1 to 18 carbon atoms; $R^{53}$ is a hydrogen atom or an alkyl group having 1 to 5 carbon atoms; the hydrocarbon group optionally contains a substituent group; each of x2 and x2' is independently an integer of from 1 to 18; each of y2 and y2' is independently an integer of from 1 to 5; and each of z2 and z2' is an integer of from 1 to 18:

(IX)

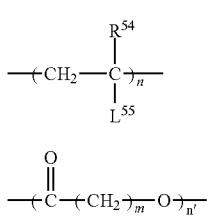

(X)

where $R^{54}$ is a hydrogen atom or a methyl group; $R^{55}$ is a hydrocarbon group or a monovalent group represented by $-[CH(R^{56})-CH(R^{57})-O]_{x3}-R^{58}$, $[(CH_2)_{y3}-O]_{z3}-R^{58}$, $-[CO-(CH_2)_{y3}-O]_{z3}-R^{58}$, $-CO-O-R^{59}$, or $-O-CO-R^{60}$; each of $R^{56}$ and $R^{57}$ is a hydrogen atom or a methyl group; $R^{58}$ is a hydrogen atom, a hydrocarbon group, or a monovalent group represented by $-CHO$, $-CH_2CHO$ or $-CH_2COOR^{61}$; $R^{59}$ is a hydrocarbon group or a monovalent group represented by $-[CH(R^{56})-CH(R^{57})-O]_{x4}-R^{58}$, $-[(CH_2)_{y4}-O]_{z4}-R^{58}$ or $-[CO-(CH_2)_{y4}-O]_{z4}-R^{58}$; $R^{60}$ is an alkyl group having 1 to 18 carbon atoms; $R^{61}$ is a hydrogen atom or an alkyl group having 1 to 5 carbon atoms; the hydrocarbon group optionally contains a substituent group; "m" is an integer of from 1 to 5; "n" and "n'" are each an integer of from 5 to 200; each of x3 and x4 is independently an integer of from 1 to 18; each of y3 and y4 is independently an integer of from 1 to 5; and each of z3 and z4 is independently an integer of from 1 to 18.

In the color resin composition according to the disclosed embodiments, a difference $\Delta x$ ($=x_1-x_0$) between a chromaticity coordinate $x_0$ of a cured film$_{(0)}$ obtained by drying the color resin composition and heating the dried color resin composition at 230° C. for 30 minutes to a thickness at which a chromaticity coordinate $y_0$ is 0.082, and a chromaticity coordinate $x_1$ of a cured film$_{(1)}$ obtained by repeating, three times, a process of heating the cured film$_{(0)}$ at 230° C. for 30 minutes and then leaving the heated cured film$_{(0)}$ to cool for 30 minutes, may be 0.025 or less.

In the color resin composition according to the disclosed embodiments, the binder component (D) may contain a phosphorus atom-containing polyfunctional monomer.

In the color filter according to the disclosed embodiments, the color layer containing the compound which is represented by the general formula (I) and which contains one or more structures selected from the structures (i) and (ii), may contain a binder component, and the binder component may contain a phosphorus atom-containing polyfunctional monomer.

In the color filter according to the disclosed embodiments, for a visible light transmission spectrum of the color layer containing the compound which is represented by the general formula (I) and which contains one or more structures selected from the structures (i) and (ii), a maximum transmittance at 400 nm or more and 500 nm or less may be 86% or more; a minimum transmittance at 550 nm or more and 650 nm or less may be 2% or less; and a wavelength indicating the maximum transmittance at 400 nm or more and 500 nm or less, may be in a range of from 425 nm to 455 nm.

In another embodiment, there is provided a liquid crystal display device comprising the color filter according to the disclosed embodiments, a counter substrate, and a liquid crystal layer disposed between the color filter and the counter substrate.

In another embodiment, there is provided a light-emitting display device comprising the color filter according to the disclosed embodiments and an organic light-emitting body.

Advantageous Effects of Invention

According to the disclosed embodiments, the following can be provided: a color material dispersion liquid configured to form a coating film which is excellent in heat resistance and which is able to suppress color change during heating; a color resin composition configured to form a color layer which is excellent in heat resistance and which is able to suppress color change during heating; a color filter which is excellent in heat resistance; a liquid crystal display device including the color filter; and a light-emitting display device including the color filter.

BRIEF DESCRIPTION OF DRAWINGS

In the accompanying drawings.

DESCRIPTION OF EMBODIMENTS

Figure 1:
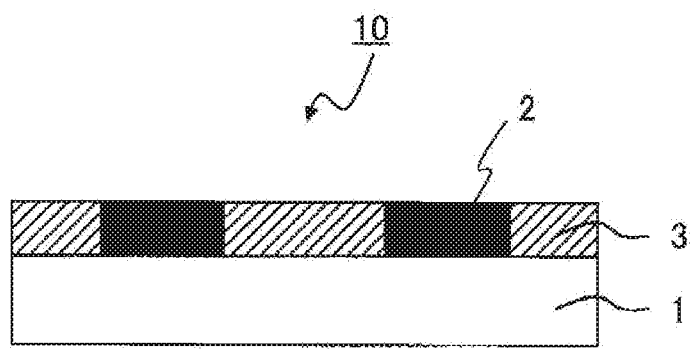
FIG. 1 is a schematic sectional view of an embodiment of a color filter.

The embodiments of the present disclosure are explained below while referring to the drawings and the like. However, the present disclosure can be implemented in many different aspects and is not to be interpreted as being limited to the description of the embodiments exemplified herein. In addition, in order to make the explanation clearer, although the drawings may be schematically represented in terms of the width, thickness, shape and the like of each part as compared with their actual form, they are only an example, and the interpretation of the present disclosure is not limited. In addition, in the present Description and each figure, the same reference numerals are given to the same elements as those described previously with reference to the previous figures, and a detailed explanation may be omitted as appropriate. In addition, for the purposes of explanation, although an explanation is given using the terms "upward" or "downward", the upward and downward directions may also be reversed.

In the present Description, when a certain configuration such as a certain member or region is referred to as being "above (or below)" another configuration such as another member or region, unless there is a specific limitation, this includes not only a case where the certain configuration is directly above (or directly below) another configuration, but also a case where the certain configuration is located above (or below) another configuration, that is, another component is included between the certain configuration and another configuration.

In the disclosed embodiments, "light" encompasses electromagnetic waves in visible and non-visible wavelength ranges and radial rays. Radial rays include microwaves and electron beams, more specifically, electromagnetic waves with a wavelength of 5 μm or less and electron beams. Also in the disclosed embodiments, "(meth)acrylic" means any of acrylic and methacrylic, and "(meth)acrylate" means any of acrylate and methacrylate.

1. Color Material Dispersion Liquid

The color material dispersion liquid according to the disclosed embodiments is a color material dispersion liquid comprising (A) a color material, (B) a dispersant and (C) a solvent, wherein the color material (A) contains a compound which is represented by the following general formula (I) and which contains one or more structures selected from the following structures (i) and (ii) (hereinafter, the compound may be simply referred to as "the color material represented by the general formula (I)"):

(i) "A" is an aliphatic hydrocarbon group containing two or more alicyclic hydrocarbon groups, containing a saturated aliphatic hydrocarbon group at a terminal position directly bound to "N", and optionally containing O, S, N in a carbon chain (ii) at least one of $R^2$, $R^3$, $R^4$ and $R^5$ is a cycloalkyl group optionally containing a substituent group or an aryl group optionally containing a substituent group.

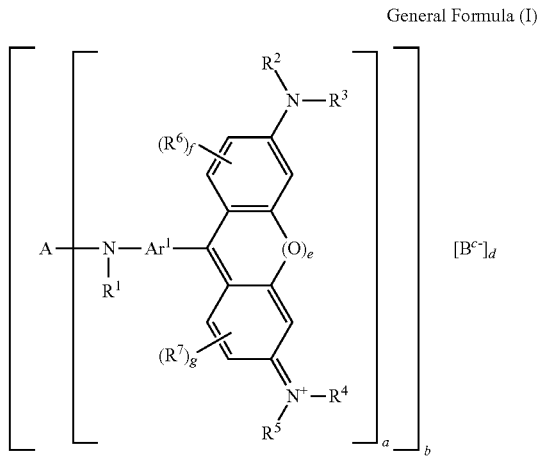

General Formula (I)

where "A" is an "a"-valent organic group in which a carbon atom directly bound to "N" contains no n bond, and the organic group is an aliphatic hydrocarbon group containing a saturated aliphatic hydrocarbon group at least at a terminal position directly bound to "N" and optionally containing O, S, N in a carbon chain, or an aromatic group containing an aliphatic hydrocarbon group at a terminal position directly bound to "N" and optionally containing O, S, N in a carbon chain; each of $R^1$, $R^2$, $R^3$, $R^4$ and $R^5$ is independently a hydrogen atom, an alkyl group optionally containing a substituent group, or an aryl group optionally containing a substituent group; each of $R^6$ and $R^7$ is independently an alkyl group optionally containing a substituent group or an alkoxy group optionally containing a substituent group; $Ar^1$ is a divalent aromatic group optionally containing a substituent group; $B^{c-}$ is a "c"-valent anion; each of "a" and "c" is an integer of 2 or more; each of "b" and "d" is an integer of 1 or more; "e" is 0 or 1; each of "f" and "g" is an integer of from 0 to 4; each of "f+e" and "g+e" is from 0 to 4; $R^1$s may be the same or different; $R^2$s may be the same or different; $R^3$s may be the same or different; $R^4$s may be the same or different; $R^5$s may be the same or different; $R^6$s may be the same or different; $R^7$s may be the same or different; $Ar^1$s may be the same or different; "e"s may be the same or different; "f"s may be the same or different; and "g"s may be the same or different.

A coating film formed by use of the color material dispersion liquid according to the disclosed embodiments, shows a small color change after heating and is excellent in heat resistance. The reason is not absolutely clear; however, it is estimated as follows.

The inventors of the present disclosure made a detailed study on the color material, from the viewpoint of suppressing a change in the color of the compound before and after heating. As a result, it was found that excellent heat resistance is obtained when the color material represented by the general formula (I) is a compound that satisfies at least one of the following (i) and (ii):

(i) "A" is an aliphatic hydrocarbon group containing two or more alicyclic hydrocarbon groups, containing a saturated aliphatic hydrocarbon group at a terminal position directly bound to "N", and optionally containing O, S, N in a carbon chain (ii) at least one of $R^2$, $R^3$, $R^4$ and $R^5$ is a cycloalkyl group optionally containing a substituent group or an aryl group optionally containing a substituent group.

The reason why excellent heat resistance is obtained when the compound contains at least one of the above-specified structures, is not absolutely clear. However, it is estimated as follows.

In the general formula (I), "A" is a linking group linking two or more color-forming moieties. It was estimated that the heat resistance of the compound is increased when the linking group "A" contains a tough cyclic skeleton. However, it is estimated that the color-forming moieties linked by the cyclic skeleton are more rigid than the case of being linked by a chain skeleton, resulting in a decrease in the freedom of rotational motion. It was estimated that since the triarylmethane or xanthene moiety, which is a color moiety, contains a bulky structure, if its rotational motion is suppressed, free molecular motion is inhibited at the time of heating, which causes distortion and, as a result, becomes a cause for molecular decomposition. In the compound of the present disclosure, when "A" is the above-specified aliphatic hydrocarbon group containing two or more alicyclic hydrocarbon groups, rotational motion is ensured at the linking moiety linking at least two or more alicyclic hydrocarbon groups. Therefore, the two or more color-forming moieties are allowed to move independently to some degree, so that distortion is less likely to occur and, as a result, the heat resistance of the compound is increased.

$R^2$ to $R^5$ are substituent groups bound to nitrogen atoms constituting the color-forming moieties. It is estimated that since at least one of $R^2$ to $R^5$ has an aryl group, the conjugation range of conjugated electrons of the color-forming moieties expands to the aryl group, thus obtaining resonance stabilization and increased heat resistance. It is also estimated that since at least one of $R^2$ to $R^5$ is an electron-donating cycloalkyl group, electron density in the resonance structure of the color-forming moieties is increased, thereby increasing the stability of the color-forming moieties.

Due to the above reason, the heat resistance of the compound is increased by obtaining at least one of the above-mentioned structures (i) and (ii).

Figure 4:
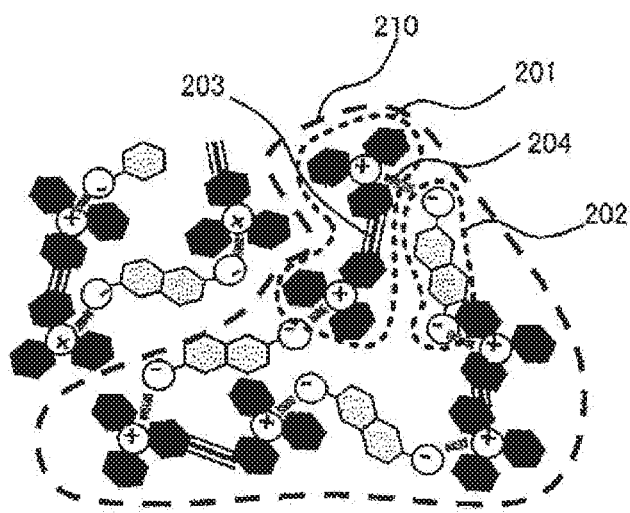
FIG. 4 is a schematic view of the molecular association state of a color material.
Figure 5:
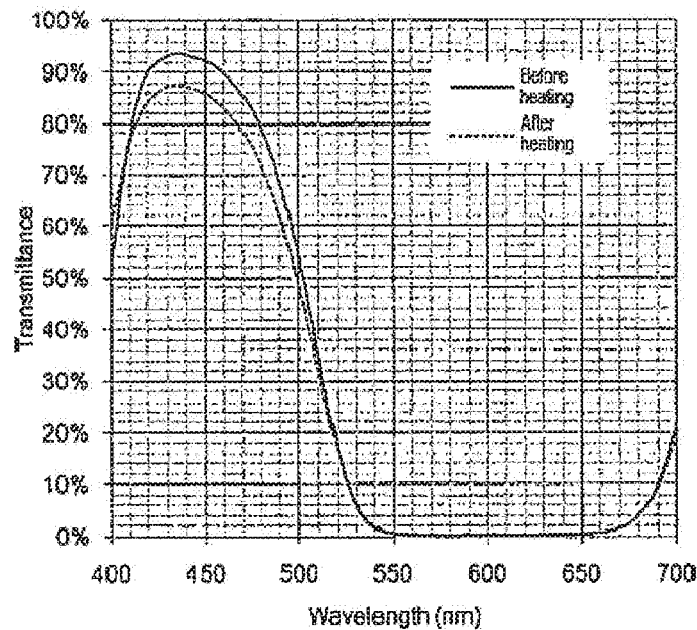
FIG. 5 shows transmission spectra of a blue color layer obtained by use of a color resin composition of Example 1.
Figure 6:
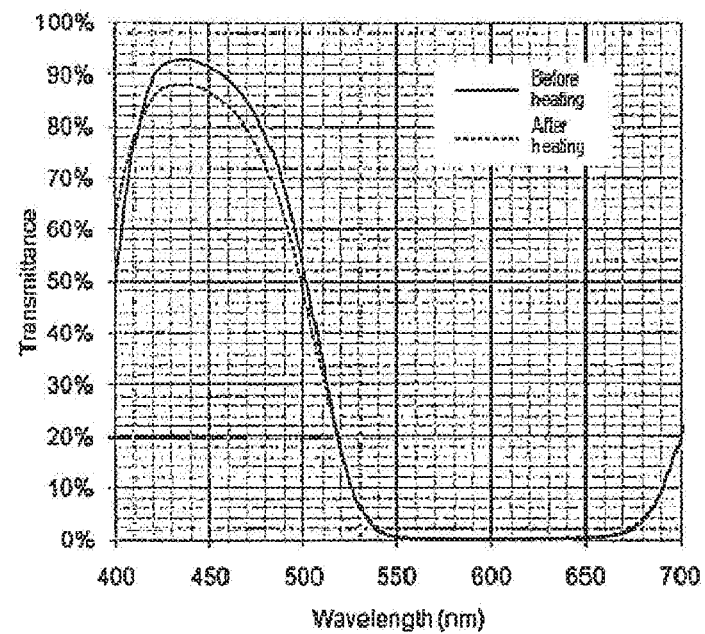
FIG. 6 shows transmission spectra of a blue color layer obtained by use of a color resin composition of Example 2.
Figure 7:
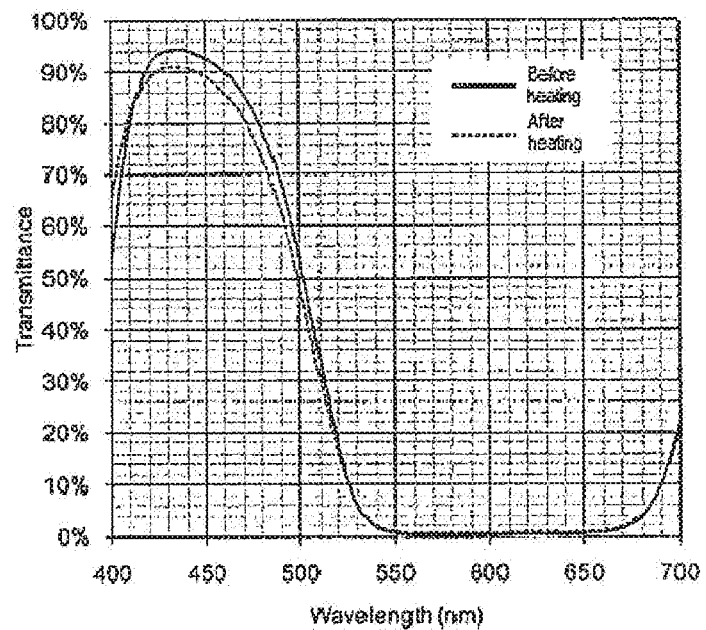
FIG. 7 shows transmission spectra of a blue color layer obtained by use of a color resin composition of Example 3.
Figure 8:
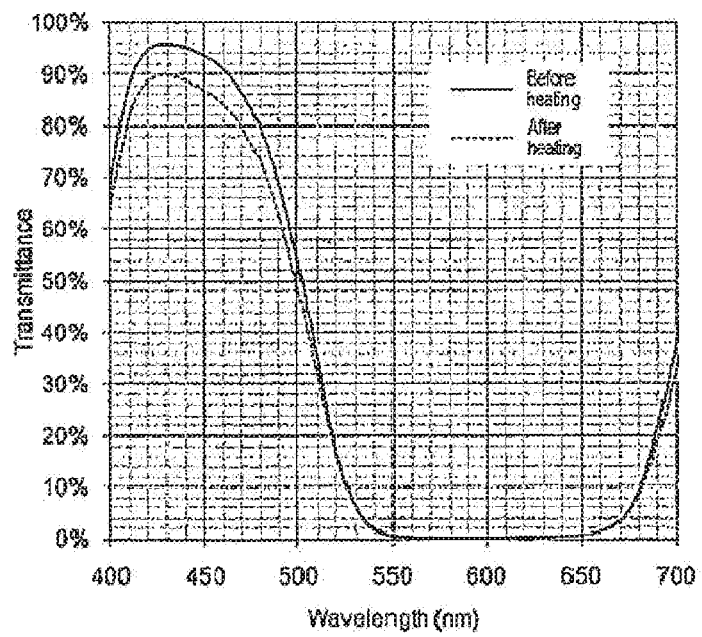
FIG. 8 shows transmission spectra of a blue color layer obtained by use of a color resin composition of Example 5.
Figure 9:
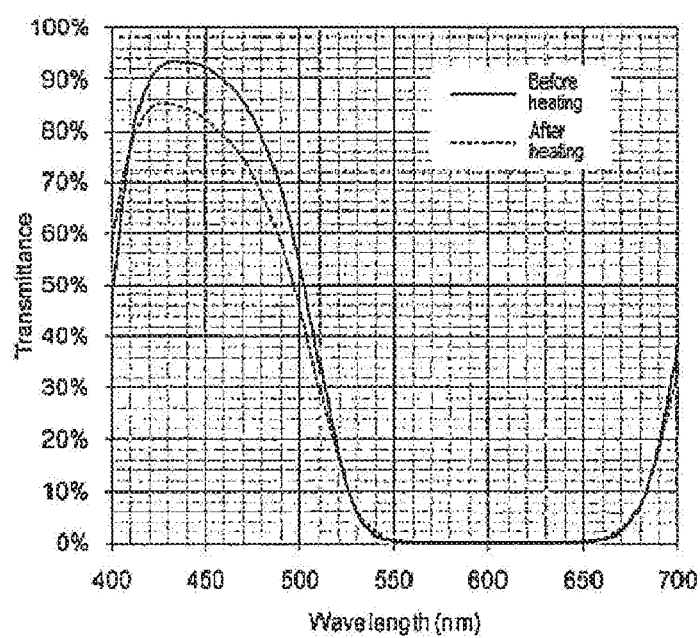
FIG. 9 shows transmission spectra of a blue color layer obtained by use of a color resin composition of Comparative Example 1.

In the color material represented by the general formula (I), triarylmethane or xanthene skeletons have such a structure that two or more of them are connected through the linking group "A", thereby forming a polyvalent cation. In the compound represented by the general formula (I), a divalent or higher anion is used as a counter anion. Therefore, it is estimated that as shown by the example in FIG. 4, in the compound represented by the general formula (I), a molecular association 210 in which molecules are continuously connected through ionic bonds and associated, is formed by using a divalent or higher cation 201 in combination with a divalent or higher anion 202. Since the molecular association acts as one molecule in an aggregate of the color material, it is estimated that the apparent molecular weight of the molecular association is much larger than that of a conventional salt-forming compound in which anions and cations bind to each other on a one-on-one basis, and the molecular association contributes to an increase in the heat resistance of the compound. Since the molecular association is composed of cations and anions, it is thought that the ionic bonds are strengthened by increasing cationicity (basicity), whereby the molecular association is synergistically stabilized. Also, since the two or more color-forming moieties in the molecular association are allowed to move independently to some degree, distortion is less likely to occur. Accordingly, it is thought that the ionic bond can keep a distance, and the molecular association is synergistically stabilized, therefore. From these reasons, it is estimated that a coating film formed by use of the color material dispersion liquid of the disclosed embodiments, is excellent in heat resistance.

The color material dispersion liquid of the disclosed embodiments comprises at least (A) a color material, (B) a dispersant and (C) a solvent. The color material dispersion liquid of the disclosed embodiments may further contain other components, to the extent that does not impair the effects of the disclosed embodiments.

The components of the color material dispersion liquid will be described in detail.

(A) Color Material

In the color material dispersion liquid according to the disclosed embodiments, the color material (A) contains a compound which is represented by the following general formula (I) and which contains one or more structures selected from the following structures (i) and (ii). Also, the color material dispersion liquid of the disclosed embodiments may further contain other color material, to the extent that does not impair the effects of the disclosed embodiments. By the use of the specific compound represented by the general formula (I), a coating film or color layer excellent in heat resistance can be formed.

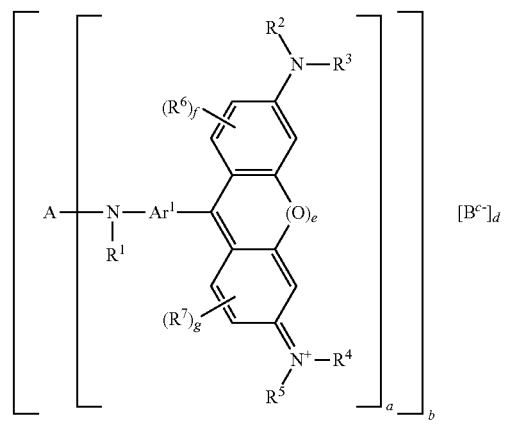

General Formula (I)

(The symbols in the general formula (I) are as described above.)

<Cation>

For the compound represented by the general formula (I), a color-forming cation is represented by the following general formula (A) and contains one or more structures selected from the following structures (i) and (ii):

(i) "A" is an aliphatic hydrocarbon group containing two or more alicyclic hydrocarbon groups, containing a saturated aliphatic hydrocarbon group at a terminal position directly bound to "N", and optionally containing O, S, N in a carbon chain (ii) at least one of $R^2$, $R^3$, $R^4$ and $R^5$ is a cycloalkyl group optionally containing a substituent group or an aryl group optionally containing a substituent group.

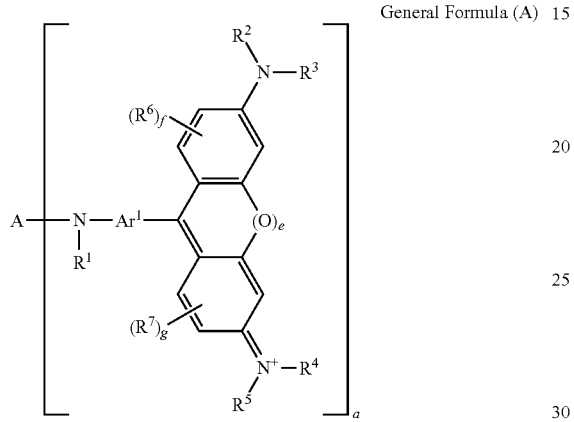

General Formula (A)

(The symbols in the general formula (A) are the same as those in the general formula (I).

The general formula (A) contains one or more structures selected from a triarylmethane moiety represented by the following general formula (B) (in the case where "e" is 0) and a xanthene moiety represented by the following general formula (C) (in the case where "e" is 1). Since the triarylmethane and xanthene moieties have excellent color-forming properties, the compound represented by the general formula (I) can be suitably used as the color material.

For the linking group "A" linking the triarylmethane and xanthene moieties, the carbon atom directly bound to "N" contains no n bond. Therefore, two or more triarylmethane and xanthene moieties that are present per molecule of the compound, become independent color-forming moieties.

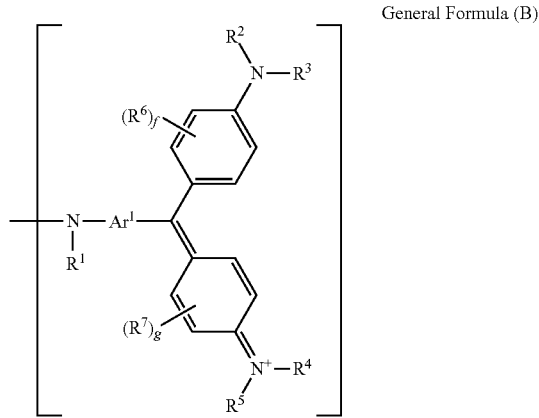

General Formula (B)

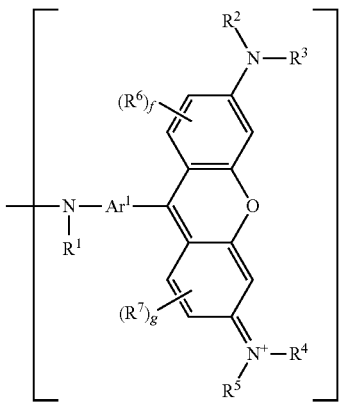

General Formula (C)

(The symbols in the general formulae (B) and (C) are the same as those in the general formula (A).)

In the general formulae (I) and (A), the linking group "A" is an "a"-valent organic group in which a carbon atom directly bound to "N" (nitrogen atom) contains no n bond, and the organic group is an aliphatic hydrocarbon group containing a saturated aliphatic hydrocarbon group at least at a terminal position directly bound to "N" and optionally containing O (oxygen atom), S (sulfur atom), N in a carbon chain, or an aromatic group containing an aliphatic hydrocarbon group at a terminal position directly bound to "N" and optionally containing O, S, N in a carbon chain. Since the carbon atom directly bound to "N" contains no n bond, the color characteristics of the color-forming moiety, such as color tone and transmittance, are not affected by the linking group "A" and other color-forming moieties.

In "A", as long as the carbon atom being at the terminal position and directly bound to "N" contains no n bond, the aliphatic hydrocarbon group containing a saturated aliphatic hydrocarbon group at least at a terminal position directly bound to "N", may be straight-chain, branched-chain or cyclic, may contain an unsaturated bond in carbon atoms except the one in the terminal position, may contain a substituent group, or may contain O, S, N in the carbon chain. For example, a carbonyl group, a carboxyl group, an oxycarbonyl group and/or an amide group may be contained, and the hydrogen atom of the hydrocarbon group may be substituted by a halogen atom, etc.

Also in "A", as the aromatic group containing an aliphatic hydrocarbon group, examples include, but are not limited to, a monocyclic or polycyclic aromatic group which contains an aliphatic hydrocarbon group containing a saturated aliphatic hydrocarbon group at least at the terminal position directly bound to "N". The aromatic group may contain a substituent group, and it may be a heterocyclic ring containing O, S, N.

Particularly, from the viewpoint of skeleton toughness, it is preferable that "A" contains an alicyclic hydrocarbon group or an aromatic group.

As the alicyclic hydrocarbon group, examples include, but are not limited to, groups containing cyclohexane, cyclopentane, norbornane, bicyclo[2.2.2]octane, tricyclo[5.2.1.0$^{2,6}$]decane and adamantane. As the aromatic group, examples include, but are not limited to, a group containing a benzene ring and a group containing a naphthalene ring.

In the present disclosure, from the viewpoint of obtaining both the toughness and the molecular motion freedom and increasing the heat resistance of the compound, it is preferable that "A" satisfies the above-mentioned (i), that is, "A" is an aliphatic hydrocarbon group containing two or more alicyclic hydrocarbon groups, containing a saturated aliphatic hydrocarbon group at a terminal position directly bound to "N", and optionally containing O, S, N in a carbon chain. It is more preferable that "A" is an aliphatic hydrocarbon group containing two or more cycloalkylene groups, containing a saturated aliphatic hydrocarbon group at a terminal position directly bound to "N", and optionally containing O, S, N in a carbon chain. It is still more preferable that "A" contains such a structure that two or more alicyclic hydrocarbon groups are bound by a straight-chain or branched-chain aliphatic hydrocarbon group.

The two or more alicyclic hydrocarbon groups may be the same as or different from each other. As the alicyclic hydrocarbon groups, examples include, but are not limited to, the above-mentioned alicyclic hydrocarbon groups. Of them, cyclohexane and cyclopentane are preferred.

In the present disclosure, from the viewpoint of the heat resistance, it is preferable that "A" is a substituent group represented by the following general formula (IV):

General Formula (IV)

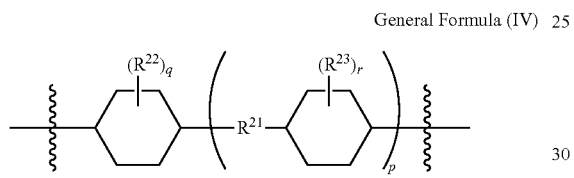

where $R^{21}$ is an alkylene group containing 1 to 3 carbon atoms and optionally containing, as a substituent group, an alkyl group containing 1 to 4 carbon atoms or an alkoxy group containing 1 to 4 carbon atoms; each of $R^{22}$ and $R^{23}$ is independently an alkyl group containing 1 to 4 carbon atoms or an alkoxy group containing 1 to 4 carbon atoms; "p" is an integer of from 1 to 3; each of "q" and "r" is independently an integer of from 0 to 4; when two or more $R^{21}$s are present, they may be the same or different; when two or more $R^{22}$s are present, they may be the same or different; when two or more $R^{23}$s are present, they may be the same or different; and when two or more "r"s are present, they may be the same or different.

From the viewpoint of obtaining both the toughness and the thermal motion of the color-forming moieties and increasing the heat resistance, $R^{21}$ is preferably an alkylene group containing 1 to 3 carbon atoms. As the alkylene group, examples include, but are not limited to, a methylene group, an ethylene group and a propylene group. Of them, a methylene group and an ethylene group are preferred, and a methylene group is more preferred.

As the alkyl group containing 1 to 4 carbon atoms, examples include, but are not limited to, a methyl group, an ethyl group, a propyl group and a butyl group. They may be straight-chain or branched-chain.

As the alkoxy group containing 1 to 4 carbon atoms, examples include, but are not limited to, a methoxy group, an ethoxy group, a propoxy group and a butoxy group. They may be straight-chain or branched-chain.

Examples of the alkyl group containing 1 to 4 carbon atoms and the alkoxy group containing 1 to 4 carbon atoms as $R^{22}$ and $R^{23}$ include, but are not limited to, the above-mentioned substituent groups that $R^{21}$ may contain.

From the viewpoint of the heat resistance, it is preferable that the number of cyclohexanes (cyclohexylene groups) in the general formula (IV) is from 2 to 4, that is, "p" is from 1 to 3. It is more preferable that p is 1 or 2.

The numbers of the substituent groups $R^{22}$ and $R^{23}$ that the cyclohexylene group may contain, are not particularly limited. From the viewpoint of the heat resistance, each of the numbers is preferably from 1 to 3, and more preferably 1 or 2. That is, it is preferable that each of "q" and "r" is an integer of from 1 to 3, and it is more preferable that each of "q" and "r" is an integer of 1 or 2.

As the linking group "A", preferred examples include, but are not limited to, the following groups.

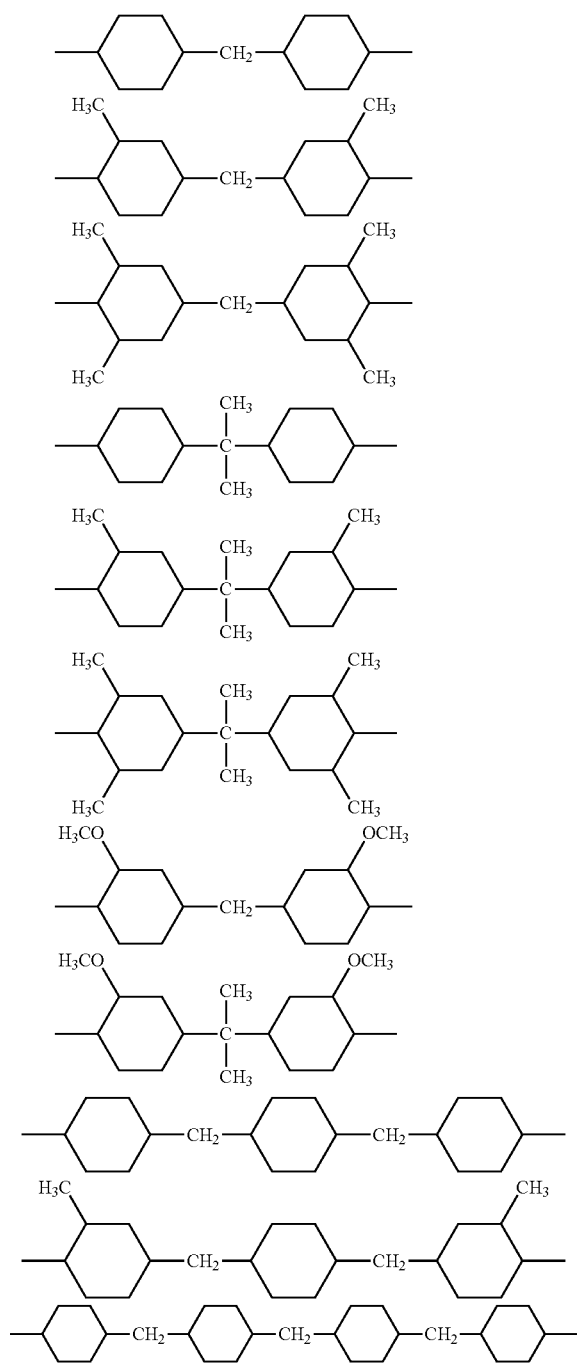

Each of $R^1$ to $R^5$ is independently a hydrogen atom, an alkyl group optionally containing a substituent group, or an aryl group optionally containing a substituent group.

The alkyl group as $R^1$ is not particularly limited. As the alkyl group, examples include, but are not limited to, a straight-chain, branched-chain or cyclic alkyl group containing 1 to 20 carbon atoms. The alkyl group as $R^1$ is preferably a straight-chain or branched-chain alkyl group containing 1 to 8 carbon atoms, more preferably a straight-chain or branched-chain alkyl group containing 1 to 5 carbon atoms, and still more preferably an ethyl group or a methyl group. As the substituent group that the alkyl group as $R^1$ may contain, examples include, but are not limited to, an aryl group, a halogen atom and a hydroxyl group. As the substituted alkyl group, examples include, but are not limited to, a benzyl group. The aryl group as $R^1$ is not particularly limited. As the aryl group, examples include, but are not limited to, a phenyl group and a naphthyl group. As the substituent group that the aryl group as $R^1$ may contain, examples include, but are not limited to, an alkyl group, an alkoxy group, a halogen atom and a hydroxyl group.

As the alkyl group optionally containing a substituent group or the aryl group optionally containing a substituent group as $R^2$, $R^3$, $R^4$ and $R^5$, the examples provided above as $R^1$ can be preferably used. From the viewpoint of the heat resistance, it is preferable that at least one of $R^2$ to $R^5$ is a cycloalkyl group optionally containing a substituent group or an aryl group optionally containing a substituent group. Since at least one of $R^2$ to $R^5$ contains a cycloalkyl group or an aryl group, intermolecular interaction is reduced by steric hindrance and, as a result, influences of heat on the color-forming moieties can be reduced. Therefore, the heat resistance of the compound is excellent.

When at least one of $R^2$ to $R^5$ is an aryl group or a cycloalkyl group, compared to the case of not containing at least one of the structures (i) and (ii), the reactivity of conjugated cation increases to increase the strength of an ionic bond with counter anion, thereby stabilizing ion pairs. Therefore, the compound obtains excellent heat resistance.

For the compound of the disclosed embodiments, from the viewpoint of the heat resistance, it is preferable that at least one of $R^2$ to $R^5$ is a substituent group represented by the following formula (II) or (III):

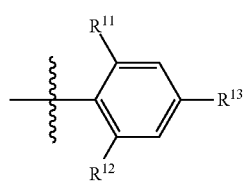

General Formula (II)

where each of $R^{11}$, $R^{12}$ and $R^{13}$ is independently a hydrogen atom, an alkyl group containing 1 to 4 carbon atoms and optionally containing a substituent group, or an alkoxy group containing 1 to 4 carbon atoms and optionally containing a substituent group,

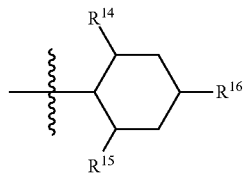

General Formula (III)

where each of $R^{14}$, $R^{15}$ and $R^{16}$ is independently a hydrogen atom, an alkyl group containing 1 to 4 carbon atoms and optionally containing a substituent group, or an alkoxy group containing 1 to 4 carbon atoms and optionally containing a substituent group.

Examples of the alkyl group containing 1 to 4 carbon atoms as $R^{11}$, $R^{12}$, $R^{13}$, $R^{14}$, $R^{15}$ and $R^{16}$ include a methyl group, an ethyl group, a propyl group and a butyl group. The alkyl group may be straight-chain or branched-chain. As the alkoxy group containing 1 to 4 carbon atoms, examples include a methoxy group, an ethoxy group, a propoxy group and a butoxy group. The alkoxy group may be straight-chain or branched-chain.

As the substituent group that the alkyl group and the alkoxy group may contain, examples include, but are not limited to, a halogen atom and a hydroxyl group.

In the case of containing a substituent group represented by the general formula (II), from the viewpoint of the heat resistance, it is preferable that at least one of $R^{11}$, $R^{12}$ and $R^{13}$ is an alkyl group containing 1 to 4 carbon atoms and optionally containing a substituent group, or an alkoxy group containing 1 to 4 carbon atoms and optionally containing a substituent group. It is more preferable that at least one of $R^{11}$ and $R^{12}$ is an alkyl group containing 1 to 4 carbon atoms and optionally containing a substituent group, or an alkoxy group containing 1 to 4 carbon atoms and optionally containing a substituent group.

In the case of containing a substituent group represented by the general formula (III), from the viewpoint of the heat resistance, it is preferable that at least one of $R^{14}$, $R^{15}$ and $R^{16}$ is an alkyl group containing 1 to 4 carbon atoms and optionally containing a substituent group, or an alkoxy group containing 1 to 4 carbon atoms and optionally containing a substituent group. It is more preferable that at least one of $R^{14}$ and $R^{15}$ is an alkyl group containing 1 to 4 carbon atoms and optionally containing a substituent group, or an alkoxy group containing 1 to 4 carbon atoms and optionally containing a substituent group.

As the substituent group represented by the general formula (II) and the substituent group represented by the general formula (III), preferred examples include, but are not limited to, the following groups.

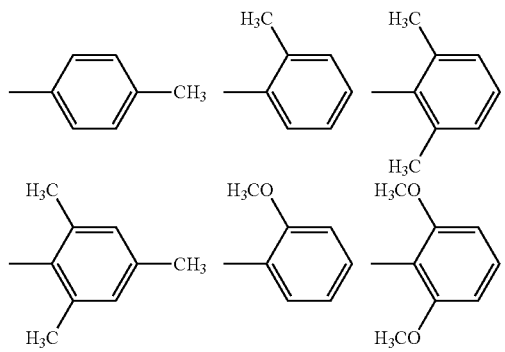

-continued

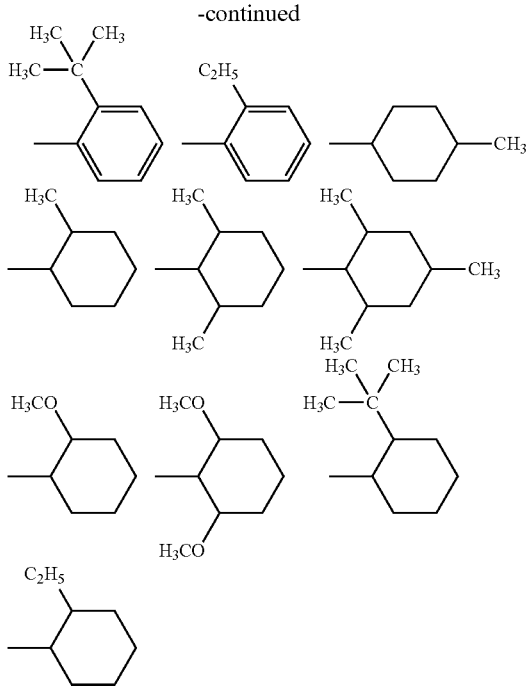

Each of R⁶ and R⁷ is independently an alkyl group optionally containing a substituent group or an alkoxy group optionally containing a substituent group. The alkyl group as R⁶ and R⁷ is not particularly limited. It is preferably a straight-chain or branched-chain alkyl group containing 1 to 8 carbon atoms, and more preferably an alkyl group containing 1 to 4 carbon atoms. As the alkyl group containing 1 to 4 carbon atoms, examples include a methyl group, an ethyl group, a propyl group and a butyl group, and the alkyl group may be straight-chain or branched-chain.

The alkoxy group as R⁶ and R⁷ is not particularly limited. It is preferably a straight-chain or branched-chain alkoxy group containing 1 to 8 carbon atoms, and more preferably an alkoxy group containing 1 to 4 carbon atoms. As the alkoxy group containing 1 to 4 carbon atoms, examples include a methoxy group, an ethoxy group, a propoxy group and a butoxy group, and the alkoxy group may be straight-chain or branched-chain.

Each of the number of the substituent groups of R⁶ and the number of the substituent groups of R⁷, that is, each of "f" and "g" is independently an integer of from 0 to 4. Each of them is preferably an integer of from 0 to 2, and more preferably an integer of 0 or 1.

Each of R⁶ and R⁷ may be substituted at any position of an aromatic ring with a resonance structure in the triarylmethane or xanthene skeleton. It is preferable that each of R⁶ and R⁷ is substituted at the meta-position, relative to the substitution position of the amino group represented by —NR²R³ or —NR⁴R⁵.

The divalent aromatic group as Ar¹ is not particularly limited. The aromatic group may be an aromatic hydrocarbon group comprising a carbon ring, or a heterocyclic group. As the aromatic hydrocarbon in the aromatic hydrocarbon group, examples include, but are not limited to, a benzene ring; condensed polycyclic aromatic hydrocarbons such as a naphthalene ring, a tetralin ring, an indene ring, a fluorene ring, an anthracene ring and a phenanthrene ring; and chain polycyclic hydrocarbons such as biphenyl, terphenyl, diphenylmethane, triphenylmethane and stilbene. The chain polycyclic hydrocarbons may contain O, S, N in the chain skeleton, such as diphenyl ether. Meanwhile, as the heterocyclic ring in the heterocyclic group, examples include, but are not limited to, 5-membered heterocyclic rings such as furan, thiophene, pyrrole, oxazole, thiazole, imidazole and pyrazole; 6-membered heterocyclic rings such as pyran, pyrone, pyridine, pyrone, pyridazine, pyrimidine and pyrazine; and condensed polycyclic heterocyclic rings such as benzofuran, thionaphthene, indole, carbazole, coumarin, benzo-pyrone, quinoline, isoquinoline, acridine, phthalazine, quinazoline and quinoxaline. These aromatic groups may further contain, as a substituent group, an alkyl group, an alkoxy group, a hydroxyl group, a halogen atom, etc.

In the general formulae (I) and (A), "a" is the number of the color-forming moieties constituting the cation, and "a" is an integer of 2 or more. The upper limit of "a" is not particularly limited. From the viewpoint of ease of production, "a" is preferably 4 or less, and more preferably 3 or less.

For the cation represented by the general formula (A), the molecular weight is preferably 1200 or more, and more preferably 1300 or more, from the point of view that the compound obtains excellent heat resistance and a color change of the compound is easily suppressed at the time of heating.

<Anion>

The compound represented by the general formula (I) contains a divalent or higher anion (B^c−). It is estimated that in the compound represented by the general formula (I), as shown by the example in FIG. 4, a molecular association 10 in which molecules are continuously connected through ionic bonds and associated, is formed by using a divalent or higher cation 201 in combination with a divalent or higher anion 202. Since the molecular association acts as one molecule in an aggregate of the color material, it is estimated that the apparent molecular weight of the molecular association is much larger than that of a conventional salt-forming compound in which anions and cations bind to each other on a one-on-one basis, and the molecular association contributes to an increase in the heat resistance of the compound.

The molecular association 210 contains the ionic bonds. Therefore, when a continuous ion association is formed by using a counter anion that "c" is 2 or more, many ionic bonds are contained in the association. Therefore, when "c" is 2 or more, the effect of increasing ionic bond strength which is obtained in the case of containing at least one of the structures (i) and (ii), is higher than the case where "c" is 1, and heat resistance and reliability such as suppression of elution from a coating film, is increased.

The divalent or higher anion (B^c−) is not particularly limited and may be an organic or inorganic anion.

When B^c− is an organic anion, the structure is not particularly limited. The organic anion is preferably an organic group containing an anionic substituent group.

As the anionic substituent group, examples include, but are not limited to, imide acid groups such as —SO₂N⁻SO₂CH₃, —SO₂N⁻COCH₃, —SO₂N⁻SO₂CF₃, —SO₂N⁻COCF₃, —CF₂SO₂N⁻SO₂CH₃, —CF₂SO₂N⁻COCH₃, —CF₂SO₂N⁻SO₂CF₃, and —CF₂SO₂N⁻COCF₃, and substituent groups such as —SO₃⁻, —CF₂SO₃⁻, —PO₃²⁻, —COO⁻, —CF₂PO₃²⁻, and —CF₂COO⁻.

From the viewpoint of stabilizing cation and stabilizing the color formed by the color material, it is preferable to use two or more monovalent anionic substituent groups. From the viewpoint of availability of raw materials, production cost and, due to their high acidity, being highly effective in stabilizing cation to maintain the color thus formed, imide acid groups, —$SO_3^-$ and —$CF_2SO_3^-$ are preferred, and —$SO_3^-$ (sulfonato group) is more preferred.

In the case of introducing two or more anionic substituent groups, they may be the same substituent groups or different substituent groups.

The organic group to which the anionic substituent group is bound by substitution, is not particularly limited. As the organic group, for example, the same organic group as that described in paragraphs 0053 to 0055 in Japanese Patent Application Laid-Open (JP-A) No. 2013-057053, may be used.

On the other hand, when $B^{c-}$ is an inorganic anion, the structure and composition is not particularly limited, as long as it is an inorganic oxoacid or a dehydrated condensate thereof. As the inorganic anion, examples include, but are not limited to, anions of divalent or higher oxoacids (e.g., phosphate ion, sulfate ion, chromate ion, tungstate ion ($WO_4^{2-}$) and molybdate ion ($MoO_4^{2-}$)), polyoxometalate ions formed by condensation of oxoacids, and mixtures thereof.

The polyoxometalate may be isopolyoxometalate ion $(M_mO_n)^{c-}$ or heteropolyoxometalate ion $(X_lM_mO_n)^{c-}$. In the ionic formulae, "M" is a polyatom; "X" is a heteroatom; "m" is the compositional ratio of the polyatom; and "n" is the compositional ratio of the oxygen atom. As the polyatom (M), examples include, but are not limited to, Mo, W, V, Ti and Nb. As the heteroatom (X), examples include, but are not limited to, Si, P, As, S, Fe and Co. A counter cation such as $Na^+$ or $H^+$ may be contained in a part of the polyoxometalate.

From the viewpoint of excellent heat resistance, preferred is a polyoxometalate containing one or more elements selected from tungsten (W) and molybdenum (Mo).

As the polyoxometalate, examples include, but are not limited to, a tungstate ion $[W_{10}O_{32}]^{4-}$ and a molybdate ion $[Mo_6O_{19}]^{2-}$, which are isopolyoxometalates, and phosphotungstate ions $[PW_{12}O_{40}]^{3-}$ and $[P_2W_{18}O_{62}]^{6-}$, a silicotungstate ion $[SiW_{12}O_{40}]^{4-}$, a phosphomolybdate ion $[PMo_{12}O_{40}]^{3-}$, a silicomolybdate ion $[SiMo_{12}O_{40}]^{4-}$, phosphotungstic molybdate ions $[PW_{12-x}Mo_xO_{40}]^{3-}$ (where x is an integer of from 1 to 11) and $[P_2W_{18-y}Mo_yO_{62}]^{6-}$ (where y is an integer of from 1 to 17) and a silicotungstic molybdate ion $[SiW_{12-x}Mo_xO_{40}]^{4-}$ (where x is an integer of from 1 to 11), which are all heteropolyoxometalates. Of them, from the viewpoint of heat resistance and availability of raw materials, the polyoxometalate containing at least one of tungsten (W) and molybdenum (Mo) is preferably a heteropolyoxometalate, and more preferably a heteropolyoxometalate containing phosphorus (P).

The polyoxometalate is still more preferably one selected from the group consisting of phosphotungstic molybdate ions $[PW_{10}Mo_2O_{40}]^{3-}$ and $[PW_{11}Mo_1O_{40}]^{3-}$ and phosphotungstate ion $[PW_{12}O_{40}]^{3-}$, from the viewpoint of the heat resistance.

The content ratio of the tungsten to the molybdenum is not particularly limited. Particularly from the viewpoint of excellent heat resistance, the molar ratio of the tungsten to the molybdenum is preferably from 100:0 to 85:15, and more preferably from 100:0 to 90:10.

As the divalent or higher anion ($B^{c-}$), the above-mentioned polyoxometalate anions can be used alone or in combination of two or more kinds. In the case of using a combination of two or more kinds of the above-mentioned polyoxometalate anions, the molar ratio of the tungsten to the molybdenum in the whole polyoxometalate anion is preferably in the above range.

In the compound represented by the general formula (I), "b" is the number of molecules of the cation in the molecular association; "d" is the number of molecules of the anion in the molecular association; and each of "b" and "d" is an integer of 1 or more. For a crystal or aggregate of the compound of the present disclosure, each of "b" and "d" is not limited to 1 and can be a natural number of 2 or more, such as a natural number of 2, 3, 4 and so on. From the viewpoint of the heat resistance, it is preferable that at least part of the compound of the present disclosure forms a molecular association where "b"≥2. From the viewpoint of the heat resistance, it is also preferable that at least part of the compound forms a molecular association where "d"≥2.

When "b" is 2 or more, the cations present in the molecular association may be one kind of cations or may be a combination of two or more kinds of cations. When "d" is 2 or more, the anions present in the molecular association may be one kind of anions, may be a combination of two or more kinds of anions, or may be a combination of organic anions and inorganic anions.

It is also preferable that the compound of the present disclosure is normal salt, from the point of view that problems arising from the use of acid salt, such as non-smooth dispersion or dispersion liquid gelation during storage, are prevented, and the compound obtains high dispersibility and high dispersion stability.

The method for producing the compound represented by the general formula (I) is not particularly limited. For example, the compound can be obtained by synthesizing the cation represented by the general formula (A) by a method described below, and then incorporating a desired counter anion thereinto. In the case of synthesizing the cation represented by the general formula (A) by the below-described method, substituent groups as $R^1$ to $R^7$, such as alkyl and aryl groups, may be incorporated in a compound represented by the following general formula (1) and a compound represented by the following general formula (2), or $R^1$ to $R^7$ may be hydrogen atoms in the compounds represented by the following general formulae (1) and (2) and may be substituted by a known method after the cation represented by the general formula (A) is synthesized.

(Synthesis of the Cation Represented by the General Formula (A))

As the method for producing the cation represented by the general formula (A), examples include, but are not limited to, a method for producing the cation by condensation reaction of the compounds represented by the following general formulae (1) and (2), using a chlorinating agent such as phosphorus oxychloride.

General Formula (1)

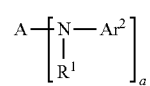

General Formula (2)

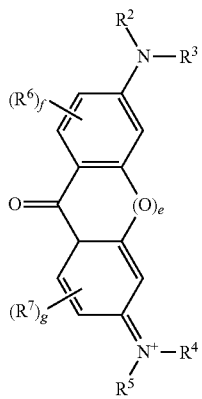

In the general formula (1), "A", $R^1$ and "a" are the same as those of the general formula (A). In the general formula (2), $R^2$, $R^3$, $R^4$, $R^5$, $R^6$, $R^7$, "e", "f" and "g" are the same as those of the general formula (A). $Ar^2$ in the general formula (1) is one in which a hydrogen atom is bound to $Ar^1$ in the general formula (A).

According to the above-mentioned synthesis method, by dehydration-condensation reaction between $Ar^2$ in the general formula (1) and the carbonyl group in the general formula (2), a triarylmethane or xanthene skeleton is formed, and the linking group "A" is introduced at the same time. Therefore, according to this synthesis method, color materials with different polymerization degrees are not formed. Also, an unreacted product, if present, contains a largely different skeleton and can be separated easily; therefore, the cation represented by the general formula (A) can be obtained in high purity and high yield.

The amount of the compound represented by the general formula (2) used in the above reaction, varies depending on the desired valence. "a". For example, when "a" is 2, the amount is preferably from 1.5 molar equivalent to 4.0 molar equivalent, more preferably from 1.5 molar equivalent to 3.0 molar equivalent, and still more preferably from 1.8 molar equivalent to 2.2 molar equivalent, with respect to the compound represented by the general formula (1), from the viewpoint of suppressing the production of a by-product and increasing the reaction yield.

For the reaction, the reaction temperature is not particularly limited. In general, it is from about 110° C. to about 150° C. From the viewpoint of suppressing a side reaction, it is preferably from 110° C. to 120° C. Also for the reaction, the reaction pressure is not particularly limited, and it is preferably from normal pressure to 0.1 MPa, and more preferably normal pressure. The reaction time may vary depending on the synthesis amount, reaction temperature, etc. It is generally in a range of from 1 hour to 10 hours, and preferably in a range of from 1 hour to 5 hours.

The amount of the added chlorinating agent such as phosphorus oxychloride, is not particularly limited. It is generally from 1.5 molar equivalent to 3.0 molar equivalent, and preferably from 1.8 molar equivalent to 3.0 molar equivalent, with respect to the compound represented by the general formula (1), from the viewpoint of increasing the reaction yield.

The compound represented by the general formula (1) may be a commercially-available product, or it can be obtained by synthesis.

The method for synthesizing the compound represented by the general formula (1) is not particularly limited. For example, it can be obtained by reacting, in a solvent, a halogenated aromatic compound containing the desired substituent group $Ar^2$ with an "a"-valent amine compound containing the desired substituent group "A", in the presence of a base and using a catalyst such as palladium acetate.

The compound represented by the general formula (2) may be a commercially-available product, or it can be obtained by synthesis.

The method for synthesizing the compound represented by the general formula (2) is not particularly limited. For example, it can be obtained by reacting, in a solvent, 4,4'-dichlorobenzophenone, 3,6-dichloroxanthone or the like with an amine compound containing a desired substituent group such as a substituent group represented by the general formula (II) or (III), in the presence of a base and using a catalyst such as palladium acetate.

<Other Color Material>

For the purpose of color tone control, as needed, the color material (A) can further contain other color material, to the extent that does not impair the effects of the disclosed embodiments. For example, it can be selected from conventionally-known pigments and dyes, according to the purpose, and such pigments and dyes can be used alone or in combination of two or more kinds.

As the other color material, examples include, but are not limited to, pigments such as C.I. Pigment Violet 1, C.I. Pigment Violet 2, C.I. Pigment Violet 3, C.I. Pigment Violet 19, C.I. Pigment Violet 23, C.I. Pigment Blue 1, C.I. Pigment Blue 15, C.I. Pigment Blue 15:3, C.I. Pigment Blue 15:4, C.I. Pigment Blue 15:6, C.I. Pigment Blue 60, C.I. Pigment Red 81 and C.I. Pigment Red 82; dyes such as Acid Red; and salt-forming (lake) compounds of xanthene dyes.

The content of the other color material is preferably 40 parts by mass or less, and more preferably 20 parts by mass or less, with respect to 100 parts by mass (the total amount) of the color material (A). As long as the content is within the range, color tone control is possible, without impairing the properties of the color material represented by the general formula (I), such as high transmittance, heat resistance and light resistance.

The other color material may be contained in the color material dispersion liquid of the disclosed embodiments, or a color material dispersion liquid containing the other color material may be separately prepared and mixed with the color material dispersion liquid of the disclosed embodiments at the time of preparing the below-described color resin composition.

The average dispersed particle diameter of the color material (A) used in the disclosed embodiments, is not particularly limited, as long as a color layer formed by use of the color material (A) can provide a desired color. From the viewpoint of increasing contrast and obtaining excellent heat resistance, the average dispersed particle diameter is preferably in a range of from 10 nm to 200 nm, and more preferably in a range of from 20 nm to 150 nm. By setting the average dispersed particle diameter of the color material (A) within the range, the liquid crystal display device and light-emitting display device produced by use of the color material dispersion liquid according to the disclosed embodiments, can obtain high contrast and high quality.

The average dispersed particle diameter of the color material (A) in the color material dispersion liquid, is the dispersed particle diameter of the color material particles dispersed in a dispersion medium that contains at least a solvent, and it is measured with a laser scattering particle size distribution analyzer. The average dispersed particle diameter can be measured as follows with a laser scattering particle size distribution analyzer: the color material dispersion liquid is appropriately diluted with a solvent, which is the same type of solvent as the solvent used in the color material dispersion liquid, to a concentration that is measurable with a laser scattering particle size distribution analyzer (e.g., 1,000-fold) and then measured with a laser scattering particle size distribution analyzer (e.g., NANOTRAC PARTICLE SIZE ANALYZER UPA-EX150 manufactured by Nikkiso Co., Ltd.) by a dynamic light scattering method at 23° C. This average dispersed particle diameter is a volume average particle diameter.

In the color material dispersion liquid according to the disclosed embodiments, the content of the color material is not particularly limited. From the viewpoint of dispersibility and dispersion stability, the content of the color material is preferably in a range of from 5% by mass to 40% by mass, and more preferably in a range of from 10% by mass to 20% by mass, with respect to the total amount of the color material dispersion liquid.

Also in the color material dispersion liquid according to the disclosed embodiments, when a mixture of the color material represented by the general formula (I) and the other color material is used as the color material (A), the mixing ratio can be appropriately determined to obtain a desired color tone, and it is not particularly limited. From the viewpoint of heat resistance, the color material represented by the general formula (I) is preferably 50 parts by mass or more, more preferably 70 parts by mass or more, and still more preferably 80 parts by mass or more of the total amount (100 parts by mass) of the color material (A).

(B) Dispersant

In the color material dispersion liquid according to the disclosed embodiments, the dispersant is used to disperse at least the color material represented by the general formula (I) in the solvent. The dispersant can be appropriately selected from those that are conventionally used as dispersants. As the dispersant, examples include, but are not limited to, surfactants such as cationic, anionic, nonionic, amphoteric, silicone-based and fluorine-based surfactants. Of surfactants, a polymer surfactant (a polymer dispersant) is preferred from the point of view that it can homogeneously and finely disperse the color material. These dispersants can be used alone or in combination of two or more kinds.

As the polymer dispersant, examples include, but are not limited to, (co)polymers of unsaturated carboxylic acid esters such as polyacrylic acid ester; (partial) amine salts, (partial) ammonium salts and (partial) alkylamine salts of (co)polymers of unsaturated carboxylic acids such as polyacrylic acid; (co)polymers of hydroxyl group-containing unsaturated carboxylic acid esters such as hydroxyl group-containing polyacrylic acid ester, and modified products thereof; polyurethanes; unsaturated polyamides; polysiloxanes; long-chain polyaminoamide phosphates; polyethyleneimine derivatives (amide and salts thereof, obtained by reaction of poly(lower alkyleneimine) and polyester containing a free carboxyl group); and polyallylamine derivatives (reaction products obtained by reaction of polyallylamine and one or more compounds selected from the group consisting of the following three kinds of compounds: polyester containing a free carboxyl group, polyamide, and a co-condensate of ester and amide (polyester amide)).

Commercially-available products of such dispersants include DISPERBYK-2000, 2001, BYK-LPN 6919 and 21116 (product names, manufactured by BYK Japan KK) and AJISPER PB821 and AJISPER 881 (product names, manufactured by Ajinomoto Co., Inc.), for example. Of them, BYK-LPN 6919 and 21116 are preferred from the viewpoint of heat resistance, electric reliability and dispersibility.

From the point of view that the color material can be appropriately dispersed and excellent dispersion stability can be achieved, the polymer dispersant is preferably one or more kinds selected from the group consisting of a polymer containing at least a constitutional unit represented by the following general formula (V) and urethane-based dispersants composed of compounds containing one or more urethane bonds (—NH—COO—) per molecule.

The polymer dispersant preferably contains a polymer containing at least one selected from a constitutional unit represented by the following general formula (VI) and a constitutional unit represented by the following general formula (VI'), from the point of view that the dispersibility and heat resistance of the color material represented by the general formula (I) can be increased, and a coating film with higher luminance and excellent alkali resistance can be formed. Due to containing the specific bulky structure, the color material represented by the general formula (I) has a tendency to obtain a large molecular weight and poor re-solubility in solvents. However, if the color material is used in combination with the polymer containing at least one selected from the constitutional unit represented by the following general formula (VI) and the constitutional unit represented by the following general formula (VI'), since the polarity of the adsorption group in the polymer dispersant differs from other basic dispersants, the solubility of the dispersed substance in solvents is changed. Therefore, the color material obtains excellent re-solubility in solvents.

Hereinafter, the preferred dispersant will be described in detail.

<Polymer Containing at Least a Constitutional Unit Represented by the Following General Formula (V)>

In the disclosed embodiments, a polymer containing at least a constitutional unit represented by the following general formula (V) can be preferably used as the dispersant:

General Formula (V)

where $R^{31}$ is a hydrogen atom or a methyl group; "L" is a direct bond or a divalent linking group; "Q" is a group represented by the following general formula (V-a) or a nitrogen-containing heterocyclic group which can form a salt and which optionally contains a substituent group:

Gneral Formula (V-a)

where each of $R^{32}$ and $R^{33}$ is independently a hydrogen atom or a hydrocarbon group which optionally contains a heteroatom, and $R^{32}$ and $R^{33}$ can be the same as or different from each other.

In the general formula (V), "L" is a direct bond or a divalent linking group. The direct bond means that "Q" directly binds to a carbon atom in the general formula (V), not through a linking group.

As the divalent linking group as "L", examples include, but are not limited to, an alkylene group containing 1 to 10 carbon atoms, an arylene group, a —CONH— group, a —COO— group, an ether group containing 1 to 10 carbon atoms (—R'—OR"— where each of R' and R" is independently an alkylene group) and combinations thereof.

From the viewpoint of dispersibility, "L" in the general formula (V) is preferably a direct bond or a divalent linking group containing a —CONH— group or a —COO— group.

The above dispersants can be particularly preferably used by allowing the constitutional unit represented by the general formula (V) of the dispersants to form a salt by the below-described salt forming agent, at a desired ratio.

As the polymer containing the constitutional unit represented by the general formula (V), block and graft copolymers containing structures disclosed in International Publication No. WO2011/108495 and JP-A Nos. 2013-054200, 2010-237608 and 2011-75661 are particularly preferred, from the point of view that the dispersibility and dispersion stability of the color material and the heat resistance of the resin composition can be increased, and a high-luminance and high-contrast color layer can be formed.

Commercially-available products of the polymers containing the constitutional unit represented by the general formula (V) include BYK-LPN 6919.

<<<Salt Forming Agent>>>

In the disclosed embodiments, the dispersant is preferably a polymer in which at least a part of a nitrogen site of the constitutional unit represented by the general formula (V) forms a salt (hereinafter, this state may be referred to as "salt-modified").

In the disclosed embodiments, by allowing the nitrogen site of the constitutional unit represented by the general formula (V) to form a salt using the salt forming agent, the dispersant strongly adsorbs to the color material similarly forming a salt, so that the dispersibility and dispersion stability of the color material are increased. As the salt forming agent, acidic organophosphorus compounds, organic sulfonic acid compounds and quaternizing agents, which are disclosed in International Publication No. WO2011/108495 and JP-A No. 2013-054200, can be preferably used. Especially when the salt forming agent is an acidic organophosphorus compound, salt-forming moieties containing the acidic organophosphorus compound of the dispersant are localized on the surface of the color material particles, and thus the color material surface reaches a state of being covered with phosphate. Therefore, attacks on the dye skeleton of the color material by active oxygen (hydrogen abstraction) are suppressed, so that the heat resistance and light resistance of the color material containing the dye skeleton are increased. For this reason, color deterioration by high-temperature heating can be further suppressed by the use of the polymer salt-modified by the acidic organophosphorus compound as the dispersant, while the color material with high transmittance used in the disclosed embodiments is in a state of being sufficiently dispersed. Therefore, a color layer which shows higher luminance even after it undergoes the high-temperature heating of the color filter production step, can be formed.

<Urethane-Based Dispersant>

The urethane-based dispersant that is preferably used as the dispersant, is a dispersant composed of a compound containing one or more urethane bonds (—NH—COO—) per molecule.

Excellent dispersion is possible by the use of a small amount of the urethane-based dispersant. By making the amount of the dispersant small, the amount of a cure component, etc., can be relatively large. As a result, a color layer with excellent heat resistance can be formed.

In the disclosed embodiments, the urethane-based dispersant is preferably a reaction product of (1) polyisocyanates containing two or more isocyanate groups per molecule and (2) one or more kinds selected from polyesters containing a hydroxyl group at a single terminal or both terminals thereof and poly(meth) acrylates containing a hydroxyl group at a single terminal or both terminals thereof. The urethane-based dispersant is more preferably a reaction product of (1) polyisocyanates containing two or more isocyanate groups per molecule, (2) one or more kinds selected from polyesters containing a hydroxyl group at a single terminal or both terminals thereof and poly(meth) acrylates containing a hydroxyl group at a single terminal or both terminals thereof, and (3) a compound containing an active hydrogen and a basic or acidic group per molecule.

Commercially-available, urethane-based dispersants include DISPERBYK-161, 162, 163, 164, 166, 167, 168, 170, 171, 174, 182, 183, 184 and 185, and BYK-9077 (product names, manufactured by BYK Japan KK), AJISPER PB711 (product name, manufactured by Ajinomoto Co., Inc.) and EFKA-46, 47 and 48 (product names, manufactured by EFKA CHEMICALS). Of them, DISPERBYK-161, 162, 166, 170 and 174 are preferred from the viewpoint of heat resistance, electric reliability and dispersibility.

<Polymer containing at least one selected from a constitutional unit represented by the following general formula (VI) and a constitutional unit represented by the following general formula (VI')>

In the disclosed embodiments, as the dispersant, the polymer containing at least one selected from a constitutional unit represented by the following general formula (VI) and a constitutional unit represented by the following general formula (VI'), can be preferably used. As the polymer, a graft copolymer containing a constitutional unit represented by the following general formula (VII) and at least one selected from a constitutional unit represented by the following general formula (VI) and a constitutional unit represented by the following general formula (VI'), or a block copolymer containing a block moiety that contains a constitutional unit represented by the following general formula (VIII) and a block moiety that contains at least one selected from a constitutional unit represented by the following general formula (VI) and a constitutional unit represented by the following general formula (VI'), can be particularly preferably used.

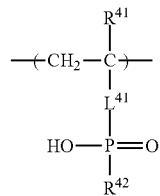

(VI)

-continued

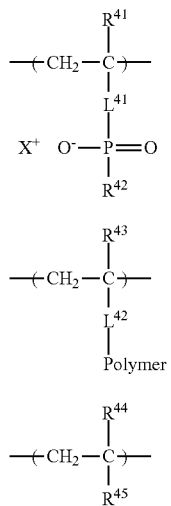

(VI')

(VII)

(VIII)

where $L^{41}$ is a direct bond or a divalent linking group; $R^{41}$ is a hydrogen atom or a methyl group; $R^{42}$ is a hydrocarbon group or a monovalent group represented by —[CH($R^{46}$)—CH($R^{47}$)—O]$_{x1}$—$R^{48}$ or —[(CH$_2$)$_{y1}$—O]$_{z1}$—$R^{48}$; each of $R^{46}$ and $R^{47}$ is independently a hydrogen atom or a methyl group; $R^{48}$ is a hydrogen atom, a hydrocarbon group, or a monovalent group represented by —CHO, —CH$_2$CHO, —CO—CH=CH$_2$, —CO—C(CH$_3$)=CH$_2$, or —CH$_2$COOR$^{49}$; $R^{49}$ is a hydrogen atom or an alkyl group having 1 to 5 carbon atoms; the hydrocarbon group optionally contains a substituent group; x1 is an integer of from 1 to 18; y1 is an integer of from 1 to 5; and z1 is an integer of from 1 to 18;

where $X^+$ is an organic cation;

where $L^{42}$ is a direct bond or a divalent linking group; $R^{43}$ is a hydrogen atom or a methyl group; and "Polymer" is a polymer chain containing one or more selected from a constitutional unit represented by the following general formula (IX) and a constitutional unit represented by the following general formula (X); and where $R^{44}$ is a hydrogen atom or a methyl group; $R^{45}$ is a hydrocarbon group or a monovalent group represented by —[CH($R^{50}$)—CH($R^{51}$)—O]$_{x2}$—$R^{52}$, —[(CH$_2$)$_{y2}$—O]$_{z2}$—$R^{52}$, —[CO—(CH$_2$)$_{y2}$—O]$_{z2}$—$R^{52}$, —CO—O—$R^{52'}$ or —O—CO—$R^{52''}$; each of $R^{50}$ and $R^{51}$ is independently a hydrogen atom or a methyl group; $R^{52}$ is a hydrogen atom, a hydrocarbon group, or a monovalent group represented by —CHO, —CH$_2$CHO or —CH$_2$COOR$^{53}$; $R^{52'}$ is a hydrocarbon group or a monovalent group represented by —[CH($R^{50}$)—CH($R^{51}$)—O]$_{x2'}$—$R^{52}$, [(CH$_2$)$_{y2'}$—O]$_{z2'}$—$R^{52}$, or —[CO—(CH$_2$)$_{y2'}$—O]$_{z2'}$—$R^{52}$; $R^{52''}$ is an alkyl group having 1 to 18 carbon atoms; $R^{53}$ is a hydrogen atom or an alkyl group having 1 to 5 carbon atoms; the hydrocarbon group optionally contains a substituent group; each of x2 and x2' is independently an integer of from 1 to 18; each of y2 and y2' is independently an integer of from 1 to 5; and each of z2 and z2' is an integer of from 1 to 18:

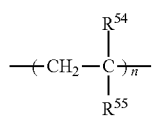

(IX)

(X)

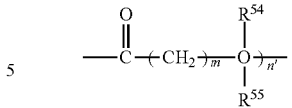

where $R^{54}$ is a hydrogen atom or a methyl group; $R^{55}$ is a hydrocarbon group or a monovalent group represented by —[CH($R^{56}$)—CH($R^{57}$)—O]$_{x3}$—$R^{58}$, —[(CH$_2$)$_{y3}$—O]$_{z3}$—$R^{58}$, —[CO—(CH$_2$)$_{y3}$—O]$_{z3}$—$R^{58}$, —CO—O—$R^{59}$, or —O—CO—$R^{60}$; each of $R^{56}$ and $R^{57}$ is a hydrogen atom or a methyl group; $R^{58}$ is a hydrogen atom, a hydrocarbon group, or a monovalent group represented by —CHO, —CH$_2$CHO or —CH$_2$COOR$^{61}$; $R^{59}$ is a hydrocarbon group or a monovalent group represented by —[CH($R^{56}$)—CH($R^{57}$)—O]$_{x4}$—$R^{58}$, —[(CH$_2$)$_{y4}$—O]$_{z4}$—$R^{58}$ or —[CO—(CH$_2$)$_{y4}$—O]$_{z4}$—$R^{58}$; $R^{60}$ is an alkyl group having 1 to 18 carbon atoms; $R^{61}$ is a hydrogen atom or an alkyl group having 1 to 5 carbon atoms; the hydrocarbon group optionally contains a substituent group; "m" is an integer of from 1 to 5; "n" and "n'" are each an integer of from 5 to 200; each of x3 and x4 is independently an integer of from 1 to 18; each of y3 and y4 is independently an integer of from 1 to 5; and each of z3 and z4 is independently an integer of from 1 to 18.

$L^{41}$ and $L^{42}$ in the general formulae (VI), (VI') and (VII) may be the same as L in the general formula (V).

As the hydrocarbon group in the general formulae (VI), (VI'), (VIII) and (IX), examples include, but are not limited to, an alkyl group having 1 to 18 carbon atoms, an alkenyl group having 2 to 18 carbon atoms, an aralkyl group and an aryl group.

The organic cation in the general formula (VI') is an organic cation in which the cationic moiety includes a carbon atom. As the organic cation, examples include, but are not limited to, nitrogen-containing protonated organic cations such as imidazolium cation, pyridinium cation and ammonium cation, sulfonium cations such as trialkylsulfonium cation, and phosphonium cations such as tetraalkylphosphonium cation.

As the polymer containing at least one selected from the constitutional unit represented by the general formula (VI) and the constitutional unit represented by the general formula (VI'), a block copolymer and a graft copolymer containing the structure described in WO2015/083426 are particularly preferably used, from the viewpoint of the above-described effects.

As the polymer containing at least one selected from the constitutional unit represented by the general formula (VI) and the constitutional unit represented by the general formula (VI'), a polymer which is a reaction product of a polymer containing at least one of an epoxy group and a cyclic ether group in a side chain with an acidic phosphorus compound and in which at least part of acidic phosphorus compound groups may be salt-forming groups, are preferably used from the viewpoint of the above-described effects.

These dispersants can be used alone or in combination of two or more kinds.

In the color material dispersion liquid according to the disclosed embodiments, from the viewpoint of dispersibility, dispersion stability and film properties, generally, the content of the dispersant is preferably in a range of from 1% by mass to 50% by mass, and more preferably in a range of from 1% by mass to 20% by mass, with respect to the total amount of the color material dispersion liquid.

(C) Solvent

In the disclosed embodiments, the solvent can be appropriately selected from solvents which are unreactive with the components of the color material dispersion liquid and the components of the below-described color resin composition and which can dissolve or disperse them. As the solvent, examples include, but are not limited to, organic solvents such as alcohol-based solvents, ether alcohol-based solvents, ester-based solvents, ketone-based solvents, ether alcohol acetate-based solvents, ether-based solvents, aprotic amide-based solvents, lactone-based solvents, unsaturated hydrocarbon-based solvents and saturated hydrocarbon-based solvents. Of them, ester-based solvents are preferred from the viewpoint of solubility upon dispersion and coating properties.

Preferred ester-based solvents include methyl methoxypropionate, ethyl ethoxypropionate, methoxy ethyl acetate, propylene glycol monomethyl ether acetate, 3-methoxy-3-methyl-1-butyl acetate, 3-methoxybutyl acetate, methoxybutyl acetate, ethoxy ethyl acetate, ethyl cellosolve acetate, dipropylene glycol methyl ether acetate, propylene glycol diacetate, 1,3-butylene glycol diacetate, cyclohexanol acetate, 1,6-hexanediol diacetate, diethylene glycol monoethyl ether acetate, and diethylene glycol monobutyl ether acetate, for example.

Of them, propylene glycol monomethyl ether acetate (PGMEA) is preferred from the point of view that it has a low risk to the human body and has fast heat-drying properties although it has low volatility at around room temperature. In this case, there is such an advantage that a special washing step is not needed when switching from a color resin composition comprising conventional PGMEA.

These solvents can be used alone or in combination of two or more kinds.

The color material dispersion liquid according to the disclosed embodiments, is prepared by the use of the above-described solvent generally in an amount of from 60% by mass to 85% by mass, with respect to the total amount of the color material dispersion liquid containing the solvent. As the solvent amount decreases, the viscosity increases and the dispersibility decreases. As the solvent amount increases, the color material concentration decreases and may result in a difficulty in achieving a target chromaticity coordinate after preparation of the resin composition.

(Other Components)

As needed, the color material dispersion liquid according to the disclosed embodiments can further contain a color material other than the color material represented by the general formula (I), a dispersion assisting resin and other components.

The other color material can be added as needed, for the purpose of color tone control. It can be selected from conventionally-known color materials, according to the purpose, and such color materials can be used alone or in combination of two or more kinds. The other color material and its content are not particularly limited and can be the same as the case of the below-described color resin composition, as long as the effects of the disclosed embodiments are not impaired.

As the dispersion assisting resin, examples include, but are not limited to, an alkali soluble resin that will be mentioned below under "Color resin composition". The particles of the color material becomes less likely to contact with each other due to steric hindrance by the alkali soluble resin, resulting in stabilization of particle dispersion, and the particle dispersion stabilization effect may be effective in reducing the dispersant.

As the other components, examples include, but are not limited to, a surfactant, which is used to increase wettability, a silane coupling agent, which is used to increase adhesion properties, a defoaming agent, a cissing inhibitor, an antioxidant, an aggregation inhibitor and an ultraviolet absorber.

(Method for Producing the Color Material Dispersion Liquid)

The color material dispersion liquid according to the disclosed embodiments can be prepared by the following method: the dispersant is mixed with the solvent, and the mixture is stirred to produce a dispersant solution; the dispersant solution is mixed with the color material and, as needed, other compound; and the mixture is dispersed with a disperser, thereby preparing the color material dispersion liquid according to the disclosed embodiments. Also, the color material dispersion liquid according to the disclosed embodiments can be prepared as follows: the color material and the dispersant are mixed with the solvent and dispersed with a known disperser, thereby preparing the color material dispersion liquid according to the disclosed embodiments.

As the disperser used for the dispersion treatment, examples include, but are not limited to, roller mills such as a two-roller mill and a three-roller mill; ball mills such as a vibrating ball mill; paint conditioners; and bead mills such as a continuous disk type bead mill and a continuous annular type bead mill. In the case of using a bead mill, as the dispersion condition, the diameter of the beads used is preferably from 0.03 mm to 2.00 mm, and more preferably from 0.05 mm to 1.00 mm.

In particular, a preparatory dispersion is carried out with 2.00 mm zirconia beads, which is a relatively large bead diameter, and then a main dispersion is further carried out with 0.10 mm zirconia beads, which is a relatively small bead diameter. It is preferable to carry out filtration with a 0.10 μm to 2.00 μm membrane filter after the dispersion treatment.

The color material dispersion liquid according to the disclosed embodiments is preferably used as a preliminarily prepared product for preparing the below-described color resin composition. That is, the color material dispersion liquid is such a color material dispersion liquid, that it is preliminarily prepared at a stage prior to preparing the below-described color resin composition and the ratio of "the mass of the color material component in the composition"/"the mass of the solid content other than the color material component in the composition" is high. In particular, this ratio ("the mass of the color material component in the composition"/"the mass of the solid content other than the color material component in the composition" ratio) is generally 0.5 or more, and more preferably 1.0 or more. By mixing the color material dispersion liquid with at least a binder component, a color resin composition with excellent dispersibility can be prepared.

The color material dispersion liquid according to the disclosed embodiments is preferably used for color filter applications. Of them, the color material dispersion liquid is preferably used for blue pixel applications for color filters. Of them, the color material dispersion liquid is preferably used for color filter applications for high color gamut displays.

2. Color Resin Composition

The color resin composition according to the disclosed embodiments is a color resin composition comprising (A) a color material, (B) a dispersant, (C) a solvent and (D) a binder component, wherein the color material (A) contains a compound which is represented by the general formula (I) and which contains one or more structures selected from the structures (i) and (ii).

According to the disclosed embodiments, a color layer configured to suppress color change during high-temperature heating, can be formed.

The color resin composition according to the disclosed embodiments contains at least the color material (A), the dispersant (B), the solvent (C) and the binder component (D). As needed, it can contain other components, to the extent that does not impair the effects of the disclosed embodiments.

Hereinafter, the components of the color resin composition according to the disclosed embodiments, will be described in detail.

Some of the components are those that can be contained in the color material dispersion liquid of the disclosed embodiments, and they will not be described below, since they can be the same components as those described above under "1. Color material dispersion liquid".

(D) Binder Component

To provide film-forming properties and surface adhesion properties, the color resin composition contains a binder component. Especially, to provide sufficient hardness to coating films, the color resin composition preferably contains a curable binder component. The curable binder component is not particularly limited, and conventionally-known curable binder components that are used to form the color layers of color filters, can be appropriately used.

As the curable binder component, examples include, but are not limited to, one containing a photocurable binder component that contains a photocurable resin, which is polymerizable and curable by visible light, ultraviolet, electron beam radiation, etc., and one containing a thermosetting binder component that contains a thermosetting resin, which is polymerizable and curable by heating.

Developability is not required of the curable binder component, when color layers can be formed by attaching the color resin composition selectively in a pattern onto a substrate (e.g., the ink-jet method). In this case, a known thermosetting or photosensitive binder component that is used to form color layers by the ink-jet method, etc., can be appropriately used.

As the thermosetting binder, a combination of a compound containing two or more thermosetting functional groups per molecule and a curing agent is generally used. In addition, a catalyst that can promote a thermosetting reaction can be added. As the thermosetting functional groups, examples include, but are not limited to, an epoxy group, an oxetanyl group, an isocyanate group and an ethylenically unsaturated bond. As the thermosetting functional groups, epoxy groups are preferably used. As the thermosetting binder component, examples include, but are not limited to, those mentioned in International Publication No. WO2012/144521.

On the other hand, in the case of using a photolithography process to form color layers, a photosensitive binder component with alkali developability is suitably used.

Hereinafter, photosensitive binder components will be explained. However, the curable binder component used in the disclosed embodiments is not limited to them. Besides the below-described photosensitive binder components, a thermosetting binder component that is polymerizable and curable by heating, such as epoxy resin, can be further used.

As the photosensitive binder components, examples include, but are not limited to, a positive photosensitive binder component and a negative photosensitive binder component. As the positive photosensitive binder component, examples include, but are not limited to, those containing an alkali soluble resin and an o-quinonediazide group-containing compound, which is a photosensitivity-imparting component.

On the other hand, as the negative photosensitive binder component, those containing at least an alkali soluble resin, a polyfunctional monomer and a photoinitiator, are suitably used.

In the color resin composition according to the disclosed embodiments, the negative photosensitive binder component is preferred, from the point of view that a pattern can be easily formed by a photolithography method, using existing processes.

Hereinafter, the alkali soluble resin, the polyfunctional monomer and the photoinitiator, which constitute the negative photosensitive binder component, will be explained in detail.

<Alkali Soluble Resin>

In the disclosed embodiments, the alkali soluble resin can be appropriately selected, as long as it contains an acidic group, functions as a binder resin, and is soluble in developers used for pattern formation, particularly preferably in an alkaline developer.

In the disclosed embodiments, the alkali soluble resin is preferably a resin containing a carboxyl group as the acidic group. As the resin, examples include, but are not limited to, acrylic copolymers containing a carboxyl group and epoxy (meth)acrylate resins containing a carboxyl group. Of them, particularly preferred is one containing a carboxyl group and, moreover, a photopolymerizable functional group such as an ethylenically unsaturated group in a side chain thereof. This is because the hardness of the cured film thus formed is increased by containing the photopolymerizable functional group. These acrylic copolymers and epoxy (meth) acrylate resins can be used in combination of two or more kinds.

An acrylic copolymer containing a carboxyl group is obtained by copolymerizing a carboxyl group-containing ethylenically unsaturated monomer and an ethylenically unsaturated monomer.

The acrylic copolymer containing a carboxyl group can further contain a constitutional unit containing an aromatic carbon ring. The aromatic carbon ring functions as a component that imparts coatability to the color resin composition.

The acrylic copolymer containing a carboxyl group can further contain a constitutional unit containing an ester group. The constitutional unit containing an ester group not only functions as a component that suppresses the alkali solubility of the color resin composition, but also functions as a component that increases the solubility and re-solubility in solvents.

As the acrylic copolymer containing a carboxyl group, examples include, but are not limited to, those described in International Publication No. WO2012/144521. In particular, examples include, but are not limited to, copolymers obtained from a monomer containing no carboxyl group, such as methyl (meth)acrylate and ethyl (meth)acrylate, with one or more selected from (meth)acrylic acid and anhydrides thereof. Also, examples include, but are not limited to, polymers obtained by introducing an ethylenically unsaturated bond in the above copolymers by, for example, addition of an ethylenically unsaturated compound containing a reactive functional group such as a glycidyl group or hydroxyl group. In the disclosed embodiments, however, the acrylic copolymer containing a carboxyl group is not limited to these examples.

Of these examples, the polymers obtained by introducing an ethylenically unsaturated bond in the above copolymers by, for example, addition of an ethylenically unsaturated compound containing a glycidyl group or hydroxyl group, are particularly preferred from the point of view that polymerization with the below-described polyfunctional monomer is possible upon exposure, and more stable color filters can be obtained.

The copolymerization ratio of the carboxyl group-containing ethylenically unsaturated monomer in the carboxyl group-containing copolymer, is generally from 5% by mass to 50% by mass, and preferably from 10% by mass to 40% by mass. When the copolymerization ratio of the carboxyl group-containing ethylenically unsaturated monomer is less than 5% by mass, the solubility of the coating film thus obtained in alkaline developers may be decreased, resulting in a difficulty, with pattern formation. When the copolymerization ratio exceeds 50% by mass, upon development with an alkaline developer, a pattern thus formed is likely to come off of the substrate, or the pattern surface is likely to be roughened.

The mass average molecular weight of the carboxyl group-containing copolymer is preferably in a range of from 1,000 to 500,000, and more preferably in a range of from 3,000 to 200,000. When the mass average molecular weight is less than 1,000, there may be a remarkable decrease in binder function after curing. When the mass average molecular weight exceeds 500,000, upon development with an alkaline developer, pattern formation may be difficult. The mass average molecular weight is obtained by gel permeation chromatography (GPC) as a standard polystyrene equivalent.

The epoxy (meth)acrylate resin containing a carboxyl group is not particularly limited. As the resin, an epoxy (meth)acrylate compound obtained by reaction of an acid anhydride with a reaction product of an epoxy compound and an unsaturated group-containing monocarboxylic acid, is suitable.

The epoxy compound, the unsaturated group-containing monocarboxylic acid and the acid anhydride can be appropriately selected from known ones. As the epoxy compound, the unsaturated group-containing monocarboxylic acid and the acid anhydride, examples include, but are not limited to, those described in International Publication No. WO2012/144521. As each of the epoxy compound, the unsaturated group-containing monocarboxylic acid and the acid anhydride, those mentioned above can be used alone or in combination of two or more kinds.

The alkali soluble resin used in the color resin composition can be one kind of alkali soluble resin or a combination of two or more kinds of alkali soluble resins. The content of the alkali soluble resin is generally in a range of from 10 parts by mass to 1,000 parts by mass, and preferably in a range of from 20 parts by mass to 500 parts by mass, with respect to 100 parts by mass of the color material contained in the color resin composition. When the content of the alkali soluble resin is too small, sufficient alkali developability may not be obtained. When the content is too large, the ratio of the color material is relatively small, so that sufficient color density may not be obtained.

<Polyfunctional Monomer>

The polyfunctional monomer used in the color resin composition is not particularly limited, as long as it is polymerizable with the below-described photoinitiator. As the polyfunctional monomer, a compound containing two or more ethylenically unsaturated double bonds is generally used. The polyfunctional monomer is preferably a polyfunctional (meth)acrylate containing two or more acryloyl or methacryloyl groups.

Such a polyfunctional (meth)acrylate can be appropriately selected from conventionally known ones. As the polyfunctional (meth)acrylate, examples include, but are not limited to, those mentioned in International Publication No. WO2012/144521. From the viewpoint of solvent resistance, the polyfunctional monomer is preferably a polyfunctional (meth)acrylate not containing an acidic group.

These polyfunctional (meth)acrylates can be used alone or in combination of two or more kinds. When excellent photocurability (high sensitivity) is required of the color resin composition, the polyfunctional monomer is preferably one containing three (trifunctional) or more polymerizable double bonds, and preferably poly(meth) acrylates of trivalent or higher polyalcohols and dicarboxylic acid-modified products thereof. More specifically, preferred are trimethylolpropane tri(meth)acrylate, pentaerythritol tri(meth)acrylate, succinic acid-modified products of pentaerythritol tri (meth)acrylate, pentaerythritol tetra(meth)acrylate, dipentaerythritol tetra(meth)acrylate, dipentaerythritol penta (meth)acrylate, succinic acid-modified products of dipentaerythritol penta(meth)acrylate, dipentaerythritol hexa(meth)acrylate, tris(2-(meth)acryloyloxyethyl)phosphate and tris(2-(meth)acryloyloxypropyl)phosphate, for example.

The polyfunctional monomer used in the color resin composition preferably contains a phosphorus atom-containing polyfunctional monomer, from the point of view that a change in the chromaticity of the color material represented by the general formula (I) after high-temperature heating, is more suppressed, and a coating film with increased luminance and increased solvent resistance is obtained.

In the disclosed embodiments, the phosphorus atom-containing polyfunctional monomer may be a compound which contains a phosphorus atom and in which two or more polymerizable functional groups are contained per molecule.

As the polymerizable functional groups contained in the phosphorus atom-containing polyfunctional monomer, examples include, but are not limited to, a (meth)acryloyl group, a (meth)acrylamide group, a vinyl group and an allyl group. In the disclosed embodiments, the (meth)acrylamide group is a group represented by the following general formula: $CH_2=CRCONR'—$ (where R is a hydrogen atom or a methyl group, and R' is a hydrogen atom or an alkyl group). The R is preferably a hydrogen atom, from the viewpoint of having high sensitivity in photo-radical polymerization and increasing the heat resistance and solvent resistance of the color layer. The R' is preferably a hydrogen atom, from the point of view that hydrogen bonds are formed to reinforce cross-linking, thereby increasing the heat resistance and solvent resistance of the color layer.

As the polymerizable functional groups, at least one of a (meth)acryloyl group and a (meth)acrylamide group is preferred, from the viewpoint of having high sensitivity in photo-radical polymerization, increasing the heat resistance and solvent resistance of the color layer, and increasing pattern adhesion in alkali development. From the viewpoint of solubility in solvents, it is preferable that at least a (meth)acryloyl group is contained.

As the phosphorus atom-containing polyfunctional monomer, a phosphorus atom-containing polyfunctional monomer not containing an acidic group, is preferably contained from the viewpoint of increasing solvent resistance. When the phosphorus atom-containing polyfunctional monomer does not contain an acidic group, lower affinity for high polar solvent (e.g., NMP) is obtained. Therefore, it is estimated that solvent penetration can be further suppressed.

As the phosphorus atom-containing polyfunctional monomer, a phosphorus atom-containing polyfunctional monomer containing at least one selected from the following structures (i) to (iii), is also preferred: (i) a structure containing a polyphosphate ester structure in which two or more phosphorus atoms are bound by a —O— bond, (ii) a structure containing a phosphorus atom and a (meth)acrylamide group, and (iii) a structure containing a phosphorus atom and an isocyanurate group. In the case of containing the polyphosphate ester structure in which two or more phosphorus atoms are bound by a —O— bond, the content ratio of the phosphorus atoms increases, and the specific gravity of the polyfunctional monomer is increased, thereby densely cross-linking the polyfunctional monomer, or the number of the polymerizable functional groups can be increased, thereby densely cross-linking the polyfunctional monomer. Therefore, it is estimated that solvent penetration can be further suppressed by the high-density crosslinking reaction. In the case of containing a (meth)acrylamide group, hydrogen bonds are formed in the NH moiety to reinforce cross-linking. Therefore, it is estimated that solvent penetration can be further suppressed. In the case of containing an isocyanurate group, the molecules of the polyfunctional monomer become rigid molecules; moreover, due to the influence of the hydrophobicity of the isocyanurate group, the solubility of the polyfunctional monomer in solvents (e.g., NMP) decreases. Therefore, it is estimated that solvent penetration can be further suppressed.

As the preferred phosphorus atom-containing polyfunctional monomer, examples include, but are not limited to, the phosphorus atom-containing polyfunctional monomers described in International Publication No. WO2017/022790.

When the color resin composition contains the phosphorus atom-containing polyfunctional monomer, the above-described effects are exerted. However, the color layer thus formed may have a tendency to have poor adhesion to the substrate. Meanwhile, in the case of containing the phosphorus atom-containing polyfunctional monomer in combination with the polymer containing at least one selected from the constitutional unit represented by the general formula (VI) and the constitutional unit represented by the general formula (VI'), the phosphoric acid group is introduced in the color resin composition, and the adhesion between the color layer and a substrate is increased. Therefore, a decrease in adhesion to the substrate can be suppressed.

For the polyfunctional monomer used in the color resin composition of the disclosed embodiments, the total content ratio of the phosphorus atom-containing polyfunctional monomer is preferably from 20% by mass to 70% by mass of the total amount of the polyfunctional monomer, and more preferably from 30% by mass to 60% by mass.

The content of the polyfunctional monomer used in the color resin composition is not particularly limited. It is generally in a range of from about 5 parts by mass to about 500 parts by mass, and preferably in a range of from 20 parts by mass to 300 parts by mass, with respect to 100 parts by mass of the alkali soluble resin. When the content of the polyfunctional monomer is smaller than the range, photocuring may not proceed sufficiently and the color resin composition exposed to light may be dissolved. When the content of the polyfunctional monomer is larger than the range, there may be a decrease in alkali developability.

<Photoinitiator>

The photoinitiator used in the color resin composition is not particularly limited. As the photoinitiator, various kinds of conventionally-known photoinitiators can be used alone or in combination of two or more kinds. As the photoinitiator, examples include, but are not limited to, those mentioned in International Publication No. WO2012/144521.

The content of the photoinitiator used in the color resin composition is generally from about 0.01 part by mass to about 100 parts by mass, and preferably from 5 parts by mass to 60 parts by mass, with respect to 100 parts by mass of the polyfunctional monomer. When the content is smaller than the range, sufficient polymerization reaction may not be caused, so that the hardness of the color layer may not be sufficient. When the content is larger than the range, the content of the color material and so on in the solid content of the color resin composition is relatively small, so that sufficient color density may not be obtained.

(Optionally-Added Components)

As needed, the color resin composition of the disclosed embodiments can further contain other color material or various kinds of additives.

(Other Color Material)

Other color material is added as needed, for the purpose of color tone control. The color material contained in the color resin composition of the disclosed embodiments contains the color material represented by the general formula (I) as an essential component. For color tone control, the color material represented by the general formula (I) may be used in combination with other color material.

The other color material is not particularly limited, as long as a thus-formed color layer of a color filter can form a desired color. As the other color material, various kinds of organic pigments, inorganic pigments and dispersible dyes may be used alone or in combination of two or more kinds. Of them, organic pigments are preferred due to their high color-forming properties and high heat resistance. For example, organic pigments include, but are not limited to, compounds classified into pigments in the Color Index (C.I.) published by the Society of Dyers and Colourists, and compounds with color index numbers (C.I. numbers). More specifically, examples include those provided above as the examples of the other color material under "1. Color material dispersion liquid".

A dispersible dye obtained by making a dye insoluble in solvents by introducing various kinds of substituent groups in the dye or by a conventionally-known laking (salt-forming) method, or a dispersible dye obtained by using a dye in combination with a solvent of low solubility, can be used. By using such a dispersible dye in combination with the above-described dispersant, the dispersibility and dispersion stability of the dye can be increased.

The dispersible dye can be appropriately selected from conventionally-known dyes. As the dye, examples include, but are not limited to, azo dye, metal complex salt azo dye, anthraquinone dye, triphenylmethane dye, xanthene dye, cyanine dye, naphthoquinone dye, quinonimine dye, methine dye and phthalocyanine dye.

The amount of the color material used is not particularly limited, as long as it is in a range that does not impair the effects of the present disclosure. For the amount of the color material used, for example, the mass ratio of the color material represented by the general formula (I) to the other color material is preferably from 100:0 to 40:60, and more preferably from 95:5 to 60:40. This is because, as long as the mass ratio is in the range, color tone control is possible without impairing the high transmittance property of the color material represented by the general formula (I).
(Additives)

As the additives, examples include, but are not limited to, a polymerization inhibitor, a chain transfer agent, a leveling agent, a plasticizer, a surfactant, a defoaming agent, a silane coupling agent, an ultraviolet absorber and an adhesion enhancing agent.

As the surfactant and the plasticizer, examples include, but are not limited to, those mentioned in International Publication No. WO2012/144521.
(The Content of Each Component in the Color Resin Composition)

The total content of the color material represented by the general formula (I) and the color material added as needed, is preferably from 5% by mass to 65% by mass, and more preferably from 8% by mass to 55% by mass, with respect to the total solid content of the color resin composition. When the total content of the color material is too small, a film obtained by applying the color resin composition to a predetermined thickness (generally from 1.0 μm to 5.0 μm) may obtain insufficient transmission density. When the total content of the color material is too large, the cured film obtained by applying the color resin composition to a substrate and curing the applied color resin composition, may obtain insufficient film properties (e.g., adhesion to the substrate, surface roughness of the cured film, and coating film hardness). In addition, since the ratio of the amount of the dispersant used to disperse the color materials in the color resin composition, becomes large, the cured film may obtain insufficient properties (e.g., solvent resistance). In the disclosed embodiments, "solid content" includes all of the above-described components other than the solvent, and it also includes the polyfunctional monomer dissolved in the solvent.

Also, the content of the dispersant is not particularly limited, as long as the color material can be homogeneously dispersed. For example, the dispersant content may be from 10 parts by mass to 150 parts by mass, with respect to 100 parts by mass of the color material. Also, the content is preferably from 15 parts by mass to 100 parts by mass, and particularly preferably from 15 parts by mass to 70 parts by mass, with respect to 100 parts by mass of the color material. The total dispersant content is preferably in a range of from 1% by mass to 60% by mass, particularly preferably in a range of from 5% by mass to 50% by mass, with respect to the total solid content of the color resin composition. When the content is less than 1% by mass with respect to the total solid content of the color resin composition, homogeneous color material dispersion may be difficult. When the content is more than 60% by mass, a decrease in curability and developability may occur.

The total amount of the binder component is preferably from 5% by mass to 90% by mass, and more preferably from 10% by mass to 80% by mass, with respect to the total solid content of the color resin composition.

The content of the solvent is not particularly limited, as long as accurate color layer formation is possible. In general, the content is preferably in a range of from 65% by mass to 95% by mass, and particularly preferably in a range of from 75% by mass to 88% by mass, with respect to the total amount of the color resin composition including the solvent. When the content of the solvent is in the range, excellent coatability can be provided to the color resin composition.
(Method for Producing the Color Resin Composition)

As the method for producing the color resin composition, examples include, but are not limited to, the following methods (1) and (2): (1) the color material dispersion liquid according to the disclosed embodiments, the binder component, and various kinds of additional components used as needed, are added to the solvent at the same time and mixed together, and (2) the binder component and various kinds of additional components used as needed, are added to the solvent and mixed together; the color material dispersion liquid according to the disclosed embodiments is added thereto; and then they are mixed together.
(Cured Film of Color Resin Composition)

For the color resin composition according to the disclosed embodiments, a difference $\Delta x$ ($=x_1-x_0$) between a chromaticity coordinate $x_0$ of a cured film$_{(0)}$ obtained by drying the color resin composition and heating the dried color resin composition at 230° C. for 30 minutes to a thickness at which a chromaticity coordinate $y_0$ is 0.082, and a chromaticity coordinate $x_1$ of a cured film$_{(1)}$ obtained by repeating, three times, a process of heating the cured film$_{(0)}$ at 230° C. for 30 minutes and then leaving the heated cured film$_{(0)}$ to cool for 30 minutes, is preferably 0.025 or less, more preferably 0.020 or less, and still more preferably 0.010 or less, from the viewpoint of suppressing a color change after heating.

The chromaticity coordinates x and y are chromaticity coordinates in the XYZ color system by JIS Z8701, which are values measured under illuminant C.

The color resin composition according to the disclosed embodiments is preferably used for color filter applications. Of them, it is preferably used for blue pixel applications for color filters. Of them, it is preferably used for color filter applications for high color gamut displays.

Next, the color filter of the disclosed embodiments will be described.
[Color Filter]

The color filter according to the disclosed embodiments is a color filter comprising at least a transparent substrate and color layers disposed on the substrate, wherein at least one of the color layers contains a compound which is represented by the general formula (I) and which contains one or more structures selected from the structures (i) and (ii).

Such a color filter of the disclosed embodiments will be explained with reference to figures. FIG. 1 is a schematic sectional view of an embodiment of a color filter. According to FIG. 1, a color filter 10, which is an embodiment of the present disclosure, includes a transparent substrate 1, a light shielding part 2 and a color layer 3.
(Color Layer)

At least one of the color layers used in the color filter according to the disclosed embodiments, is a color layer that contains the above-specified compound represented by the general formula (I).

The color layers are generally formed on openings of the light shielding part on the below-described transparent substrate and composed of color patterns in three or more colors.

The arrangement of the color layers is not particularly limited and can be a general arrangement such as a stripe type, a mosaic type, a triangle type or a four-pixel arrangement type. The width, area, etc., of the color layer can be determined appropriately.

The thickness of the color layers is appropriately controlled by controlling the applying method or the solid content concentration, viscosity, etc., of the color resin composition. In general, the thickness is preferably in a range of from 1 μm to 5 μm.

For example, when the color resin composition is a photosensitive resin composition, the color layer can be formed by the following method. It is preferable that the color layer containing the above-specified compound represented by the general formula (I), which is used in the color filter, is formed by use of the color resin composition which contains the color material, the dispersant, the solvent and the binder component, the color material containing the above-specified compound represented by the general formula (I). It is also preferable that the color layer containing the above-specified compound represented by the general formula (I), is a cured product of the color resin composition.

First, the color resin composition is applied onto the below-described transparent substrate by a coating method such as a spray coating method, a dip coating method, a bar coating method, a roll coating method, a spin coating method or the like to form a wet coating film.

Then, the wet coating film is dried with a hot plate, an oven, etc. The dried film is subjected to exposure through a mask with a given pattern to cause a photopolymerization reaction of the alkali soluble resin, the polyfunctional monomer, etc., thereby obtaining a photosensitive coating film. A light source is used for the exposure. As the light source, examples include, but are not limited to, ultraviolet rays from a low pressure mercury lamp, a high pressure mercury lamp and a metal halide lamp, and electron beams. The exposure amount is appropriately controlled, depending on the used light source and the thickness of the coating film.

The film can be heated to promote a polymerization reaction after the exposure. The heating condition is appropriately determined, depending on the content ratio of the components used in the color resin composition, the thickness of the coating film, etc.

Next, the thus-obtained film is developed with a developer to dissolve and remove unexposed portions, thereby forming a coating film in a desired pattern. As the developer, a solution obtained by dissolving alkali in water or aqueous solvent, is generally used. An appropriate amount of surfactant, etc., can be added to the alkali solution. The developing method can be selected from general developing methods.

After the developing treatment, generally, the developer is rinsed off, followed by drying of the cured coating film of the color resin composition, thereby forming a color layer. To sufficiently cure the coating film, a heating treatment can be carried out after the developing treatment. The heating condition is not particularly limited and is appropriately determined depending on the intended application of the coating film.

Out of the color layers, the color layer containing the compound which is represented by the above-specified general formula (I) preferably has the following visible light transmission spectrum, from the viewpoint of obtaining a color filter with higher luminance: the maximum transmittance at 400 nm or more and 500 nm or less is 86% or more; the minimum transmittance at 550 nm or more and 650 nm or less is 2% or less; and the wavelength indicating the maximum transmittance at 400 nm or more and 500 nm or less, is in a range of from 425 nm to 455 nm.

The visible light transmission spectrum of the color layer containing the compound represented by the above-specified general formula (I), is more preferably as follows: the maximum transmittance at 400 nm or more and 500 nm or less is 87% or more; the minimum transmittance at 550 nm or more and 650 nm or less is 0.2% or less; and the wavelength indicating the maximum transmittance at 400 nm or more and 500 nm or less, is in a range of from 430 nm to 455 nm.

The visible light transmission spectrum of the color layer can be measured by a microscopic spectrophotometer (e.g., OSP-SP200 manufactured by Olympus Corporation).

(Light Shielding Part)

In the color filter according to the disclosed embodiments, the light shielding part is formed in pattern on the below-described transparent substrate, and it can be the same as those used in general color filters.

The pattern shape of the light shielding part is not particularly limited. As the pattern shape, examples include, but are not limited to, a stripe-shaped pattern and a matrix-shaped pattern. As the light shielding part, examples include, but are not limited to, one produced by dispersing or dissolving a black pigment in a binder resin, and thin metal layers of chromium, chromium oxide, etc. When the light shielding part is such a thin metal layer, the layer can be a stack of two layers of one $CrO_x$ layer (x is an arbitrary number) and one Cr layer, or it can be a stack of three layers of one $CrO_x$ layer (x is an arbitrary number), one $CrN_y$ layer (y is an arbitrary number) and one Cr layer, the stack of the three layers having a further reduced reflectance.

When the light shielding part is one produced by dispersing or dissolving a black color material in a binder resin, the method for producing the light shielding part is not particularly limited, as long as it is a method that can pattern the light shielding part. As the method, examples include, but are not limited to, a photolithography method using a color resin composition for the light shielding part, a printing method using the same, and an ink-jet method using the same.

When the light shielding part is a thin metal layer, the thickness is from about 0.2 μm to about 0.4 When the light shielding part is formed from the black color material dispersed or dissolved in the binder resin, the thickness is from about 0.5 μm to about 2 μm.

(Transparent Substrate)

The transparent substrate of the color filter according to the disclosed embodiments, is not particularly limited, as long as it is a substrate that is transparent to visible light. It can be selected from general transparent substrates used in color filters. As the transparent substrate, examples include, but are not limited to, inflexible transparent rigid materials such as silica glass plate, non-alkali glass plate and synthetic silica plate, and transparent flexible materials with flexibility and flexible properties, such as transparent resin film, optical resin plate and flexible glass.

The thickness of the transparent substrate is not particularly limited. Depending on the intended application of the color filter, one with a thickness of from about 50 μm to about 1 mm can be used, for example.

In addition to the transparent substrate, the light shielding part and the color layer, the color filter according to the disclosed embodiments can also include an overcoat layer and a transparent electrode layer, for example. Moreover, the color filter according to the disclosed embodiments can include an orientation film for orienting a liquid crystal material, a columnar spacer, etc. The color filter according to the disclosed embodiments is not limited to the above-exemplified structure. A known structure that is generally used for a color filter can be appropriately selected.

[Liquid Crystal Display Device]

The liquid crystal display device according to the disclosed embodiments is a liquid crystal display device comprising the color filter according to the disclosed embodiments, a counter substrate, and a liquid crystal layer disposed between the color filter and the counter substrate.

Figure 2:
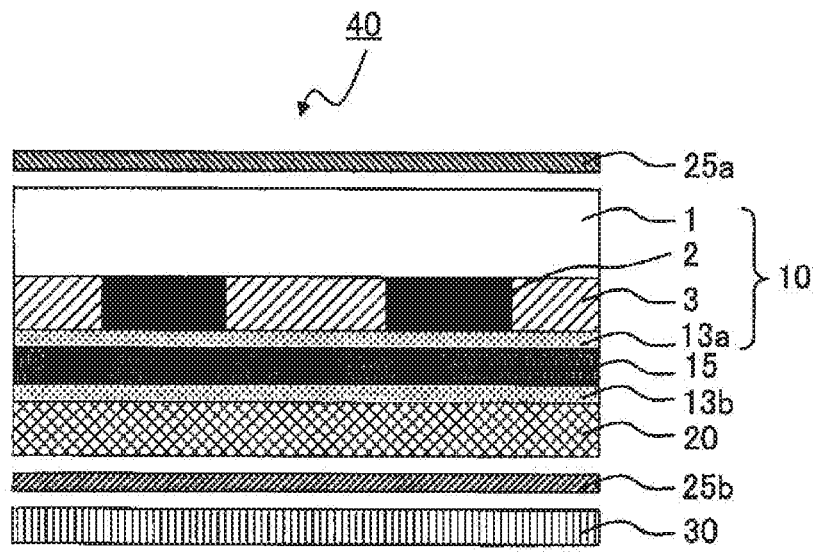
FIG. 2 is a schematic sectional view of an embodiment of a liquid crystal display device.

Such a liquid crystal display device according to the disclosed embodiments will be explained with reference to a figure. FIG. 2 is a schematic view of an embodiment of a liquid crystal display device. As shown in FIG. 2, a liquid crystal display device 40 includes a color filter 10, a counter substrate 20 including a TFT array substrate, etc., and a liquid crystal layer 15 formed between the color filter 10 and the counter substrate 20. Such an example is shown in FIG. 2, that an example an orientation film 13a is formed on a color layer 3 side of the color filter 10; an orientation film 13b is formed on a counter substrate 20 side of the same; and the liquid crystal layer 15 is formed between the two orientation films 13a and 13b. In addition, such an example is shown in FIG. 2, that the liquid crystal display device 40 includes a polarization plate 25a disposed outside the color filter 10, a polarization plate 25b disposed outside the counter substrate 20, and a backlight 30 disposed on the outer side than the polarization plate 25b disposed on the counter substrate 20 side of the liquid crystal display device 40.

The liquid crystal display device according to the disclosed embodiments is not limited to the configuration shown in FIG. 2. It can be a configuration that is generally known as a liquid crystal display device including a color filter.

The method for driving the liquid crystal display device according to the disclosed embodiments is not particularly limited. It can be selected from driving methods that are generally used in liquid crystal display devices. As such driving methods, examples include, but are not limited to, a TN method, an IPS method, an OCB method and an MVA method. In the disclosed embodiments, any of these methods can be suitably used.

The counter substrate can be appropriately selected, depending on the driving method, etc., of the liquid crystal display device according to the disclosed embodiments.

Also, the liquid crystal constituting the liquid crystal layer can be selected from various liquid crystals with varying dielectric anisotropies and mixtures thereof, depending on the driving method, etc., of the liquid crystal display device according to the disclosed embodiments.

The method for forming the liquid crystal layer can be selected from methods that are generally used to produce liquid crystal cells. As the method, examples include, but are not limited to, a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, while it is in the form of isotropic liquid, using the capillary effect; and the liquid crystal cell is encapsulated with an adhesive agent, thereby forming a liquid crystal layer. Then, the encapsulated liquid crystal can be oriented by gradually cooling the liquid crystal cell to room temperature.

In the dripping method, for example, a sealing agent is applied to the periphery of a color filter; the color filter is heated to the temperature at which the liquid crystal enters an isotropic phase; the liquid crystal is dripped with a dispenser or the like, while it is in the form of isotropic liquid; and the color filter and the counter substrate are stacked under reduced pressure and attached to each other via the applied sealing agent, thereby forming a liquid crystal layer. Then, the encapsulated liquid crystal can be oriented by gradually cooling the liquid crystal cell to room temperature.

The backlight used in the liquid crystal display device according to the disclosed embodiments, can be appropriately selected depending on the intended application of the liquid crystal display device. As the backlight, examples include, but are not limited to, a backlight unit using a cold cathode fluorescent lamp (CCFL), a white LED or a white organic EL as a light source.

As the white LED, examples include, but are not limited to, a white LED that obtains white light by color mixing of a red LED, a green LED and a blue LED; a white LED that obtains white light by color mixing of a blue LED, a red LED and a green phosphor; a white LED that obtains white light by color mixing of a blue LED, a red-emitting phosphor and a green-emitting phosphor; a white LED that obtains white light by color mixing of a blue LED and a YAG phosphor; and a white LED that obtains white light by color mixing of a UV LED, a red-emitting phosphor, a green-emitting phosphor and a blue-emitting phosphor. As the phosphors, quantum dots can be used.

[Light-Emitting Display Device]

The light-emitting display device according to the disclosed embodiments comprises the above-described color filter according to the disclosed embodiments and a light-emitting body. As the light-emitting display device according to the disclosed embodiments, examples include, but are not limited to, an organic light-emitting display device comprising an organic light-emitting body as the light-emitting body. The light-emitting body is not limited to the organic light-emitting body, and an inorganic light-emitting body can be appropriately used.

Figure 3:
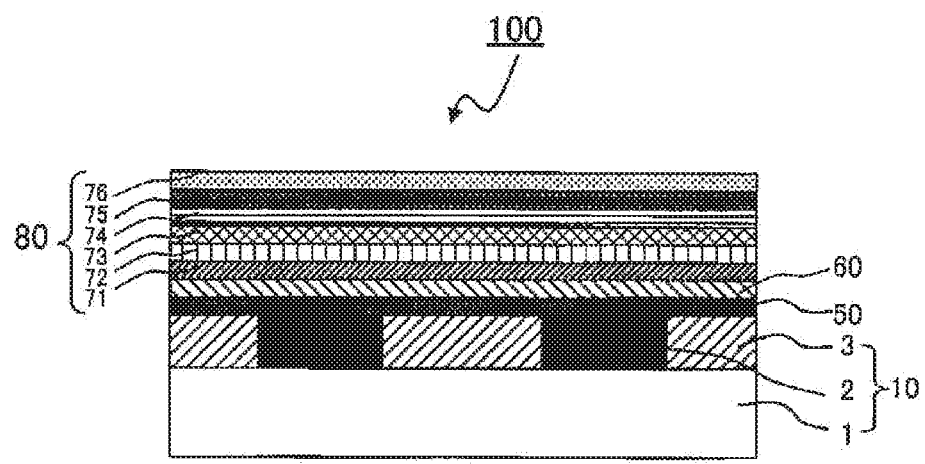
FIG. 3 is a schematic sectional view of an embodiment of an organic light-emitting display device.

Such a light-emitting display device of the disclosed embodiments will be explained with reference to a figure. FIG. 3 is a schematic view of an embodiment of a light-emitting display device. As shown in FIG. 3, a light-emitting display device 100, which is the light-emitting display device according to the disclosed embodiments, includes a color filter 10 and a light-emitting body 80. An organic protection layer 50 and/or an inorganic oxide layer 60 can be disposed between the color filter 10 and the light-emitting body 80.

As the method for stacking the components of the light-emitting body 80, examples include, but are not limited to, a method of stacking a transparent positive electrode 71, a positive hole injection layer 72, a positive hole transport layer 73, a light-emitting layer 74, an electron injection layer 75 and a negative electrode 76 in this sequence on the color filter, and a method of attaching the light-emitting body 80 formed on a different substrate onto the inorganic oxide layer 60. The transparent positive electrode 71, the positive hole injection layer 72, the positive hole transport layer 73, the light-emitting layer 74, the electron injection layer 75, the negative electrode 76 and other components of the light-emitting body 80 can be appropriately selected from conventionally-known materials. The light-emitting display device 100 produced as mentioned above is applicable to both passive and active drive organic EL displays, for example.

The light-emitting display device according to the disclosed embodiments, is not limited to a light-emitting display device of the configuration shown in FIG. 3. It can include any one of configurations that are generally known as those of light-emitting display devices using a color filter.

EXAMPLES

Synthesis Example 1: Synthesis of Intermediate A-1

First, 15.2 g (60 mmol) of 1-iodonaphthalene (manufactured by Wako Pure Chemical Industries, Ltd.), 6.31 g (30 mmol) of 4,4'-methylene bis(cyclohexylamine) (manufactured by Tokyo Chemical Industry Co., Ltd.), 8.07 g (84 mmol) of sodium t-butoxide, 0.09 g (0.2 mmol) of 2-dicyclohexylphosphino-2',6',-dimethoxybiphenyl (manufactured by Aldrich), and 0.021 g (0.1 mmol) of palladium acetate (manufactured by Wako Pure Chemical Industries, Ltd.) were dispersed in 30 mL of xylene and reacted at 130° C. to 135° C. for 48 hours. After the reaction was completed, the reaction product was cooled to room temperature and mixed with water for extraction. Next, the product thus obtained was dried with magnesium sulfate and concentrated, thereby obtaining the following intermediate A-1 in an amount of 8.5 g (yield 70%).

The compound thus obtained was confirmed to be a target compound from the following analysis results:
MS (ESI) (m/z): 407 (M+H),
Elemental analysis values: CHN measurement values (85.47%, 8.02%, 6.72%); theoretical values (85.26%, 8.11%, 6.63%)

Intermediate A-1

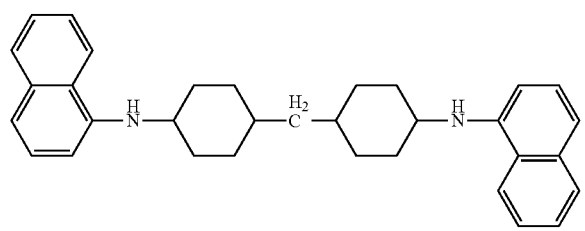

Synthesis Example 2: Synthesis of Intermediate A-2

The following intermediate A-2 was obtained (yield 94%) in the same manner as Synthesis Example 1, except that mmol of 4,4'-methylene bis(2-methylcyclohexylamine) (manufactured by Tokyo Chemical Industry Co., Ltd.) was used in place of the 4,4'-methylene bis(cyclohexylamine).

The compound thus obtained was confirmed to be a target compound from the following analysis results:
MS (ESI) (m/z): 491 (M+H)
Elemental analysis values: CHN measurement values (85.72%, 8.53%, 5.75%); theoretical values (85.66%, 8.63%, 5.71%)

Intermediate A-2

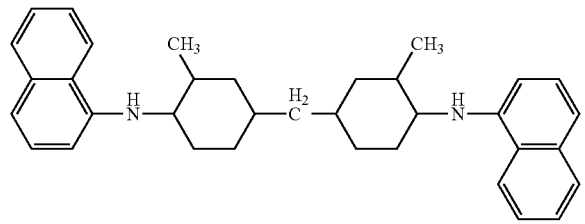

Synthesis Example 3: Synthesis of Intermediate A-3

The following intermediate A-3 was obtained (yield 72%) in the same manner as Synthesis Example 1, except that 30 mmol of 4,4'-methylene bis(2,6-dimethylcyclohexylamine) (CAS No. 65962-45-0) was used in place of the 4,4'-methylene bis(cyclohexylamine).

The compound thus obtained was confirmed to be a target compound from the following analysis results:
MS (ESI) (m/z): 519 (M+H)
Elemental analysis values: CHN measurement values (85.75%, 8.86%, 5.39%); theoretical values (85.66%, 8.94%, 5.40%)

Intermediate A-3

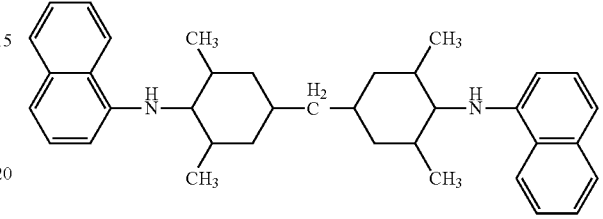

Synthesis Example 4: Synthesis of Intermediate A-4

The following intermediate A-4 was obtained (yield 70%) in the same manner as Synthesis Example 1, except that 30 mmol of norbornane diamine (NBDA) (CAS No. 56602-77-8) (manufactured by Mitsui Chemicals, Inc.) was used in place of the 4,4'-methylene bis(cyclohexylamine).

The compound thus obtained was confirmed to be a target compound from the following analysis results:
MS (EST) (m/z): 407 (M+H),
Elemental analysis values: CHN measurement values (85.47%, 8.02%, 6.72%); theoretical values (85.26%, 8.11%, 6.63%)

Intermediate A-4

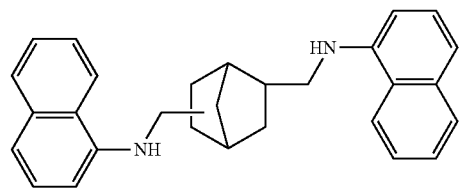

Synthesis Example 5: Synthesis of Intermediate B-1

First, 15.0 g (59.7 mmol) of 4,4'-dichlorobenzophenone (manufactured by Wako Pure Chemical Industries, Ltd.), 16.3 g (121 mmol) of N-ethyl-o-toluidine (manufactured by Wako Pure Chemical Industries, Ltd.), 16.1 g (168 mmol) of sodium t-butoxide, 2.86 g (6.0 mmol) of 2-dicyclohexylphosphino-2',4',6',-triisopropylbiphenyl (Xphos) (manufactured by Johnson Matthey), and 673 mg (3.0 mmol) of palladium acetate (manufactured by Wako Pure Chemical Industries, Ltd.) were dispersed in 130 mL of xylene and reacted at 100° C. to 105° C. for 20 hours. After the reaction was completed, the reaction product was cooled to room temperature and mixed with 200 ml of toluene and 200 ml of water for extraction. A toluene solution thus obtained was dried with magnesium sulfate and then concentrated under reduced pressure. A residue thus obtained was diluted with toluene and refined by silica-gel column chromatography, thereby obtaining the following intermediate B-1 in an amount of 11.8 g (yield 44%).

The compound thus obtained was confirmed to be a target compound from the following analysis results:

MS (ESI) (m/z): 449 (M+H),

Elemental analysis values: CHN measurement values (82.90%, 7.33%, 6.22%); theoretical values (82.81%, 7.40%, 6.23%)

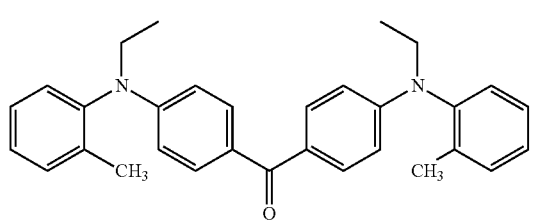

Intermediate B-1

Synthesis Example 6: Synthesis of Intermediate B-2

The following intermediate B-2 was obtained (yield 52%) in the same manner as Synthesis Example 5, except that N-ethyl-2,6-dimethylaniline was used in place of the N-ethyl-o-toluidine (manufactured by Wako Pure Chemical Industries, Ltd.)

The compound thus obtained was confirmed to be a target compound from the following analysis results:

MS (ESI) (m/z): 477 (M+H),

Elemental analysis values: CHN measurement values (83.23%, 7.55%, 5.84%); theoretical values (83.15%, 7.61%, 5.88%)

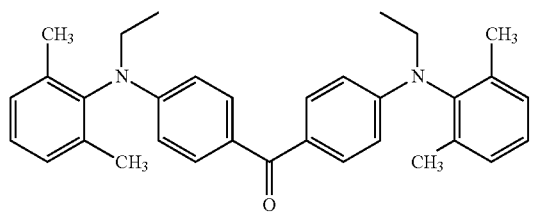

Intermediate B-2

Synthesis Example 7: Synthesis of Intermediate B-3

The following intermediate B-3 was obtained (yield 51%) in the same manner as Synthesis Example 5, except that N-ethyl-2,4,6-trimethylaniline was used in place of the N-ethyl-o-toluidine (manufactured by Wako Pure Chemical Industries, Ltd.)

The compound thus obtained was confirmed to be a target compound from the following analysis results:

MS (ESI) (m/z): 505 (M+H),

Elemental analysis values: CHN measurement values (83.39%, 7.91%, 5.54%); theoretical values (83.29%, 7.99%, 5.55%)

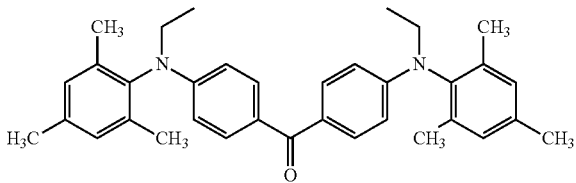

Intermediate B-3

Synthesis Example 8: Synthesis of Intermediate B-4

The following intermediate B-4 was obtained (yield 71%) in the same manner as Synthesis Example 5, except that N-ethyl-2-methylcyclohexylamine was used in place of the N-ethyl-o-toluidine (manufactured by Wako Pure Chemical Industries, Ltd.)

The compound thus obtained was confirmed to be a target compound from the following analysis results:

MS (ESI) (m/z): 461 (M+H),

Elemental analysis values: CHN measurement values (80.89%, 9.60%, 6.05%); theoretical values (80.82%, 9.63%, 6.08%)

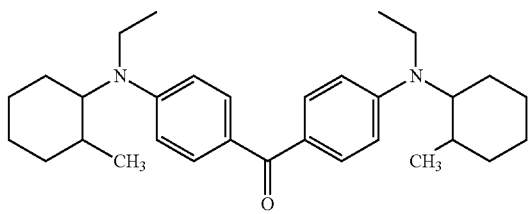

Intermediate B-4

Synthesis Example 9: Synthesis of Compound 1-1

First, 2.47 g (6.08 mmol) of the intermediate A-4 obtained in Synthesis Example 4, 6.00 g (13.4 mmol) of the intermediate B-1 obtained in Synthesis Example 5, and 10 mL of chlorobenzene were mixed and stirred at 45° C. to 50° C. Then, 2.06 g (13.4 mmol) of phosphorus oxychloride (manufactured by Wako Pure Chemical Industries, Ltd.) was added thereto in a dropwise manner. The mixture was stirred at 45° C. to 50° C. for 20 hours. After a reaction was completed, 100 ml of chloroform and 100 mL of water were added to dissolve the reacted mixture. A chloroform layer thus formed was separated therefrom, washed with water, dried with magnesium sulfate and then concentrated under reduced pressure. A residue thus obtained was diluted with chloroform and refined by silica-gel column chromatography, thereby obtaining the following compound 1-1 in an amount of 7.5 g (yield 91%).

The compound thus obtained was confirmed to be a target compound from the following analysis results:

MS (ESI) (m/z): 635 (+), divalent

Elemental analysis values: CHN measurement values (81.59%, 6.85%, 5.25%); theoretical values (81.53%, 6.92%, 5.29%)

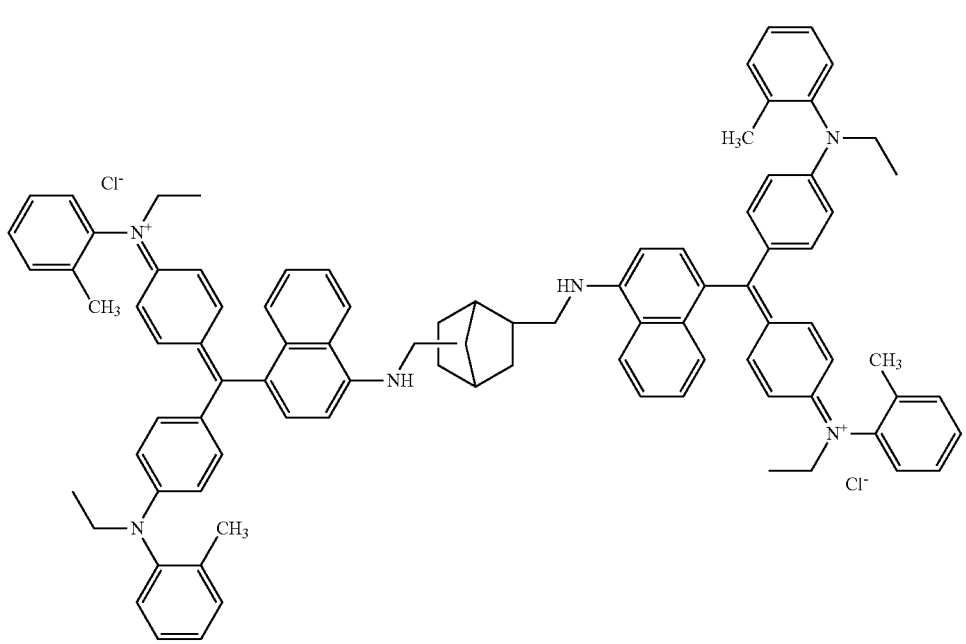

Compound 1-1

Synthesis Example 10: Synthesis of Compound 1-2

The following compound 1-2 was obtained (yield 82%) in the same manner as Synthesis Example 9, except that the intermediate A-1 of Synthesis Example 1 was used in place of the intermediate A-4.

The compound thus obtained was confirmed to be a target compound from the following analysis results:

MS (ESI) (m/z): 663(+), divalent

Elemental analysis values: CHN measurement values (81.75%, 7.17%, 5.99%); theoretical values (81.69%, 7.22%, 6.02%)

Synthesis Example 11: Synthesis of Compound 1-3

The following compound 1-3 was obtained (yield 87%) in the same manner as Synthesis Example 9, except that the intermediate A-2 of Synthesis Example 2 was used in place of the intermediate A-4.

The compound thus obtained was confirmed to be a target compound from the following analysis results:

MS (ESI) (m/z): 677(+), divalent

Elemental analysis values: CHN measurement values (81.81%, 7.31%, 5.85%); theoretical values (81.77%, 7.36%, 5.90%)

Compound 1-2

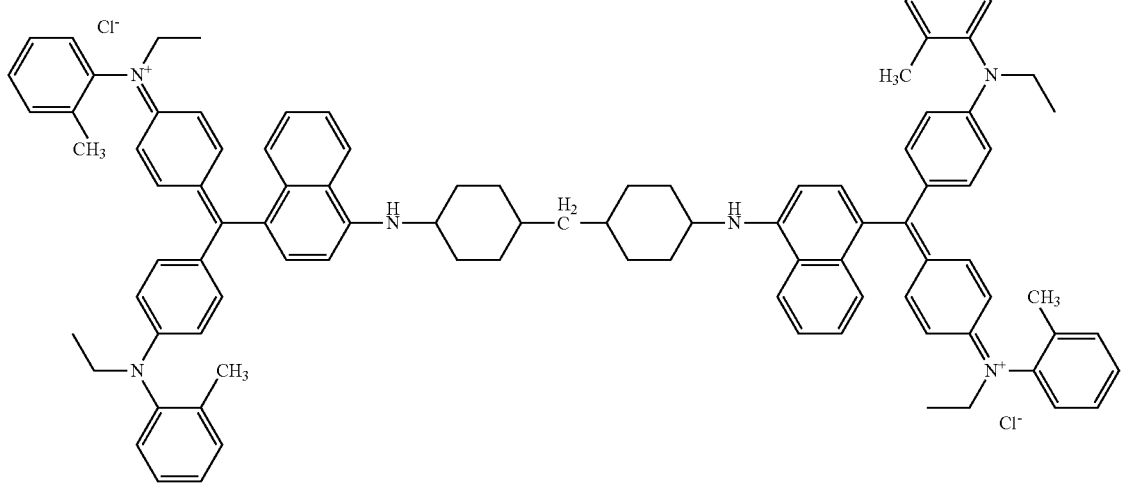

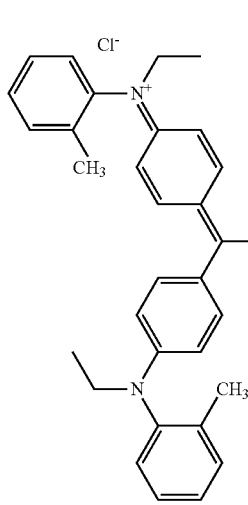
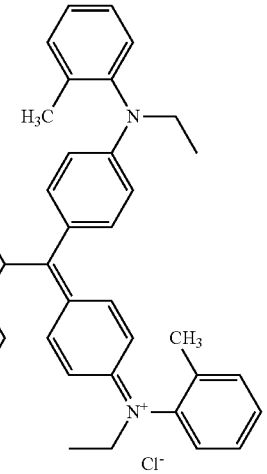

Compound 1-3

Synthesis Example 12: Synthesis of Compound 1-4

The following compound 1-4 was obtained (yield 52%) in the same manner as Synthesis Example 9, except that the intermediate A-1 of Synthesis Example 1 was used in place of the intermediate A-4, and 4,4'-bis(diethylamino)benzophenone (manufactured by Tokyo Chemical Industry Co., Ltd.) was used in place of the intermediate B-1.

The compound thus obtained was confirmed to be a target compound from the following analysis results:

MS (ESI) (m/z): 538(+), divalent

Elemental analysis values: CHN measurement values (73.51%, 8.02%, 7.28%); theoretical values (78.43%, 8.07%, 7.32%)

Synthesis Example 13: Synthesis of Compound 1-5

The following compound 1-5 was obtained (yield 65%) in the same manner as Synthesis Example 9, except that the intermediate A-2 of Synthesis Example 2 was used in place of the intermediate A-4, and 4,4'-bis(diethylamino)benzophenone (manufactured by Tokyo Chemical Industry Co., Ltd.) was used in place of the intermediate B-1.

The compound thus obtained was confirmed to be a target compound from the following analysis results:

MS (ESI) (m/z): 552(+), divalent

Elemental analysis values: CHN measurement values (78.68%, 8.17%, 7.10%); theoretical values (78.61%, 8.22%, 7.14%)

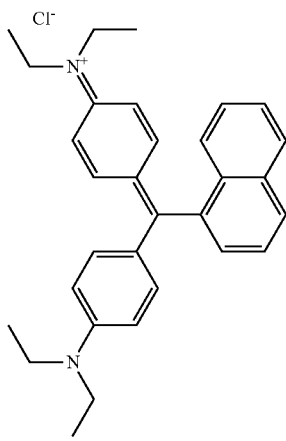
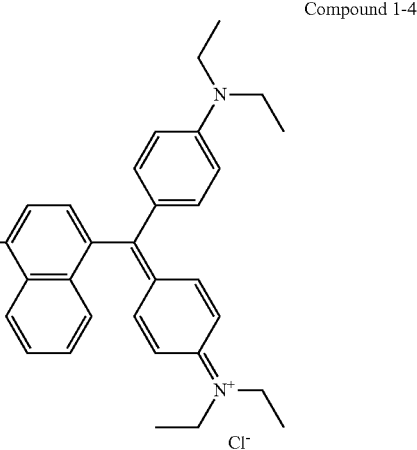

Compound 1-4

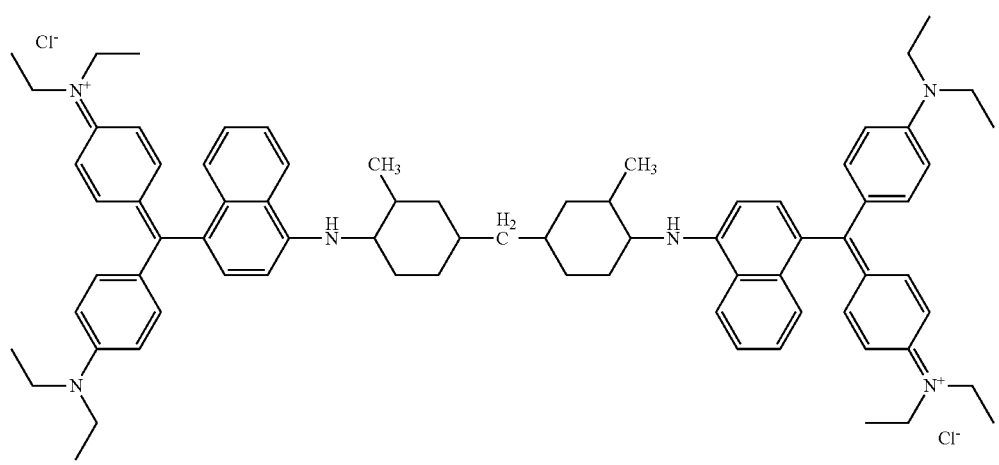

Compound 1-5

(Synthesis Example 14: Synthesis of Compound 1-6)

The following compound 1-6 was obtained (yield 76%) in the same manner as Synthesis Example 9, except that the intermediate A-3 of Synthesis Example 3 was used in place of the intermediate A-4.

The compound thus obtained was confirmed to be a target compound from the following analysis results:

MS (ESI) (m/z): 691(+), divalent

Elemental analysis values: CHN measurement values (81.91%, 7.44%, 5.72%); theoretical values (81.84%, 7.49%, 5.78%)

Synthesis Example 15: Synthesis of Compound 1-7

The following compound 1-7 was obtained (yield 81%) in the same manner as Synthesis Example 9, except that the intermediate A-1 of Synthesis Example 1 was used in place of the intermediate A-4, and the intermediate B-2 of Synthesis Example 6 was used in place of the intermediate B-1.

The compound thus obtained was confirmed to be a target compound from the following analysis results:

MS (ESI) (m/z): 691(+), divalent

Elemental analysis values: CHN measurement values (81.90%, 7.44%, 5.74%); theoretical values (81.84%, 7.49%, 5.78%)

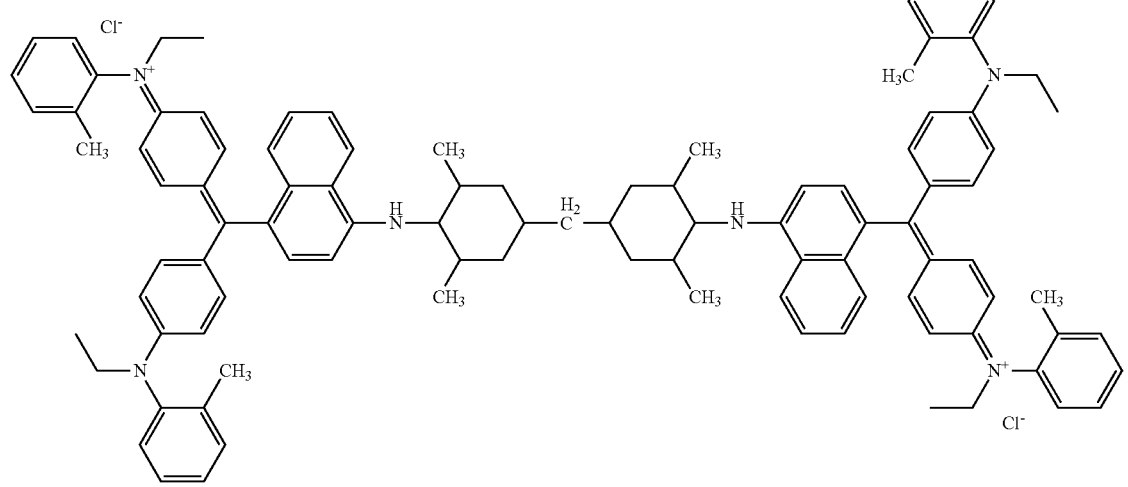

Compound 1-6

Compound 1-7

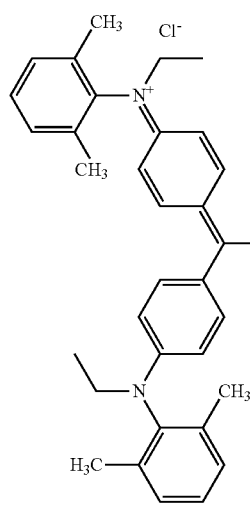
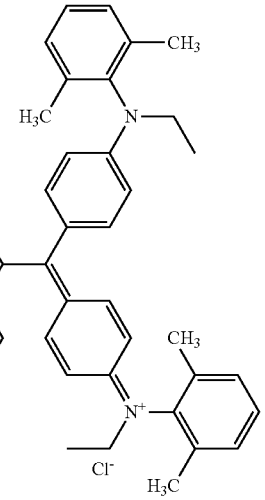

Synthesis Example 16: Synthesis of Compound 1-8

The following compound 1-8 was obtained (yield 73%) in the same manner as Synthesis Example 9, except that the intermediate A-1 of Synthesis Example 1 was used in place of the intermediate A-4, and the intermediate B-3 of Synthesis Example 7 was used in place of the intermediate B-1.

The compound thus obtained was confirmed to be a target compound from the following analysis results:

MS (ESI) (m/z): 719(+), divalent

Elemental analysis values: CHN measurement values (81.97%, 7.55%, 5.65%); theoretical values (81.91%, 7.62%, 5.67%)

Synthesis Example 17: Synthesis of Compound 1-9

The following compound 1-9 was obtained (yield 71%) in the same manner as Synthesis Example 9, except that the intermediate A-1 of Synthesis Example 1 was used in place of the intermediate A-4, and the intermediate B-4 of Synthesis Example 8 was used in place of the intermediate B-1.

The compound thus obtained was confirmed to be a target compound from the following analysis results:

MS (ESI) (m/z): 675(+), divalent

Elemental analysis values: CHN measurement values (80.38%, 8.73%, 5.85%); theoretical values (80.30%, 8.80%, 5.91%)

Compound 1-8

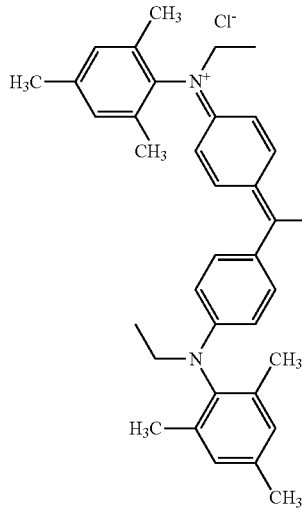
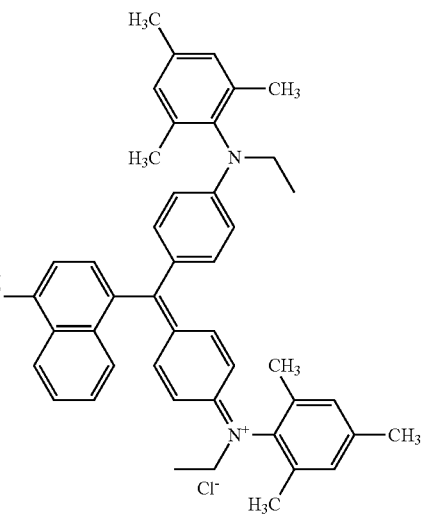

Compound 1-9

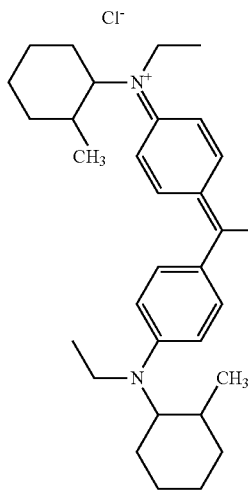
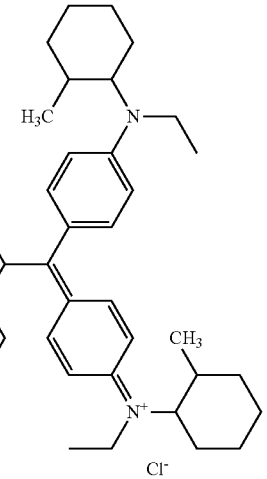

Comparative Synthesis Example 1: Synthesis of Compound 1-X

First, 8.46 g (20.8 mmol) of the intermediate A-4 of Synthesis Example 4, 13.5 g (41.6 mmol) of 4,4'-bis(dimethylamino)benzophenone (manufactured by Tokyo Chemical Industry Co., Ltd.) and 60 mL of toluene were mixed and stirred at 45° C. to 50° C. Then, 6.38 g (51.5 mmol) of phosphorus oxychloride (manufactured by Wako Pure Chemical Industries, Ltd.) was added thereto in a dropwise manner. The mixture was refluxed for two hours and cooled down. After a reaction was completed, the toluene was decanted. A resinous precipitate thus obtained was mixed with concentrated hydrochloric acid, 40 mL of chloroform and 40 mL of water and dissolved. A chloroform layer thus formed was separated therefrom, washed with water, and then dried with magnesium sulfate and concentrated. A concentrate thus obtained was mixed with 65 mL of ethyl acetate and refluxed. After cooling the resultant product, a precipitate thus formed was obtained by filtration, thereby obtaining the following compound 1-X in an amount of 15.9 g (yield 70%).

The compound thus obtained was confirmed to be a target compound from the following analysis results:
MS (ESI) (m/z): 511(+), divalent
Elemental analysis values: CHN measurement values (78.13%, 7.48%, 7.78%); theoretical values (78.06%, 7.75%, 7.69%)

Compound 1-X

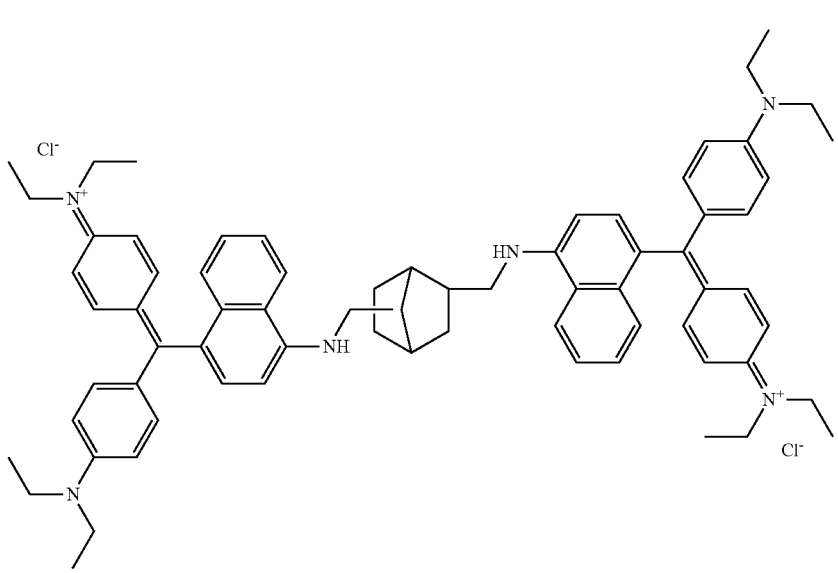

Synthesis Example 18: Synthesis of Compound 2-1

First, 2.59 g (0.76 mmol) of 12-tungstophosphoric acid n-hydrate (manufactured by Kanto Chemical Co., Inc.) was dissolved in a mixed solution of 40 mL of methanol and 40 mL of water, by heating. Then, 1.6 g (1.19 mmol) of the compound 1-1 was added to the solution, and the mixture was stirred for one hour. A precipitate thus formed was obtained by filtration and washed with water. The thus-obtained precipitate was dried under reduced pressure, thereby obtaining the following compound 2-1 in an amount of 3.4 g (yield 95%).

The compound thus obtained was confirmed to be a target compound from the following analysis results:

31P NMR (d-dmso, ppm) δ-15.15
MS (MALDI) (m/z): 1270 (M⁺), 2879 (MH₂⁻)

Elemental analysis values: CHN measurement values (35.01%, 2.88%, 2.59%); theoretical values (34.29%, 2.91%, 2.64%)
Fluorescent X-ray analysis: Mo/W measurement values (0%, 100%); theoretical values (0%, 100%)

Compound 2-1

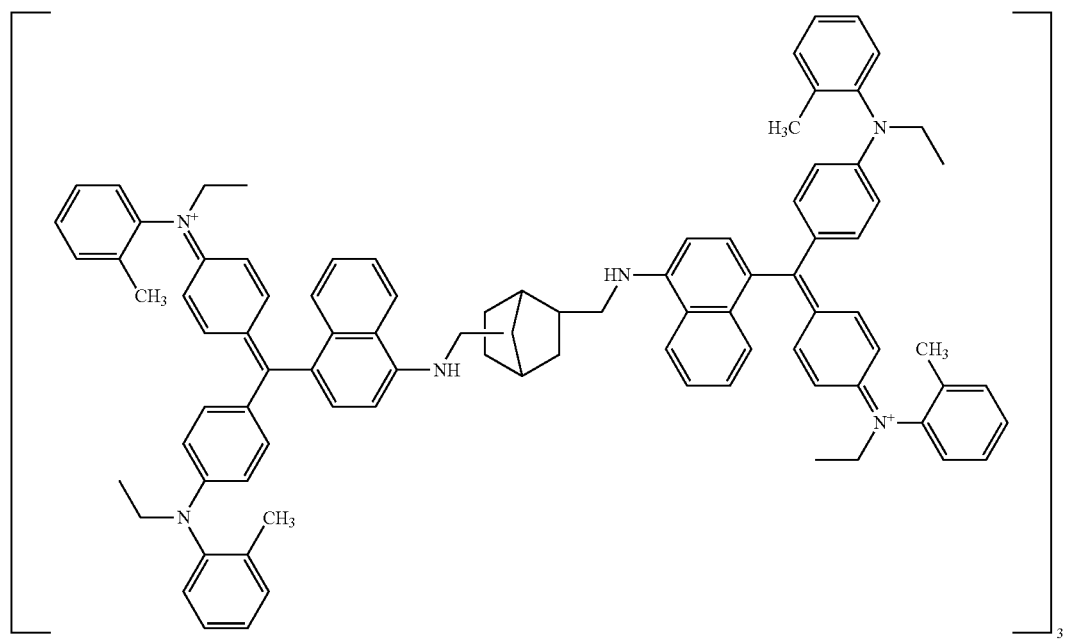

Synthesis Example 19: Synthesis of Compound 2-2

The following compound 2-2 was obtained (yield 96%) in the same manner as Synthesis Example 18, except that the compound 1-2 was used in place of the compound 1-1.

The compound thus obtained was confirmed to be a target compound from the following analysis results:

31P NMR (d-dmso, ppm) δ-15.15
MS (MALDI) (m/z): 1326 (M⁺), 2879 (MH₂⁻)
Elemental analysis values: CHN measurement values (35.28%, 3.15%, 2.63%); theoretical values (35.18%, 3.11%, 2.59%)
Fluorescent X-ray analysis: Mo/W measurement values (0%, 100%); theoretical values (0%, 100%)

Compound 2-2

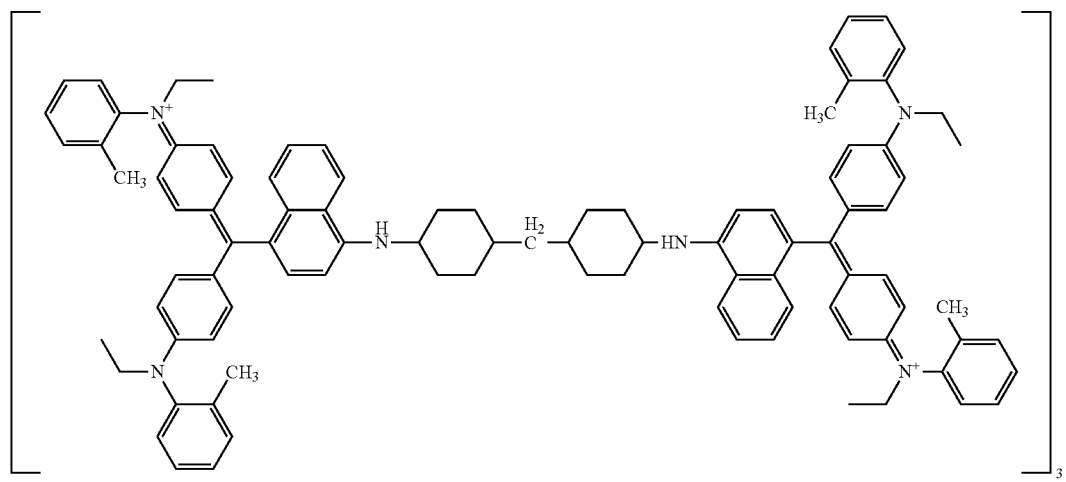

Synthesis Example 20: Synthesis of Compound 2-3

The following compound 2-3 was obtained (yield 95%) in the same manner as Synthesis Example 18, except that the compound 1-3 was used in place of the compound 1-1.

The compound thus obtained was confirmed to be a target compound from the following analysis results:

31P NMR (d-dmso, ppm) δ-15.15

MS (MALDI) (m/z): 1355 (M$^+$), 2879 (MH$_2^-$)

Elemental analysis values: CHN measurement values (35.55%, 3.24%, 2.61%); theoretical values (35.61%, 3.20%, 2.57%)

Fluorescent X-ray analysis: Mo/W measurement values (0%, 100%); theoretical values (0%, 100%)

Compound 2-3

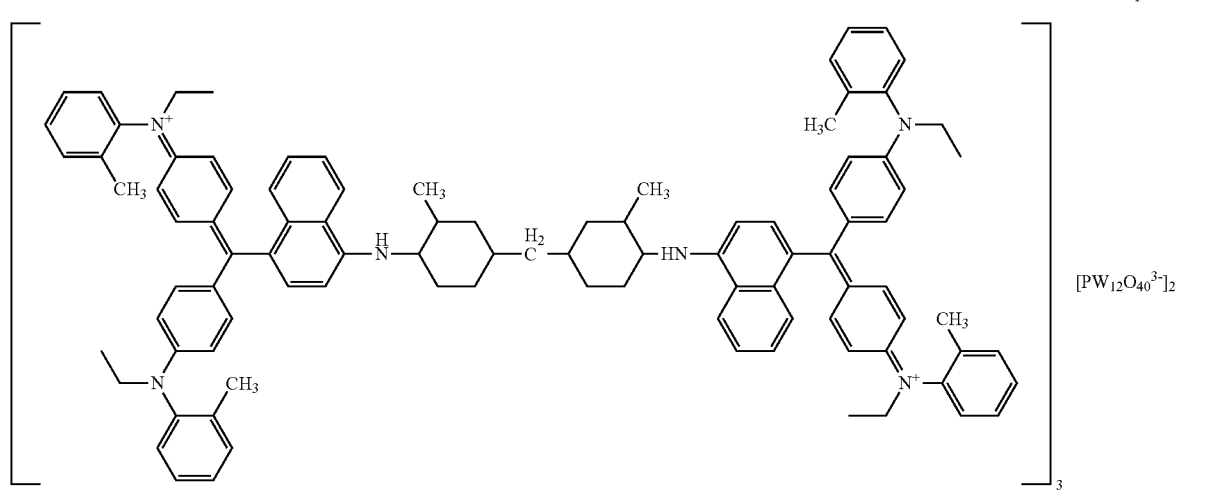

Synthesis Example 21: Synthesis of Compound 2-4

The following compound 2-4 was obtained (yield 97%) in the same manner as Synthesis Example 18, except that the compound 1-4 was used in place of the compound 1-1.

The compound thus obtained was confirmed to be a target compound from the following analysis results:

31P NMR (d-dmso, ppm) δ-15.15

MS (MALDI) (m/z): 1078 (M$^+$), 2879 (MH$_2^-$)

Elemental analysis values: CHN measurement values (30.20%, 3.14%, 2.86%); theoretical values (30.070, 3.10%, 2.81%)

Fluorescent X-ray analysis: Mo/W measurement values (0%, 100%); theoretical values (0%, 100%)

Compound 2-4

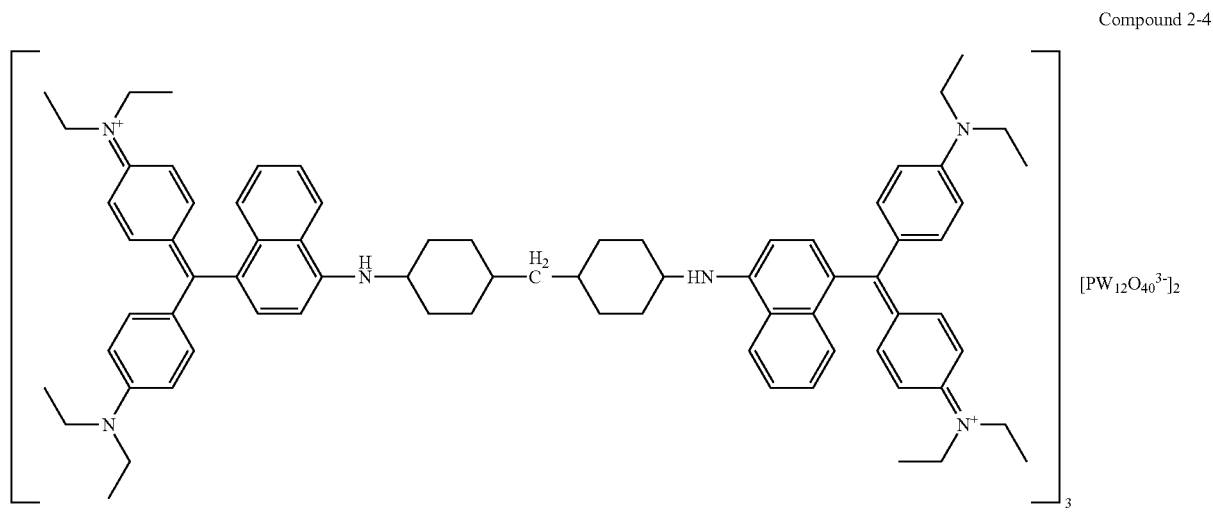

Synthesis Example 22: Synthesis of Compound 2-5

The following compound 2-5 was obtained (yield 97%) in the same manner as Synthesis Example 18, except that the compound 1-5 was used in place of the compound 1-1.

The compound thus obtained was confirmed to be a target compound from the following analysis results:

31P NMR (d-dmso, ppm) δ-15.15
MS (MALDI) (m/z): 1106 (M$^+$), 2879 (MH$_2^-$)
Elemental analysis values: CHN measurement values (30.63%, 3.18%, 2.75%); theoretical values (30.59%, 3.20%, 2.78%)
Fluorescent X-ray analysis: Mo/W measurement values (0%, 100%); theoretical values (0%, 100%)

Compound 2-5

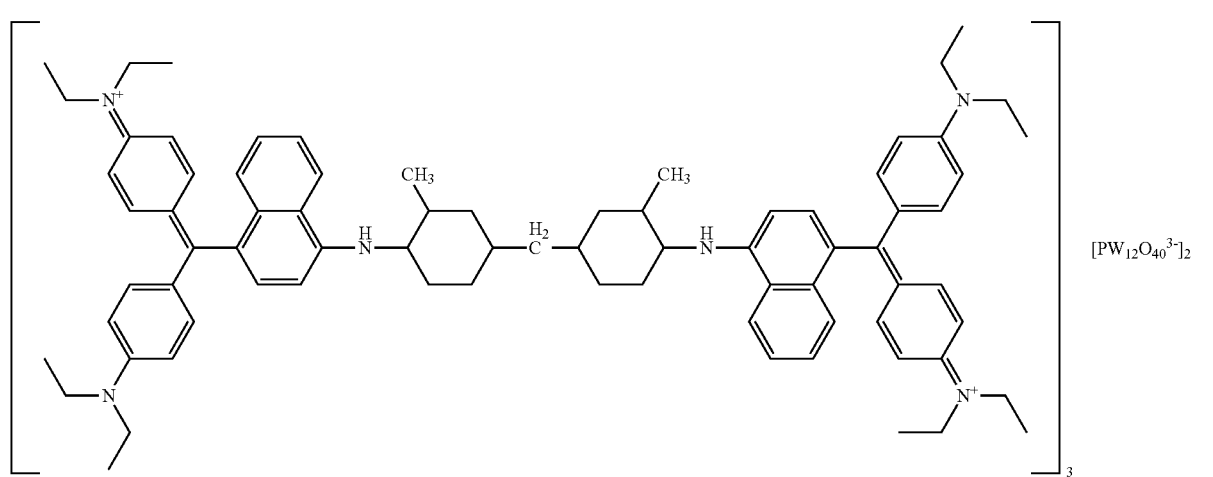

Synthesis Example 23: Synthesis of Compound 2-6

The following compound 2-6 was obtained (yield 96%) in the same manner as Synthesis Example 18, except that the compound 1-6 was used in place of the compound 1-1.

The compound thus obtained was confirmed to be a target compound from the following analysis results:

31P NMR (d-dmso, ppm) δ-15.15
MS (MALDI) (m/z): 1383 (M$^+$), 2879 (MH$_2^-$)
Elemental analysis values: CHN measurement values (36.25%, 3.33%, 2.54%); theoretical values (36.04%, 3.30%, 2.55%)
Fluorescent X-ray analysis: Mo/W measurement values (0%, 100%); theoretical values (0%, 100%)

Compound 2-6

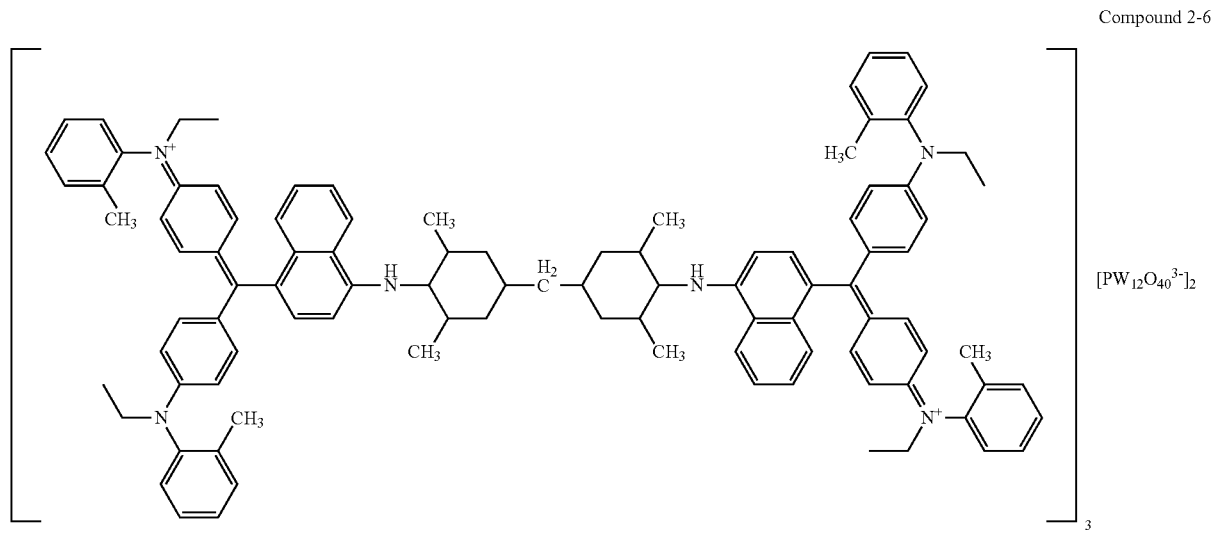

Synthesis Example 24: Synthesis of Compound 2-7

The following compound 2-7 was obtained (yield 95%) in the same manner as Synthesis Example 18, except that the compound 1-7 was used in place of the compound 1-1.

The compound thus obtained was confirmed to be a target compound from the following analysis results:

31P NMR (d-dmso, ppm) δ-15.15
MS (MALDI) (m/z): 1383 ($M^+$), 2879 ($MH_2^-$)
Elemental analysis values: CHN measurement values (36.25%, 3.33%, 2.54%); theoretical values (36.04%, 3.30%, 2.55%)
Fluorescent X-ray analysis: Mo/W measurement values (0%, 100%); theoretical values (0%, 100%)

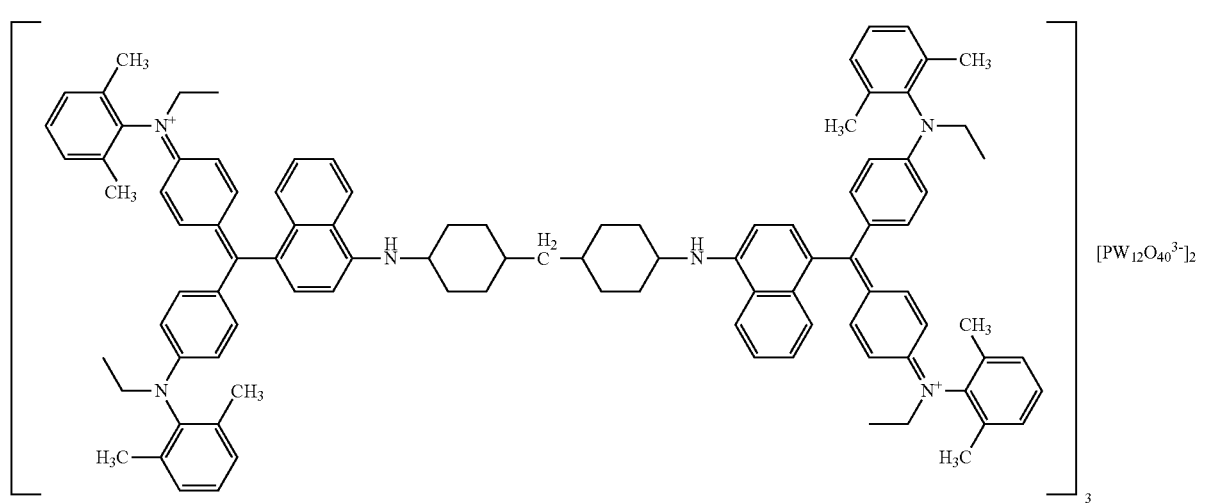

Compound 2-7

Synthesis Example 25: Synthesis of Compound 2-8

The following compound 2-8 was obtained (yield 97%) in the same manner as Synthesis Example 18, except that the compound 1-8 was used in place of the compound 1-1.

The compound thus obtained was confirmed to be a target compound from the following analysis results:

31P NMR (d-dmso, ppm) δ-15.15
MS (MALDI) (m/z): 1440 ($M^+$), 2879 ($MH_2^-$)
Elemental analysis values: CHN measurement values (36.88%, 3.49%, 2.51%); theoretical values (36.87%, 3.48%, 2.50%)
Fluorescent X-ray analysis: Mo/W measurement values (0%, 100%); theoretical values (0%, 100%)

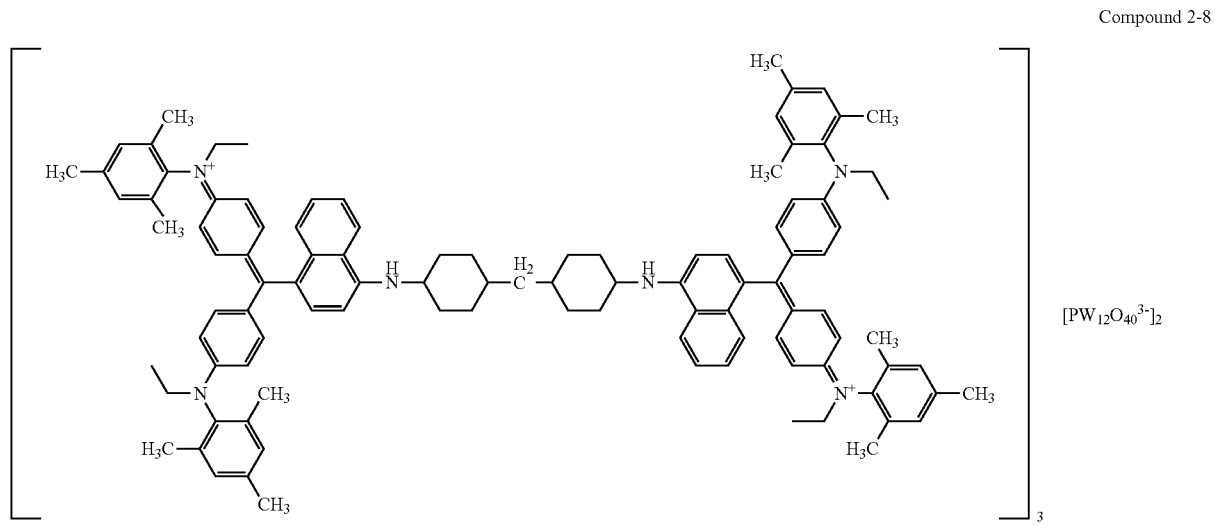

Compound 2-8

Synthesis Example 26: Synthesis of Compound 2-9

The following compound 2-9 was obtained (yield 97%) in the same manner as Synthesis Example 18, except that the compound 1-9 was used in place of the compound 1-1.

The compound thus obtained was confirmed to be a target compound from the following analysis results:

31P NMR (d-dmso, ppm) δ-15.15
MS (MALDI) (m/z): 1352 (M$^+$), 2879 (MH$_2^-$)
Elemental analysis values: CHN measurement values (34.88%, 3.79%, 2.58%); theoretical values (34.92%, 3.83%, 2.57%)
Fluorescent X-ray analysis: Mo/W measurement values (0%, 100%); theoretical values (0%, 100%)

Compound 2-9

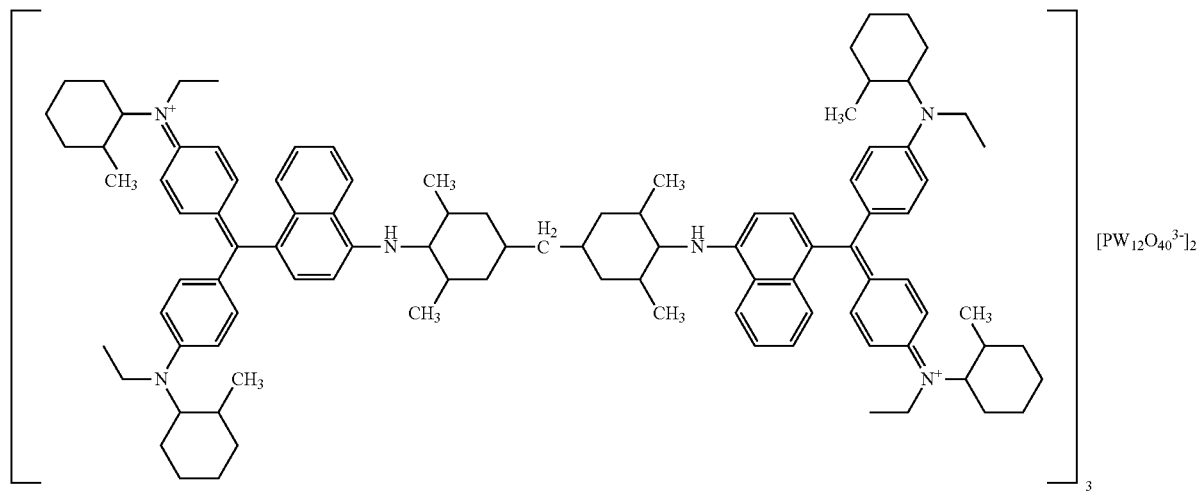

Comparative Synthesis Example 2: Synthesis of Compound 2-X

The following compound 2-X was obtained (yield 97%) in the same manner as Synthesis Example 18, except that the compound 1-X was used in place of the compound 1-1.

The compound thus obtained was confirmed to be a target compound from the following analysis results:

31P NMR (d-dmso, ppm) δ-15.15
MS (MALDI) (m/z): 1122 (M$^+$), 2879 (MH$_2^-$)
Elemental analysis values: CHN measurement values (29.04%, 2.90%, 2.81%); theoretical values (29.01%, 2.88%, 2.85%)
Fluorescent X-ray analysis: Mo/W measurement values (0%, 100%); theoretical values (0%, 100%)

Compound 2-X

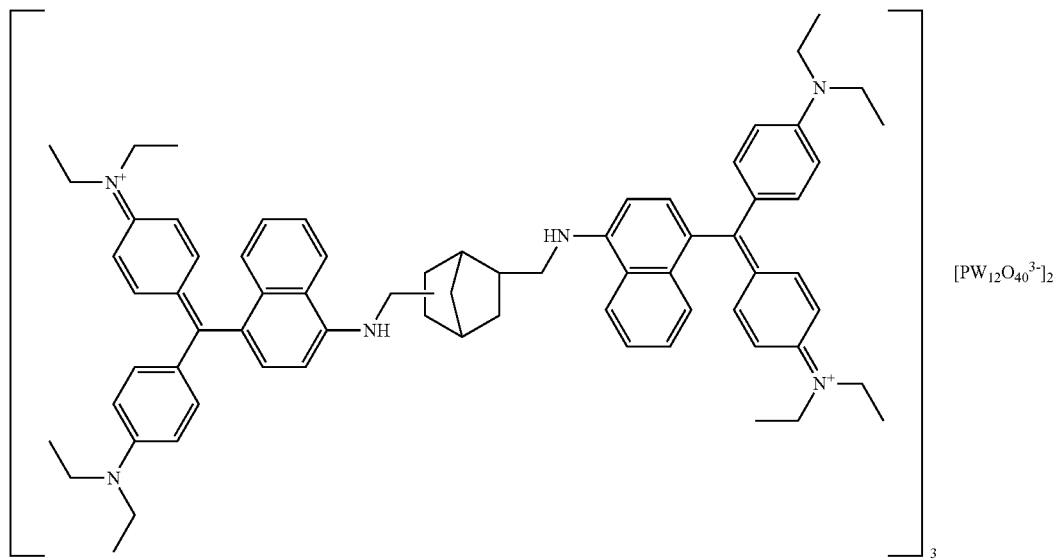

Preparation Example 1: Preparation of Salt-Type Block Polymer Dispersant A Solution In a reactor, 60.74 parts by mass of PGMEA and 35.64 parts by mass (effective solid content 21.38 parts by mass) of a block copolymer containing tertiary amino groups (product name: BYK-LPN 6919, manufactured by: BYK-Chemie GmbH) (amine value 120 mgKOH/g, solid content 60% by weight) were dissolved. Then, 3.62 parts by mass (0.5 molar equivalent with respect to the tertiary amino groups of the block copolymer) of PPA was added to the mixture. The mixture was stirred at 40° C. for 30 minutes, thereby preparing a salt-type block polymer dispersant A solution (solid content 25%).

Preparation Example 2: Preparation of Binder Composition A (1) Synthesis of Binder Resin A)

First, 130 parts by mass of diethylene glycol ethyl methyl ether (EMDG), which is a solvent, was put in a reactor equipped with a cooling tube, an addition funnel, a nitrogen inlet, a mechanical stirrer and a digital thermometer. After the temperature of the solvent was increased to 90° C. under a nitrogen atmosphere, a mixture of 32 parts by mass of methyl methacrylate, 22 parts by mass of cyclohexyl methacrylate, 24 parts by mass of methacrylic acid, 2.0 parts by mass of AIBN, which is an initiator, and 4.5 parts by mass of n-dodecyl mercaptan, which is a chain transfer agent, was continuously added to the solvent in a dropwise manner for 1.5 hours.

Then, with maintaining the synthesis temperature, the reaction was continued. Two hours after the completion of the addition of the mixture in a dropwise manner, 0.05 part by mass of p-methoxyphenol, which is a polymerization inhibitor, was added thereto.

Next, with injecting air into the mixture, 22 parts by mass of glycidyl methacrylate was added to the mixture. After the temperature of the mixture was increased to 110° C., 0.2 part by mass of triethylamine was added thereto, and an addition reaction was caused at 110° C. for 15 hours in the mixture, thereby obtaining a binder resin A (solid content 44% by mass).

The binder resin A thus obtained had a mass average molecular weight (Mw) of 8500, a number average molecular weight (Mn) of 4200, a molecular weight distribution (Mw/Mn) of 2.02, and an acid value of 85 mgKOH/g.

(2) A binder composition A (solid content 40% by mass) was prepared by mixing the following: 19.82 parts by mass of PGMEA, 18.18 parts by mass of the binder resin A (solid content 44% by mass), 8.00 parts by mass of a pentafunctional and hexafunctional acrylate monomer (product name: ARONIX M403, manufactured by: TOAGOSEI Co., Ltd.), 3.00 parts by mass of 2-methyl-1[4-(methylthio)phenyl]-2-morpholinopropane-1-one (product name: IRGACURE 907, manufactured by: BASF) and 1.00 part by mass of 2,4-diethylthioxanthone (product name: KAYACURE DETX-S, manufactured by: Nippon Kayaku Co., Ltd.)

Preparation Example 3: Preparation of Phosphorus-Based Block Copolymer B Solution (1) Synthesis of Block Copolymer B First, 100 parts by mass of dehydrated tetrahydrofuran and 3.00 parts by mass of dimethylketene methyl trimethylsilyl acetal were put in a reactor equipped with a cooling tube, an addition funnel, a nitrogen inlet, a mechanical stirrer and a digital thermometer. Nitrogen substitution was sufficiently carried out thereon. Next, 0.25 part by mass of a 1 M solution of tetrabutylammonium m-chlorobenzoate in acetonitrile, was injected into the reactor by a syringe. Then, a mixed solution of 50.0 parts by mass of methyl methacrylate, 30.0 parts by mass of n-butyl methacrylate and 20.0 parts by mass of benzyl methacrylate was added in a dropwise manner for 60 minutes. The reactor was cooled in an ice bath to keep the temperature at less than 40° C. After one hour passed, 25.0 parts by mass of glycidyl methacrylate was added in a dropwise manner for 20 minutes. After the mixture was reacted for one hour, 1 part by mass of methanol was added to stop the reaction. To the thus-obtained solution of the block copolymer B in THF, 188.0 parts by mass of PGMEA was added. Solvent substitution was carried out thereon by evaporation, thereby obtaining a solution of the block copolymer B in 40.0% by mass PGMEA.

The thus-obtained block copolymer B had a mass average molecular weight (Mw) of 9470, a number average molecular weight (Mn) of 7880, and a molecular weight distribution (Mw/Mn) of 1.20.

(2) Production of Phosphorus-Based Block Copolymer Solution

First, 100.0 parts by mass of the block copolymer B, 86.70 parts by mass of PGMEA, and 8.90 parts by mass of phenylphosphonic acid (PPA) were put in a reactor and stirred for two hours at 90° C., thereby obtaining a phosphorus-based block copolymer B solution (solid content 25% by mass). The progress of an esterification reaction between the PPA and a glycidyl group (a constitutional unit derived from the glycidyl methacrylate of the block copolymer B) was confirmed by acid value measurement and $^1$H-NMR measurement. The thus-obtained phosphorus-based block copolymer B had an acid value of 65 mgKOH/g.

Preparation Example 4: Preparation of Binder Composition B (1) Synthesis of Phosphate Triester Compound A First, 70 parts by mass of chloroform, 20.89 parts by mass of hydroxyethyl acrylate and 12.14 parts by mass of triethylamine were put in a reactor equipped with a cooling tube, an addition funnel, a nitrogen inlet, a mechanical stirrer and a digital thermometer. With stirring the mixed solution under a nitrogen atmosphere, the solution temperature was cooled to about 5° C. by use of an ice bath. Then, a solution obtained by diluting 6.13 parts by mass of phosphoryl chloride with 10 parts by mass of chloroform, was continuously added in a dropwise manner for 15 minutes, while controlling the solution temperature so as not to exceed 30° C. After the dropwise addition was completed, the ice bath was taken out, and the solution was stirred for three hours at room temperature. Then, 30 parts by mass of pure water was added thereto, and the mixed solution was stirred for 30 minutes. Then, the resulting reacted solution was taken out therefrom and washed three times with saturated brine. An organic layer thus formed was dehydrated with magnesium sulfate, filtered, and then mixed with 0.015 g of p-methoxyphenol. Then, the solvent was removed from the mixture, thereby obtaining 14.09 g (yield 90%) of a phosphate triester compound A represented by the following chemical formula (A). The thus-obtained compound had an acid value of 5 mgKOH/g. As a result of $^{32}$P-NMR measurement, it was found that the main component of the compound was phosphate triester; a slight amount of phosphoric diester was detected; and the peak integral ratio of the phosphate triester was 90% or more.

Chemical Formula (A)

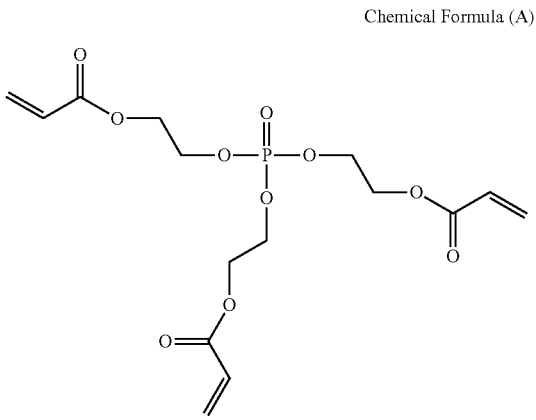 [SMILES: C=CC(=O)OCCOP(=O)(OCCOC(=O)C=C)OCCOC(=O)C=C]

(2) Preparation of Binder Composition B)

A binder composition B (solid content 40% by mass) was prepared by mixing the following: 19.82 parts by mass of PGMEA, 18.18 parts by mass of the binder resin A (solid content 44% by mass), 8.00 parts by mass of the phosphate triester compound A, 3.00 parts by mass of 2-methyl-1[4-(methylthio)phenyl]-2-morpholinopropane-1-one (product name: IRGACURE 907, manufactured by: BASF) and 1.00 part by mass of 2,4-diethylthioxanthone (product name: KAYACURE DETX-S, manufactured by: Nippon Kayaku Co., Ltd.)

Example 1: Preparation of Color Material Dispersion Liquid A and Color Resin Composition A (1) First, 13.0 parts by mass of the color material 2-1 of Synthesis Example 18, 20.80 parts by mass (effective solid content 5.20 parts by mass) of the salt-type block polymer dispersant A solution prepared in Preparation Example 1, 11.82 parts by mass (effective solid content 5.20 parts by mass) of the binder resin A of Preparation Example 2, and 54.38 parts by mass of PGMEA were mixed. Using a paint shaker (manufactured by Asada Iron Works Co., Ltd.), the mixture was subjected to a pre-dispersion for 1 hour with 2 mm zirconia beads and then a main dispersion for 6 hours with 0.1 mm zirconia beads, thereby obtaining a color material dispersion liquid A.

(2) First, 28.57 parts by mass of the color material dispersion liquid A obtained in the above (1), 28.29 parts by mass of the binder composition A obtained in Preparation Example 2, 43.14 parts by mass of PGMEA, 0.04 part by mass of surfactant R08MH (product name, manufactured by DIC) and 0.4 part by mass of silane coupling agent KBM503 (product name, manufactured by Shin-Etsu Silicones) were mixed. The mixture thus obtained was subjected to pressure filtration, thereby obtaining a color resin composition A.

Examples 2 to 9: Preparation of Color Material Dispersion Liquids B to I and Color Resin Compositions B to I Color material dispersion liquids B to I and color resin compositions B to I were obtained in the same manner as Example 1, except that the color materials 2-2 to 2-9 were used in place of the color material 2-1.

Example 10: Preparation of Color Material Dispersion Liquid J and Color Resin Composition J A color material dispersion liquid J and a color resin composition J were obtained in the same manner as Example 1, except that the color material 2-3 and the phosphorus-based block copolymer B solution were used in place the color material 2-1 and the salt-type block polymer dispersant A solution.

Example 11: Preparation of Color Resin Composition K

A color resin composition K was obtained in the same manner as Example 1, except that the color material 2-3 and a binder resin composition B were used in place of the color material 2-1 and the binder composition A.

Example 12: Preparation of Color Resin Composition L

A color resin composition L was obtained in the same manner as Example 1, except that the color material 2-3, a phosphorus-based block copolymer A solution and the binder resin composition B were used in place of the color material 2-1, the salt-type block polymer dispersant A solution and the binder composition A.

Comparative Example 1: Preparation of Color Material Dispersion Liquid X and Color Resin Composition X A color material dispersion liquid X and a color resin composition X were obtained in the same manner as Example 1, except that the color material 2-X was used in place of the color material 2-1.

[Evaluation]

<Optical Performance Evaluation and Heat Resistance Evaluation>

Each of the color resin compositions obtained in Examples and Comparative Examples was applied onto each of glass substrates with a thickness of 0.7 mm (product name: OA-10G, manufactured by: Nippon Electric Glass Co., Ltd.) using a spin coater, heat-dried on a hot plate at 80° C. for 3 minutes, irradiated with ultraviolet light at 40 mJ/cm$^2$ using an ultrahigh-pressure mercury lamp, and then post-baked in a clean oven at 230° C. for 30 minutes, thereby obtaining a cured film (a blue color layer). The thickness of the film was controlled to have a target chromaticity (y=0.082) after drying and curing. The chromaticity ($x_0$, $y_0$), luminance ($Y_0$) and L, a, b ($L_0$, $a_0$, $b_0$) of the obtained colored substrate were measured by MICROSCOPIC SPECTROPHOTOMETER OSP-SP200 (product name, manufactured by Olympus Corporation).

Next, the substrate on which the cured film was formed, was post-baked in a clean oven at 230° C. for 30 minutes and then left to cool for 30 minutes. This process was repeated three times, and the chromaticity ($x_1$, $y_1$), luminance ($Y_1$) and L, a, b ($L_1$, $a_1$, $b_1$) of the thus-obtained colored substrate were measured. From the values thus measured, color change ($\Delta x$) and color difference ($\Delta Eab$) before and after the treatment were calculated by the following formulae. The results are shown in Table 1.

Color change $(\Delta x) = x_1 - x_0$

Color difference $(\Delta Eab) = \{(L_1-L_0)^2 + (a_1-a_0)^2 + (b_1-b_0)^2\}^{1/2}$

TABLE 1

| | Color material | Luminance (Y$_1$) | Color change (Δx) | Color difference (ΔEab) |
|---|---|---|---|---|
| Example 1 | Compound 2-1 | 9.5 | 0.0007 | 10.9 |
| Example 2 | Compound 2-2 | 9.5 | 0.0005 | 8.6 |
| Example 3 | Compound 2-3 | 10.0 | 0.0005 | 4.4 |
| Example 4 | Compound 2-4 | 9.1 | 0.0020 | 8.2 |
| Example 5 | Compound 2-5 | 9.4 | 0.0020 | 6.5 |
| Example 6 | Compound 2-6 | 10.5 | 0.0003 | 3.8 |
| Example 7 | Compound 2-7 | 9.6 | 0.0004 | 7.2 |
| Example 8 | Compound 2-8 | 9.7 | 0.0004 | 6.8 |
| Example 9 | Compound 2-9 | 9.5 | 0.0008 | 7.5 |
| Example 10 | Compound 2-3 | 10.3 | 0.0002 | 3.5 |
| Example 11 | Compound 2-3 | 10.2 | 0.0003 | 3.8 |
| Example 12 | Compound 2-3 | 10.4 | 0.0002 | 3.2 |
| Comparative Example 1 | Compound 2-X | 8.6 | 0.0035 | 15.1 |

[Evaluation]

<Evaluation of Re-Solubility in Solvents>

Each of the color resin compositions obtained in Examples 10 and 12 was applied to a surface of each of glass substrates (100 mm×5 mm×0.7 mm) by dip coating. Each of the glass substrates was left under an environment at a temperature of 23° C. and a humidity of 80% RH for 30 minutes to dry the applied color resin composition, thereby forming dried coating film. Each of the thus-obtained glass test pieces (the dried coating films) was immersed in PGMEA, and the PGMEA was stirred for 15 seconds to re-dissolve the dried coating film. The re-dissolution state of the dried coating films was visually observed for evaluation of their re-solubility in solvents, based on the following evaluation criteria.

As a result, the evaluation results of the color resin compositions obtained in Examples 10 and 12 were both "A".

(Criteria for Evaluation of Re-Solubility in Solvents)

A: The dried coating film was dissolved in the PGMEA solution, without leaving a flake.

B: A flake of the dried coating film remained in the PGMEA solution, or the dried coating film was not dissolved in the PGMEA solution.

<Solvent Resistance Evaluation>

For the color resin compositions obtained in Examples 11 and 12, the post-baked color films obtained in the above-described optical performance evaluation and heat resistance evaluation, were immersed in NMP for 30 minutes. Then, the film surface was observed for evaluation of solvent resistance, based on the following evaluation criteria.

As a result, the evaluation results of the color resin compositions obtained in Examples 11 and 12 were both "A".

(Criteria for Evaluation of Solvent Resistance)

A: No change.

B: The film surface peeled off.

<Adhesion Evaluation>

For the color resin composition obtained in Example 12, the post-baked color film obtained in the above-described optical performance evaluation and heat resistance evaluation, was subjected to a cross-cut tape test in accordance with JIS K5600 for evaluation of adhesion based on the following evaluation criteria.

As a result, the evaluation result of the color resin composition obtained in Example 12 was "A".

(Criteria for Evaluation of Adhesion)

A: A cross-cut grid pattern remained.

B: The film peeled off.

[Summary of results]

From the results shown in Table 1, it was revealed that the color layers formed by use of the color resin compositions of Examples 1 to 9, each containing, as the color material, the compound which is represented by the general formula (I) and which contains any one of the following structures (i) and (ii), showed a small color change (Δx), a small color difference (ΔEab) and, therefore, excellent heat resistance even after they were repeatedly post-baked.

(i) "A" is an aliphatic hydrocarbon group containing two or more alicyclic hydrocarbon groups, containing a saturated aliphatic hydrocarbon group at a terminal position directly bound to "N", and optionally containing O, S, N in a carbon chain (ii) At least one of R$^2$, R$^3$, R$^4$ and R$^5$ is a cycloalkyl group optionally containing a substituent group or an aryl group optionally containing a substituent group.

It was also revealed that color layers high in luminance (Y$_1$) are obtained due to the excellent heat resistance.

The color layers formed by use of the color resin compositions of Examples 10 to 12, satisfied at least one of the following conditions (1) and (2):

(1) The dispersant is a polymer containing at least one selected from a constitutional unit represented by the general formula (VI) and a constitutional unit represented by the general formula (VI').

(2) The binder component contains a phosphorus atom-containing polyfunctional monomer.

Therefore, it was revealed that color layers small in color change (Δx) and color difference (ΔEab) and high in luminance (Y$_1$) are obtained.

[Production of Color Filter]

(1) Formation of Light Shielding Layer

<Composition of Black Pigment Dispersion Liquid>

Black pigment: 23 parts by weight

Polymer dispersant (DISPERBYK 111 manufactured by BYK Japan KK): 2 parts by weight Solvent (diethylene glycol dimethyl ether): 75 parts by weight Next, the following components in the following amounts were sufficiently mixed to obtain a composition for light shielding layer.

<Composition for Light Shielding Layer>

The above-obtained black pigment dispersion liquid: 61 parts by weight

Curable resin composition: 20 parts by weight

Diethylene glycol dimethyl ether: 30 parts by weight

Then, the composition for light shielding layer was applied on a glass substrate having a thickness of 0.7 mm ("AN100" manufactured by Asahi Glass Co., Ltd.) by a spin coater. The applied composition was dried at 100° C. for three minutes to form a light shielding layer having a thickness of about 1 μm. The light shielding layer was exposed in a light shielding pattern by an ultrahigh-pressure mercury lamp and then developed in a 0.05 wt % potassium hydroxide aqueous solution. Next, the substrate was left under an atmosphere at 180° C. for 30 minutes for heating, thereby forming a light shielding layer in a region where the light shielding layer was needed to be formed.

(2) Formation of Color Layer

A resin composition for red color layer was prepared in the same manner as Example 1, except that a red pigment (Pigment Red 254) was used in the color resin composition, in place of the color material 2-1 of Synthesis Example 18. A light shielding layer was formed on a substrate in the above-described manner, and the resin composition for red color layer was applied onto the substrate so that the thickness of a film was controlled to have a target chromaticity (y=0.650) after drying and curing. Then, the applied resin composition was dried on the hot plate at 80° C. for 3 minutes. Next, a thus-obtained coating film of the resin composition for red color layer, was irradiated with ultraviolet light at 40 mJ/cm$^2$ using the ultrahigh-pressure mercury lamp, through a photomask. Then, the glass substrate on which the color layer was formed, was subjected to shower development for one minute, using a 0.05% by mass potassium hydroxide aqueous solution as an alkaline developer. Then, the substrate was post-baked in a clean oven at 230° C. for 30 minutes, thereby forming a red color layer in a region where the red color layer was needed to be formed.

Next, a resin composition for green color layer was prepared in the same manner as Example 1, except that a green pigment (Pigment Green 58) was used in the color resin composition, in place of the color material 2-1 of Synthesis Example 18. Using the resin composition for green color layer, a green color layer was formed in a region where a green pixel was needed to be formed, by the same process as the red color layer so that the thickness of a film was controlled to have a target chromaticity (y=0.500) after drying and curing.

Also, using each of the color resin compositions of Examples 1, 2, 3 and 5 and Comparative Example 1, a blue color layer was formed in a region where a blue pixel was needed to be formed, by the same process as the red color layer so that the thickness of a film was controlled to have a target chromaticity (y=0.082) after drying and curing. Therefore, the color layers in three colors of red (R), green (G) and blue (B) were formed.

<Transmission Spectra of Color Filters>

The transmission spectra of the blue color layers obtained by use of the color resin compositions of Examples 1, 2, 3 and 5 and Comparative Example 1, were measured by "MICROSCOPIC SPECTROPHOTOMETER OSP-SP200" manufactured by Olympus Corporation.

FIGS. 5 to 9 show the transmission spectra of the blue color layers obtained by use of the color resin compositions of Examples 1, 2, 3 and 5 and Comparative Example 1. The spectra before and after the post-baking for 30 minutes in the clean oven at 230° C., are referred to as "Before heating" and "After heating", respectively.

[Summary of Results]

Each of the blue color layers obtained by use of the color resin compositions of Examples 1 to 3 and 5 shown in FIGS. 5 to 8, was formed by use of, as the color material, the color resin composition containing the compound which is represented by the general formula (I) and which contains one or more structures selected from the following structures (i) and (ii): (i) "A" is an aliphatic hydrocarbon group containing two or more alicyclic hydrocarbon groups, containing a saturated aliphatic hydrocarbon group at a terminal position directly bound to "N", and optionally containing O, S, N in a carbon chain, and (ii) at least one of $R^2$, $R^3$, $R^4$ and $R^5$ is a cycloalkyl group optionally containing a substituent group or an aryl group optionally containing a substituent group. Therefore, the spectra of the blue color layers show a small color change after heating, and the peak top positions of their transmission spectra are less likely to change. The color material in which (ii) at least one of $R^2$, $R^3$, $R^4$ and $R^5$ is a cycloalkyl group optionally containing a substituent group or an aryl group optionally containing a substituent group, is particularly preferred because, in the case of using the color material, the peak top position of the transmission spectrum is far less likely to change.

REFERENCE SIGNS LIST

1. Transparent substrate
2. Light shielding part
3. Color layer
10. Color filter
13a, 13b. Orientation film
15. Liquid crystal layer
20. Counter substrate
25a, 25b. Polarization plate
30. Backlight
40. Liquid crystal display device
50. Organic protection layer
60. Inorganic oxide layer
71. Transparent positive electrode
72. Positive hole injection layer
73. Positive hole transport layer
74. Light-emitting layer
75. Electron injection layer
76. Negative electrode
80. Light-emitting body
100. Light-emitting display device
201. Divalent or higher counter cation
202. Divalent or higher counter anion
203. Linking by A
204. Ionic bond
210. Molecular association of the compound represented by the general formula (I)

The invention claimed is:

1. A color material dispersion liquid comprising
(A) a color material,
(B) a dispersant and
(C) a solvent,
wherein the color material (A) contains a compound which is represented by the following general formula (I)

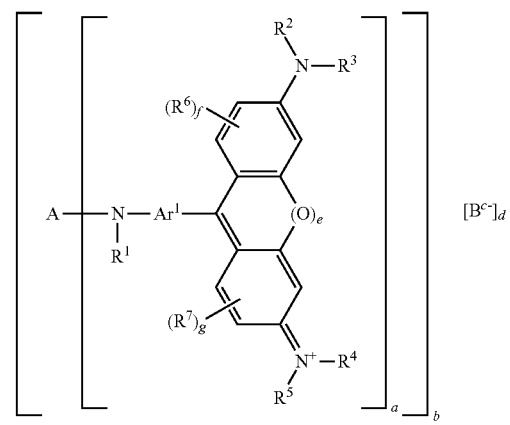

General Formula (I)

where "A" is a substituent group represented by the following general formula (IV):

General Formula (IV)

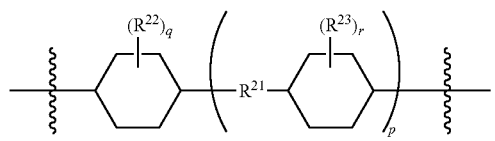

General Formula (II)

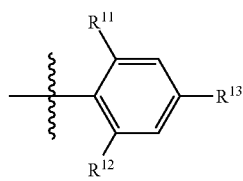

where R$^{21}$ is an alkylene group containing 1 to 3 carbon atoms and optionally containing, as a substituent group, an alkyl group containing 1 to 4 carbon atoms or an alkoxy group containing 1 to 4 carbon atoms;

each of R$^{22}$ and R$^{23}$ is independently an alkyl group containing 1 to 4 carbon atoms or an alkoxy group containing 1 to 4 carbon atoms;

"p" is an integer of from 1 to 3;

each of "q" and "r" is independently an integer of from 0 to 4;

when two or more R$^{21}$s are present, they may be the same or different;

when two or more R$^{22}$s are present, they may be the same or different;

when two or more R$^{23}$s are present, they may be the same or different; and when two or more "r"s are present, they may be the same or different;

each of R$^1$, R$^2$, R$^3$, R$^4$ and R$^5$ is independently a hydrogen atom, an alkyl group optionally containing a substituent group, or an aryl group optionally containing a substituent group;

each of R$^6$ and R$^7$ is independently an alkyl group optionally containing a substituent group or an alkoxy group optionally containing a substituent group;

Ar$^1$ is a divalent aromatic group optionally containing a substituent group;

B$^{c-}$ is a "c"-valent anion;

"a" is 2;

"c" is an integer of 2 or more;

each of "b" and "d" is an integer of 1 or more;

"e" is 0 or 1;

each of "f" and "g" is an integer of from 0 to 4;

each of "f+e" and "g+e" is from 0 to 4;

R$^1$s may be the same or different;

R$^2$s may be the same or different;

R$^3$s may be the same or different;

R$^4$s may be the same or different;

R$^5$s may be the same or different;

R$^6$s may be the same or different;

R$^7$s may be the same or different;

Ar$^1$s may be the same or different;

"e"s may be the same or different;

"f"s may be the same or different; and

"g"s may be the same or different.

2. The color material dispersion liquid according to claim 1, wherein the compound represented by the general formula (I) further contains a structure represented by the following (ii):

(ii) at least one of R$^2$, R$^3$, R$^4$ and R$^5$ is a cycloalkyl group optionally containing a substituent group or an aryl group optionally containing a substituent group.

3. The color material dispersion liquid according to claim 2, wherein, for the compound represented by the general formula (I), at least one of R$^2$, R$^3$, R$^4$ and R$^5$ is a substituent group represented by the following formula (II) or (III):

General Formula (II)

where each of R$^{11}$, R$^{12}$ and R$^{13}$ is independently a hydrogen atom, an alkyl group containing 1 to 4 carbon atoms and optionally containing a substituent group, or an alkoxy group containing 1 to 4 carbon atoms and optionally containing a substituent group, General Formula (III)

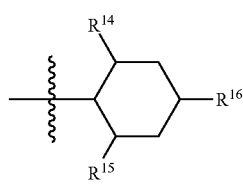

where each of R$^{14}$, R$^{15}$ and R$^{16}$ is independently a hydrogen atom, an alkyl group containing 1 to 4 carbon atoms and optionally containing a substituent group, or an alkoxy group containing 1 to 4 carbon atoms and optionally containing a substituent group.

4. The color material dispersion liquid according to claim 1, wherein, for the compound represented by the general formula (I), the anion represented by B$^{c-}$ is a heteropolyoxometalate containing one or more elements selected from tungsten and molybdenum.

5. The color material dispersion liquid according to claim 1, wherein the dispersant contains a graft copolymer containing a constitutional unit represented by the following general formula (VII) and at least one selected from a constitutional unit represented by the following general formula (VI) and a constitutional unit represented by the following general formula (VI'), or a block copolymer containing a block moiety that contains a constitutional unit represented by the following general formula (VIII) and a block moiety that contains at least one selected from a constitutional unit represented by the following general formula (VI) and a constitutional unit represented by the following general formula (VI'):

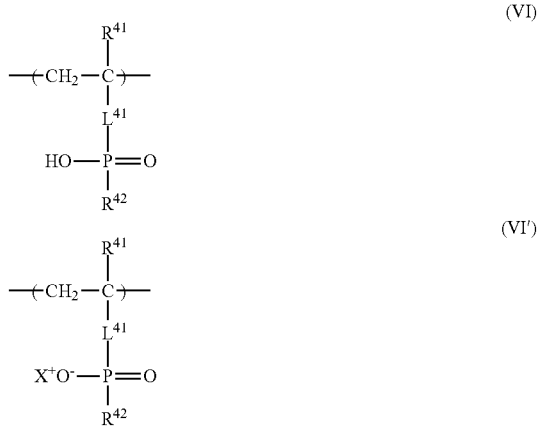

-continued

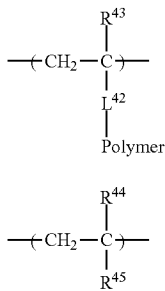
(VII)

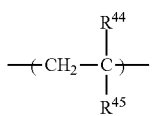
(VIII)

where $L^{41}$ is a direct bond or a divalent linking group; $R^{41}$ is a hydrogen atom or a methyl group; $R^{42}$ is a hydrocarbon group or a monovalent group represented by —[CH($R^{46}$)—CH($R^{47}$)—O]$_{x1}$—$R^{48}$ or —[(CH$_2$)$_{y1}$—O]$_{z1}$—$R^{48}$; each of $R^{46}$ and $R^{47}$ is independently a hydrogen atom or a methyl group; $R^{48}$ is a hydrogen atom, a hydrocarbon group, or a monovalent group represented by —CHO, —CH$_2$CHO, —CO—CH=CH$_2$, —CO—C(CH$_3$)=CH$_2$, or —CH$_2$COOR$^{49}$; $R^{49}$ is a hydrogen atom or an alkyl group having 1 to 5 carbon atoms; the hydrocarbon group optionally contains a substituent group; x1 is an integer of from 1 to 18; y1 is an integer of from 1 to 5; and z1 is an integer of from 1 to 18;

where $X^+$ is an organic cation;

where $L^{42}$ is a direct bond or a divalent linking group; $R^{43}$ is a hydrogen atom or a methyl group; and "Polymer" is a polymer chain containing one or more selected from a constitutional unit represented by the following general formula (IX) and a constitutional unit represented by the following general formula (X); and where $R^{44}$ is a hydrogen atom or a methyl group; $R^{45}$ is a hydrocarbon group or a monovalent group represented by —[CH($R^{50}$)—CH($R^{51}$)—O]$_{x2}$—$R^{52}$, —[(CH$_2$)$_{y2}$—O]$_{z2}$—$R^{52}$, —[CO—(CH$_2$)$_{y2}$—O]$_{z2}$—$R^{52}$, —CO—O—$R^{52'}$ or —O—CO—$R^{52''}$; each of $R^{50}$ and $R^{51}$ is independently a hydrogen atom or a methyl group; $R^{52}$ is a hydrogen atom, a hydrocarbon group, or a monovalent group represented by —CHO, —CH$_2$CHO or —CH$_2$COOR$^{53}$; $R^{52'}$ is a hydrocarbon group or a monovalent group represented by —[CH($R^{50}$)—CH($R^{51}$)—O]$_{x2'}$—$R^{52}$, —[(CO—(CH$_2$)$_{y2'}$—O]$_{z2'}$—$R^{52}$, or —[CO—(CH$_2$)$_{y2'}$—O]$_{z2'}$—$R^{52}$; $R^{52''}$ is an alkyl group having 1 to 18 carbon atoms; $R^{53}$ is a hydrogen atom or an alkyl group having 1 to 5 carbon atoms; the hydrocarbon group optionally contains a substituent group; each of x2 and x2' is independently an integer of from 1 to 18; each of y2 and y2' is independently an integer of from 1 to 5; and each of z2 and z2' is an integer of from 1 to 18:

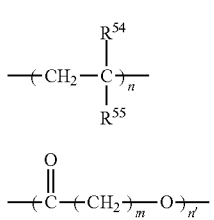
(IX)

(X)

where $R^{54}$ is a hydrogen atom or a methyl group; $R^{55}$ is a hydrocarbon group or a monovalent group represented by —[CH($R^{56}$)—CH($R^{57}$)—O]$_{x3}$—$R^{58}$, —[(CH$_2$)$_{y3}$—O]$_{z3}$—$R^{58}$, —[CO—(CH$_2$)$_{y3}$—O]$_{z3}$—$R^{58}$, —CO—O—$R^{59}$, or —O—CO—$R^{60}$; each of $R^{56}$ and $R^{57}$ is a hydrogen atom or a methyl group; $R^{58}$ is a hydrogen atom, a hydrocarbon group, or a monovalent group represented by —CHO, —CH$_2$CHO or —CH$_2$COOR$^{61}$; $R^{59}$ is a hydrocarbon group or a monovalent group represented by —[CH($R^{56}$)—CH($R^{57}$)—O]$_{x4}$—$R^{58}$, —[(CH$_2$)$_{y4}$—O]$_{z4}$—$R^{58}$ or —[CO—(CH$_2$)$_{y4}$—O]$_{z4}$—$R^{58}$; $R^{60}$ is an alkyl group having 1 to 18 carbon atoms; $R^{61}$ is a hydrogen atom or an alkyl group having 1 to 5 carbon atoms; the hydrocarbon group optionally contains a substituent group; "m" is an integer of from 1 to 5; "n" and "n'" are each an integer of from 5 to 200; each of x3 and x4 is independently an integer of from 1 to 18; each of y3 and y4 is independently an integer of from 1 to 5; and each of z3 and z4 is independently an integer of from 1 to 18.

6. A color resin composition comprising
(A) a color material,
(B) a dispersant,
(C) a solvent and
(D) a binder component,
wherein the color material (A) contains a compound which is represented by the following general formula (I):

General Formula (I)

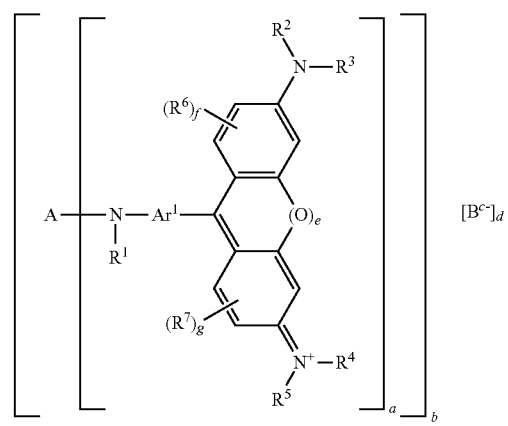

where "A" is a substituent group represented by the following general formula (IV):

General Formula (IV)

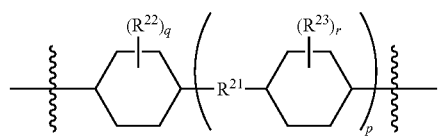

where $R^{21}$ is an alkylene group containing 1 to 3 carbon atoms and optionally containing, as a substituent group, an alkyl group containing 1 to 4 carbon atoms or an alkoxy group containing 1 to 4 carbon atoms;

each of $R^{22}$ and $R^{23}$ is independently an alkyl group containing 1 to 4 carbon atoms or an alkoxy group containing 1 to 4 carbon atoms;

"p" is an integer of from 1 to 3;

each of "q" and "r" is independently an integer of from 0 to 4;

when two or more $R^{21}$s are present, they may be the same or different;

when two or more $R^{22}$s are present, they may be the same or different;

when two or more $R^{23}$s are present, they may be the same or different; and when two or more "r"s are present, they may be the same or different;

each of $R^1$, $R^2$, $R^3$, $R^4$ and $R^5$ is independently a hydrogen atom, an alkyl group optionally containing a substituent group, or an aryl group optionally containing a substituent group; each of $R^6$ and $R^7$ is independently an alkyl group optionally containing a substituent group or an alkoxy group optionally containing a substituent group;

$Ar^1$ is a divalent aromatic group optionally containing a substituent group;

$B^{c-}$ is a "c"-valent anion;

"a" is 2;

"c" is an integer of 2 or more;

each of "b" and "d" is an integer of 1 or more;

"e" is 0 or 1;

each of "f" and "g" is an integer of from 0 to 4;

each of "f+e" and "g+e" is from 0 to 4;

$R^1$s may be the same or different;
$R^2$s may be the same or different;
$R^3$s may be the same or different;
$R^4$s may be the same or different;
$R^5$s may be the same or different;
$R^6$s may be the same or different;
$R^7$s may be the same or different;
$Ar^1$s may be the same or different;
"e"s may be the same or different;
"f"s may be the same or different; and
"g"s may be the same or different.

7. The color resin composition according to claim 6, wherein the compound represented by the general formula (I) further contains a structure represented by the following (ii):

(ii) at least one of $R^2$, $R^3$, $R^4$ and $R^5$ is a cycloalkyl group optionally containing a substituent group or an aryl group optionally containing a substituent group.

8. The color resin composition according to claim 6, wherein a difference $\Delta x$ ($=x_1-x_0$) between a chromaticity coordinate $x_0$ of a cured film$_{(0)}$ obtained by drying the color resin composition and heating the dried color resin composition at 230° C. for 30 minutes to a thickness at which a chromaticity coordinate $y_o$ is 0.082, and a chromaticity coordinate $x_1$ of a cured film$_{(1)}$ obtained by repeating, three times, a process of heating the cured film$_{(0)}$ at 230° C. for 30 minutes and then leaving the heated cured film$_{(0)}$ to cool for 30 minutes, is 0.025 or less.

9. The color resin composition according to claim 6, wherein the binder component (D) contains a phosphorus atom-containing polyfunctional monomer.

* * * * *